(12) United States Patent
Rao et al.

(10) Patent No.: US 12,140,730 B2
(45) Date of Patent: Nov. 12, 2024

(54) HIGH REFRACTIVE INDEX BIREFRINGENT ORGANIC SOLID CRYSTAL AND METHODS OF MAKING THEREOF

(71) Applicant: META PLATFORMS TECHNOLOGIES, LLC, Menlo Park, CA (US)

(72) Inventors: Tingling Rao, Bellevue, WA (US); Tanya Malhotra, Redmond, WA (US); Andrew John Ouderkirk, Kirkland, WA (US); Lafe Joseph Purvis, II, Redmond, WA (US); Sandeep Rekhi, San Jose, CA (US); Arman Boromand, Issaquah, WA (US); Sheng Ye, Redmond, WA (US); Oleg Yaroshchuk, Redmond, WA (US); Anurag Tyagi, Kirkland, WA (US)

(73) Assignee: Meta Platforms Technologies, Inc., Menlo Park, CA (US)

( * ) Notice: Subject to any disclaimer, the term of this patent is extended or adjusted under 35 U.S.C. 154(b) by 281 days.

(21) Appl. No.: 17/369,861

(22) Filed: Jul. 7, 2021

(65) Prior Publication Data
US 2022/0035075 A1   Feb. 3, 2022

Related U.S. Application Data

(60) Provisional application No. 63/057,764, filed on Jul. 28, 2020.

(51) Int. Cl.
*G02B 1/04* (2006.01)
*C09D 5/00* (2006.01)
(Continued)

(52) U.S. Cl.
CPC .............. *G02B 1/04* (2013.01); *C09D 5/00* (2013.01); *C09D 7/45* (2018.01); *C09D 7/63* (2018.01);
(Continued)

(58) Field of Classification Search
CPC ... G02B 1/02; G02B 1/04; G02B 1/10; G02B 5/3083; C30B 29/54
(Continued)

(56) References Cited

U.S. PATENT DOCUMENTS

2010/0321780 A1   12/2010   Kawasaki et al.
2019/0235295 A1   8/2019   Sugawara

FOREIGN PATENT DOCUMENTS

CN   1459047 A   11/2003
CN   101930092 A   12/2010
(Continued)

OTHER PUBLICATIONS

Selvakumar, et al "Growth of High Quality Naphthalene Single Crystals", 2005, J. of Crystal Growth, 282, p. 370-375 (Year: 2005).*
(Continued)

*Primary Examiner* — Ruiyun Zhang
(74) *Attorney, Agent, or Firm* — Greenberg Traurig, LLP

(57) ABSTRACT

An optical film includes an organic solid crystal film formed of a contiguous organic solid crystal having a first dimension no less than 100 micrometer and a second dimension distinct from the first dimension no less than one centimeter. Methods for making the organic solid crystal film are also described.

18 Claims, 33 Drawing Sheets

(51) Int. Cl.
*C09D 7/45* (2018.01)
*C09D 7/63* (2018.01)
*C30B 29/54* (2006.01)
*G02B 1/02* (2006.01)
*G02B 1/10* (2015.01)
*G02B 5/30* (2006.01)

(52) U.S. Cl.
CPC ............... *C30B 29/54* (2013.01); *G02B 1/02* (2013.01); *G02B 1/10* (2013.01); *G02B 5/3083* (2013.01); *C09K 2219/03* (2013.01)

(58) Field of Classification Search
USPC .................................................... 359/485.01
See application file for complete search history.

(56) References Cited

FOREIGN PATENT DOCUMENTS

| | | |
|---|---|---|
| CN | 102812072 A | 12/2012 |
| EP | 2530111 A1 | 12/2012 |

OTHER PUBLICATIONS

European Search Report for European Patent Application No. 21188050.5, mailed Apr. 26, 2022, 6 pages.

Office Action mailed Sep. 8, 2022 for Chinese Application No. 202110859837.1, filed Jul. 28, 2021, 14 pages.

* cited by examiner

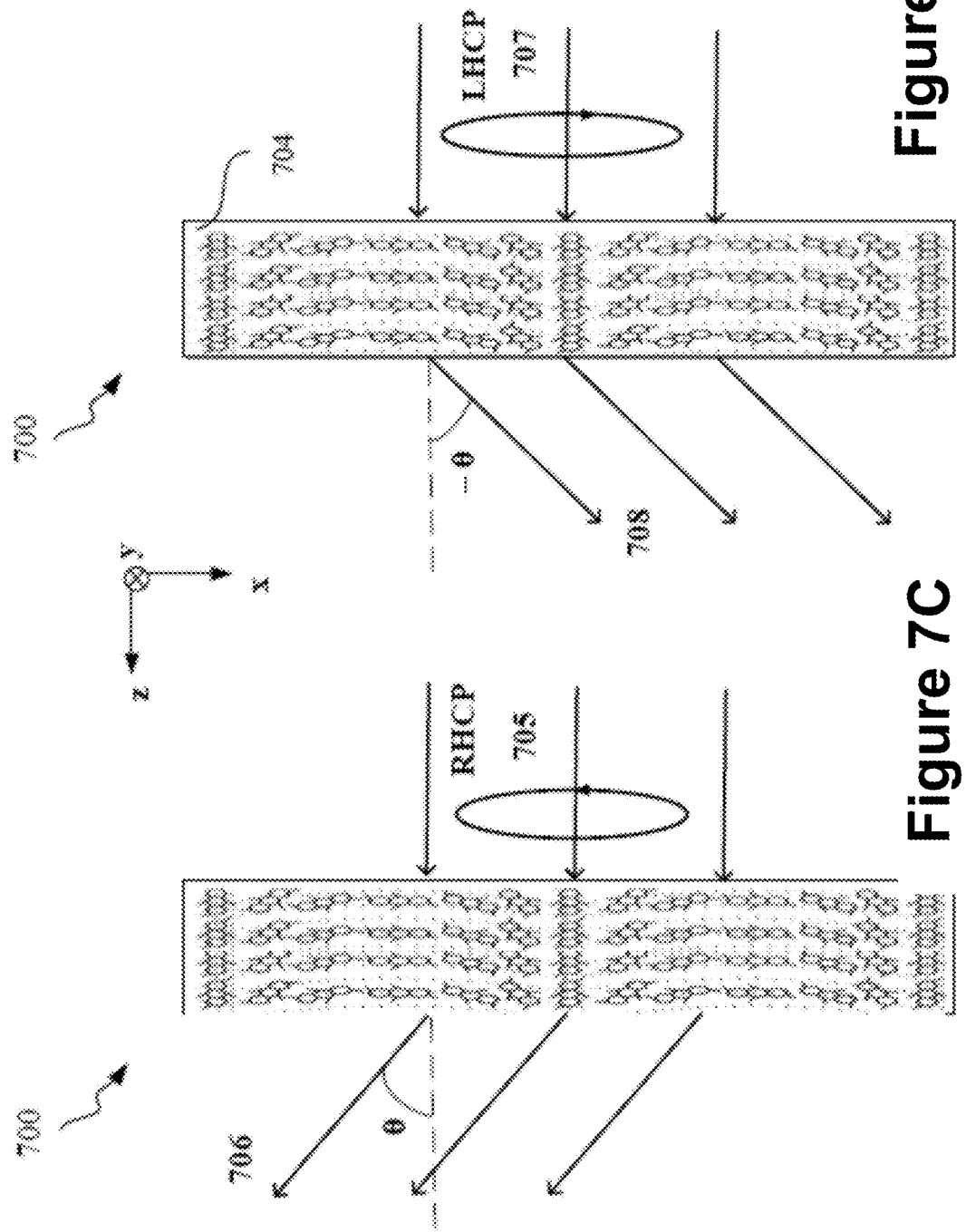

1150

Move a molten crystal material in a space between two substrates while maintaining contact between the molten crystal material and two opposing surfaces of the two substrates, wherein each of the two opposing surfaces includes an alignment structure that is in contact with the molten crystal material — 1155

Grow, from the molten crystal material using a seed crystal, the solid crystal including crystal molecules aligned in a predetermined alignment pattern that is at least partially defined by the alignment structures — 1160

Figure 11C

HIGH REFRACTIVE INDEX BIREFRINGENT ORGANIC SOLID CRYSTAL AND METHODS OF MAKING THEREOF

RELATED APPLICATIONS

This application claims the benefit of, and priority to, U.S. Provisional Patent Application Ser. No. 63/057,764, filed Jul. 28, 2020, which is incorporated by reference herein in its entirety.

TECHNICAL FIELD

The present disclosure relates generally to optical crystals and, more specifically, to high-refractive index optical crystals and methods for making them.

BACKGROUND

Visually appealing, light-weight, compact, and power efficient consumer electronic devices are in high demand. Accordingly, it is desirable to design optical elements or devices used in these devices such that these devices can be adaptive, optically efficient, light-weight, compact, and broadband.

Technology for fabricating optical devices with enhanced optical performance and physical properties has become an attractive topic for research and development. Liquid crystals ("LCs") have been used to fabricate polarization selective optical elements. Optical characteristics of the polarization selective optical elements may depend on the refractive index and/or birefringence of LCs. Currently available LCs may be formulated to achieve a large refractive index of about 1.97 and a large birefringence of about 0.3. Optical elements based on materials having higher refractive index are highly desirable to reduce the size and weight and to enhance the optical characteristics.

SUMMARY

There is a need for materials having high refractive index. In addition, materials having high refractive index and high birefringence have additional benefits. Methods described herein allow fabrication of organic solid crystals having high refractive index. In some configurations, an organic solid crystal fabricated by the methods described herein has a size that is large enough to constitute an optical element or provide a contiguous coating on an optical element, thereby allowing an improved performance of the optical element.

For example, to manufacture a waveguide combiner that can support a large field-of-view, a material having a refractive index higher than 1.9 is desired. In addition, when the waveguide combiner is included in a head-mounted display, a material having a low density is desired. An organic solid crystal has a high refractive index and a low density, thereby enabling a waveguide combiner with a large field-of-view and a low. In addition, high refractive index birefringent materials can be used in various other optical components, such as Fresnel lens, metalenses, and polarization selective gratings. By carefully tuning the crystal growing path, organic solid crystals can be grown on flat or curved substrates with precisely controlled refractive index orientation. Such organic crystal materials and processes to grow large size solid crystal with high refractive index and birefringence are described herein.

In accordance with some embodiments, an optical film includes an organic solid crystal film formed of a contiguous organic solid crystal, the organic solid crystal film having a first dimension no less than 100 micrometers and a second dimension distinct from the first dimension no less than one centimeter.

In accordance with some embodiments, a method of making an optical film includes depositing, on a substrate having a controlled-nucleation surface, vaporized organic crystal molecules from a source material using physical vapor transport, and recrystallizing the vaporized organic crystal molecules on the controlled-nucleation surface thereby forming an optical film including a contiguous organic solid crystal, the organic solid crystal film having a first dimension no less than 100 mm and a second dimension distinct from the first dimension no less than one centimeter.

In accordance with some embodiments, a method of making an optical film includes obtaining an ampoule having one or more nucleation portions and a crystal growth portion coupled with the one or more nucleation portions. The ampoule is filled with organic solid crystal source material. The method also includes placing the ampoule inside a first space of a chamber thereby heating the organic solid crystal source material to a melting state, the first space having a first temperature, the chamber also having a second space with a second temperature, the first space and the second space being separated by a gate. The method further includes transferring the ampoule from the first space of the chamber to the second space of the chamber thereby recrystallizing the organic solid crystal source material to form a contiguous organic solid crystal film having a first dimension no less than 100 micrometers and a second dimension distinct from the first dimension no less than one centimeter.

In accordance with some embodiments, a method of making an optical film includes coating, on a modified surface of a substrate, a solution of organic crystal molecules and a solvent and altering a temperature of the solution of organic crystal molecules and solvent deposited on the modified surface of the substrate by zone annealing, thereby crystallizing the organic crystal molecules to form a contiguous organic solid crystal film having a first dimension no less than 100 micrometers and a second dimension distinct from the first dimension no less than one centimeter.

BRIEF DESCRIPTION OF THE DRAWINGS

FIG. 7C schematically illustrates diagrams of a positive state and a negative state of the PBP grating shown in FIG. 7B in accordance with some embodiments.

FIG. 7D schematically illustrates diagrams of a negative state of the PBP grating shown in FIG. 7B in accordance with some embodiments.

FIG. 11C is a flowchart illustrating a method for fabricating an optical device in accordance with some embodiments.

DETAILED DESCRIPTION

Figure 1A:
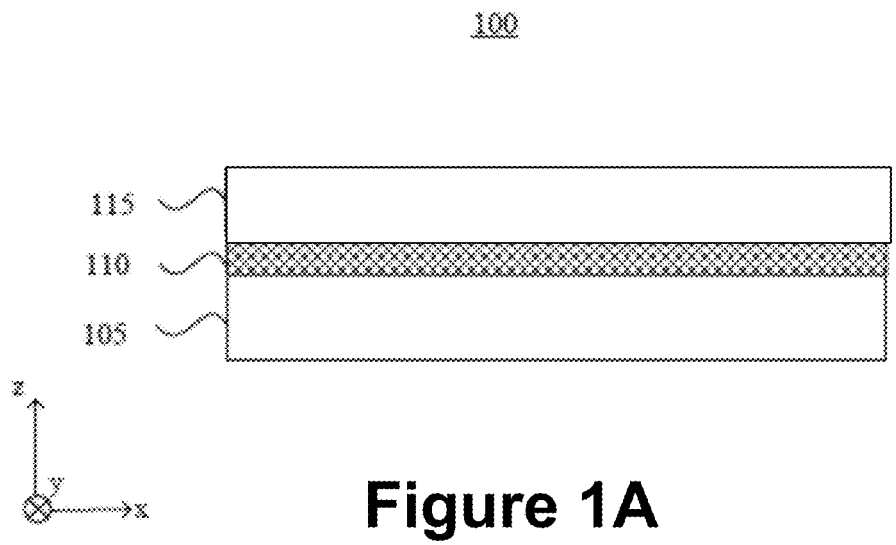
FIG. 1A schematically illustrates a cross-sectional view of an optical device in accordance with some embodiments.

Embodiments consistent with the present disclosure will be described with reference to the accompanying drawings, which are merely examples for illustrative purposes and are not intended to limit the scope. Wherever possible, the same reference numbers are used throughout the drawings to refer to the same or similar parts, and a detailed description thereof may be omitted.

Further, in the present disclosure, the disclosed embodiments and the features of the disclosed embodiments may be combined. The described embodiments are some but not all of the embodiments. Based on the disclosed embodiments, persons of ordinary skill in the art may derive other embodiments consistent with the present disclosure. For example, modifications, adaptations, substitutions, additions, or other variations may be made based on the disclosed embodiments. Such variations of the disclosed embodiments are still within the scope. Accordingly, the present disclosure is not limited to the disclosed embodiments. Instead, the scope is defined by the appended claims.

As used herein, the terms "couple," "coupled," "coupling," or the like may encompass an optical coupling, a mechanical coupling, an electrical coupling, an electromagnetic coupling, or a combination thereof. An "optical coupling" between two optical devices refers to a configuration in which the two optical devices are arranged in an optical series, and a light output from one optical device may be directly or indirectly received by the other optical device. An optical series refers to optical positioning of a plurality of optical devices in a light path, such that a light output from one optical device may be transmitted, reflected, diffracted, converted, modified, or otherwise processed or manipulated by one or more of other optical devices. In some embodiments, the sequence in which the plurality of optical devices are arranged may or may not affect an overall output of the plurality of optical devices. A coupling may be a direct coupling or an indirect coupling (e.g., coupling through an intermediate element).

The phrase "at least one of A or B" may encompass all combinations of A and B, such as A only, B only, or A and B. Likewise, the phrase "at least one of A, B, or C" may encompass all combinations of A, B, and C, such as A only, B only, C only, A and B, A and C, B and C, or A and B and C. The phrase "A and/or B" has a meaning similar to that of the phrase "at least one of A or B." For example, the phrase "A and/or B" may encompass all combinations of A and B, such as A only, B only, or A and B. Likewise, the phrase "A, B, and/or C" has a meaning similar to that of the phrase "at least one of A, B, or C." For example, the phrase "A, B, and/or C" may encompass all combinations of A, B, and C, such as A only, B only, C only, A and B, A and C, B and C, or A and B and C.

When a first element is described as "attached," "provided," "formed," "affixed," "mounted," "secured," "connected," "bonded," "recorded," or "disposed," to, on, at, or at least partially in a second element, the first element may be "attached," "provided," "formed," "affixed," "mounted," "secured," "connected," "bonded," "recorded," or "disposed," to, on, at, or at least partially in the second element using any suitable mechanical or non-mechanical manner, such as depositing, coating, etching, bonding, gluing, screwing, press-fitting, snap-fitting, clamping, etc. In addition, the first element may be in direct contact with the second element, or there may be an intermediate element between the first element and the second element. The first element may be disposed at any suitable side of the second element, such as left, right, front, back, top, or bottom.

When the first element is shown or described as being disposed or arranged "on" the second element, term "on" is merely used to indicate an example relative orientation between the first element and the second element. The description may be based on a reference coordinate system shown in a figure, or may be based on a current view or example configuration shown in a figure. For example, when a view shown in a figure is described, the first element may be described as being disposed "on" the second element. It is understood that the term "on" may not necessarily imply that the first element is over the second element in the vertical, gravitational direction. For example, when the assembly of the first element and the second element is turned 180 degrees, the first element may be "under" the second element (or the second element may be "on" the first element). Thus, it is understood that when a figure shows that the first element is "on" the second element, the configuration is merely an illustrative example. The first element may be disposed or arranged at any suitable orientation relative to the second element (e.g., over or above the second element, below or under the second element, left to the second element, right to the second element, behind the second element, in front of the second element, etc.).

The wavelength ranges or bands mentioned in the present disclosure are for illustrative purposes. The disclosed optical device, system, element, assembly, and method may be applied to a visible wavelength range, as well as other wavelength ranges, such as an ultraviolet ("UV") wavelength range, an infrared ("IR") wavelength range, or a combination thereof.

Optical devices, such as lenses, waveplates, gratings, waveguides, etc., have been widely used in optical systems. For example, such optical devices have been implemented in near-eye displays ("NEDs") for augmented reality ("AR"), virtual reality ("VR"), and/or mixed reality ("MR") applications. For example, optical waveguides have been used in NEDs to overlay virtual and real worlds. When a waveguide functions as a combiner to overlay virtual and real world images, e.g., for AR applications, the waveguide may also be referred to as a waveguide combiner. A waveguide display system may include a light source assembly configured to emit image lights, and a waveguide configured to guide the image lights to an eye of a user. The image lights from the light source assembly (e.g., a virtual image projector) may be coupled into the waveguide, and relayed to the eye via total internal reflection ("TIR") within the waveguide. The image lights emitted from the light source assembly may include a plurality of different colors (e.g., red, green, and blue). In some embodiments, multiple waveguides that share a spectral band may be used to efficiently deliver the image lights of different colors to the eye, which may increase the number and the weight of the optical elements (and hence, the size and weight of the waveguide display system). Further, the field of view ("FOV") of the virtual world may depend on the refractive index of the material of the waveguide. The FOV provided by the waveguide may increase as the refractive index of the material of the waveguide increases.

In addition, polarization selective optical devices have been used in NEDs as in-coupling elements (e.g., gratings) for the waveguide combiners, accommodation elements in a varifocal/multifocal block, and/or eye-tracking components in an eye-tracking system, etc. Liquid crystals ("LCs") have been used to fabricate polarization selective optical devices. Optical characteristics of the polarization selective optical devices may depend on the refractive index and/or birefringence of LCs. For example, an angular and diffraction bandwidth of a polarization selective LC grating may increase as the birefringence of LCs increases. Currently available LCs may be formulated to achieve a refractive index up to about 1.97 and a birefringence up to about 0.3. Optical waveguides and polarization selective optical devices based on materials having a higher refractive index and a larger birefringence are highly desirable to reduce the size and weight of the NEDs, and to enhance the optical characteristics, as well as to realize futuristic smart NEDs.

The present disclosure provides an optical device including a solid crystal (or a solid crystal material) in a form of a solid crystal film or layer. The solid crystal material may include an organic material, an inorganic material, or a combination thereof. For example, the solid crystal may include an organic and crystalline material, an organic and non-crystalline material, an organic and amorphous material, an organic and semi-crystalline and semi-amorphous material, an inorganic and crystalline material, an inorganic and non-crystalline material, an inorganic and amorphous material, an inorganic and semi-crystalline and semi-amorphous material, an organic and semi-crystalline and semi-non-crystalline material, an inorganic and semi-crystalline and semi-non-crystalline material, or a combination thereof. For discussion purposes, a solid organic crystal material may be used as an example of the solid crystal material. For convenience of discussion, solid crystal molecules included in the solid crystal material may be referred to as organic molecules or crystal molecules. It is understood that the technical solutions disclosed herein is not limited to organic crystal materials.

As used herein, an "axis" of a crystal (or solid crystal) may refer to an axis of the solid crystal along which the solid crystal has the highest or largest refractive index. An "axis" of a crystal molecule included in the solid crystal may refer to an axis of the crystal molecule along which the crystal molecule may have the highest or largest refractive index. The axis of the crystal may be an aggregated effect of the axes of the crystal molecules included in the crystal. Orientations of axes of the crystal molecules included in the solid crystal (and hence the orientation of the axis of the solid crystal) may be configured, such that the solid crystal may provide at least one predetermined optical function for the optical device that includes the solid crystal. The orientation of the axis of the solid crystal may be an aggregated effect of the orientations of the axes of crystal molecules in the solid crystal. The above definitions of the axis of the solid crystal and the axis of the crystal molecules are for the convenience of discussion. The orientations associated with the solid crystal and the crystal molecules are not limited to be defined by the axes along which the refractive index is the highest. Other suitable axes (e.g., axes along which the refractive index is the smallest, or axes perpendicular to the axes along which the refractive index is the highest) may be used as a configurable object for the discussion of the orientation of the solid crystal and the orientations of the crystal molecules, or for the discussion of the alignment pattern associated with the solid crystal or the crystal molecules.

In some embodiments, the orientation of the axis of the solid crystal may be configured by aligning the crystal molecules (e.g., aligning the orientations of the axes of the crystal molecules) in a predetermined alignment pattern. In some embodiments, the predetermined alignment pattern may refer to a non-natural alignment pattern of the crystal molecules in the solid crystal. For example, the predetermined alignment pattern may be at least partially configured at a substrate on which the crystal molecules are disposed, or may be configured within the solid crystal through a special mechanism (e.g., etching), or may be configured in a separate material which is disposed on a substrate. The predetermined alignment pattern of the crystal molecules may be specifically designed, configured, or introduced for the purpose of realizing at least one predetermined optical function of the optical element. The predetermined alignment pattern may be a one-dimensional pattern (e.g., crystal molecules may be aligned in a same, single direction), a two-dimensional pattern (e.g., crystal molecules may be aligned in predetermined directions in a two-dimensional plane), or a three-dimensional pattern (e.g., crystal molecules may be aligned in a three-dimensional directions).

In some embodiments, the predetermined alignment pattern of the crystal molecules of the solid crystal may be at least partially configured, set, or defined by an alignment structure. In some embodiments, the alignment structure may be an alignment film or layer formed, etched, disposed, or otherwise provided at a surface of a substrate, on which the crystal molecules of the solid crystal are disposed. In some embodiments, the alignment structure may be formed in a separate material and disposed on the surface of the substrate. In some embodiments, the alignment structure may be formed directly (e.g., etched directly) at (e.g., on or at least partially in) the surface of the substrate. In some embodiments, the alignment structure may be directly formed within the solid crystal (e.g., the solid crystal layer) through a special mechanism. The alignment structure may be a structural property inside the solid crystal. For example, the alignment pattern may be formed during a crystallization process of the solid crystal occurring in a presence of a magnetic field or an electric field that may be configured to affect the alignment of the grown solid crystal. In some embodiments, the alignment structure may be integrally formed at a surface of the solid crystal during the crystallization process.

In some embodiments, the optical device may include an alignment structure configured to at least partially align the crystal molecules in the predetermined alignment pattern. The alignment structure may include or define an alignment structure pattern. In some embodiments, the alignment structure pattern may be substantially the same as the predetermined alignment pattern of the crystal molecules. For example, different layers of crystal molecules included in the solid crystal may be disposed over the alignment structure. A first plurality of crystal molecules that are in contact with the alignment structure may be aligned by the alignment structure in the alignment structure pattern. In some embodiments, a second plurality of crystal molecules stacked over the first plurality of crystal molecules in the solid crystal may be aligned in the same pattern as the corresponding first plurality of crystal molecules. In such a configuration, crystal molecules in the solid crystal may be aligned substantially in the alignment structure pattern, and the alignment structure pattern may be substantially the same as the predetermined alignment pattern of the crystal molecules.

In some embodiments, the first plurality of crystal molecules that are in contact with the alignment structure may be aligned by the alignment structure in the alignment structure pattern. The second plurality of crystal molecules disposed over (e.g., stacked over) the first plurality of crystal molecules may not be aligned in the same pattern as the corresponding first plurality of crystal molecules (e.g., the second plurality of crystal molecules may be aligned in a pattern different from the alignment structure pattern). Instead, the second plurality of crystal molecules may be rotated by one or more predetermined rotation angles based on the alignment structure pattern relative to the corresponding first plurality of crystal molecules (e.g., the second plurality of crystal molecules may include a twist introduced through chiral dopants added to the solid crystal). The one or more predetermined rotation angles may be at least one of an in-plane rotation angle or an out-of-plane rotation angle. The predetermined alignment pattern of the crystal molecules may be a result of a combination of the alignment structure pattern in which the first plurality of crystal molecules are aligned, and the twisting (or rotation) alignment pattern associated with the second plurality of crystal molecules stacked over the first plurality of crystal molecules. In such a configuration, the alignment structure pattern of the alignment structure may be different from the predetermined alignment pattern of the crystal molecules. The alignment structure may at least partially align the crystal molecules in the predetermined alignment pattern.

For example, the alignment structure may align the crystal molecules that are in contact with the alignment structure (e.g., first plurality of molecules) in the alignment structure pattern. The remaining (e.g., second plurality of) crystal molecules included in the solid crystal that are disposed over (e.g., stacked over) the first plurality of crystal molecules may be aligned relative to the corresponding neighboring first plurality of crystal molecules that have been aligned by the alignment structure. In some embodiments, the remaining crystal molecules may follow the same alignment of the first plurality of crystal molecules. For example, orientations of axes of the remaining crystal molecules may follow orientations of axes of corresponding first plurality of crystal molecules. In some embodiments, at least a portion of the remaining crystal molecules may have orientations of axes rotated by one or more predetermined rotation angles relative to the orientations of axes of the corresponding first plurality of crystal molecules.

In some embodiments, the alignment structure may refer to a structure (such as a layer, a film, or physical features) configured to define or set the orientations of the axes of the crystal molecules (e.g., a direction of growth of a solid crystal material that is grown on the alignment structure). In some embodiments, the alignment structure may be thin, such as a few molecules thick. The layer, film, or physical features of the alignment structure may interact with molecules of the solid crystal material (e.g., solid crystal molecules) to be grown via mechanical, dipole-dipole, magnetic mechanisms, or any other suitable mechanisms. For example, the alignment structure may be similar to those that have been used in LC devices (e.g., LC displays) for aligning orientations of the nematic LC molecules.

In some embodiments, the crystal molecules may be aligned substantially uniformly over the alignment structure. That is, orientations of axes of the crystal molecules may be substantially uniformly aligned, resulting in a spatially non-varying (e.g., constant) orientation of the axis of the solid crystal. In some embodiments, the crystal molecules may be aligned non-uniformly over the alignment structure. For example, the orientations of the axes of the crystal molecules may spatially vary within the solid crystal, resulting in a spatially varying orientation of the axis of the solid crystal. With different orientations of the axis of the solid crystal, which may be configured by different predetermined alignment patterns of the crystal molecules, the optical device may exhibit different optical functions. For example, the optical device may function as a waveguide, a grating, a prism, a lens, an axicon, an optical rotator, a waveplate or a phase retarder, a lens array, a prism array, etc., depending on the predetermined alignment patterns of the crystal molecules.

The solid crystal may be in a form of a layer, a film, a plate, or a stack of layers, films, or plates. The solid crystal may have a high refractive index. As a result, the solid crystal may be made thin and light weight. For example, the solid crystal may have a thickness of about 500 nanometer ("nm") to about 5 micrometer ("μm"). Accordingly, the optical device including the solid crystal may be made thin, light weight, and compact. In addition, the technical solution disclosed in the present disclosure enables fabrication of solid crystals having a large size. For example, by forming (e.g., growing) a solid crystal using an alignment structure, the solid crystal may be fabricated to have a thickness of 100 micrometers or greater (e.g., about 300-500 micrometers) and one or more lateral dimensions of 10 mm or greater (e.g., about 10-100 mm or greater, about 20-100 mm or greater, about 30-100 mm or greater). Solid crystals having large sizes may widen the applications of the optical device in a wide variety of technical fields.

FIG. 1A schematically illustrates an x-z sectional view of an optical element or device 100 in accordance with some embodiments. As shown in FIG. 1A, the optical device 100 may include a solid crystal 115 (e.g., also referred to as solid organic crystal film 115) in a form of a film (a layer, or a plate). Although the body of the solid crystal 115 is shown as flat for illustrative purposes, the body of the solid crystal 115 may have a curved shape. In the present disclosure, for discussion purposes, a solid crystal may also be referred to as a solid crystal film (or a solid crystal layer). The solid crystal 115 may include a solid crystal material having a plurality of crystal molecules.

In some embodiments, the optical device 100 may also include an alignment structure 110 configured to at least partially define or set an orientation of an axis of the solid crystal 115 or a predetermined alignment pattern for aligning the crystal molecules included in the solid crystal 115. For discussion purposes, the axis of the solid crystal 115 may refer to an axis along which the solid crystal 115 may have a highest or largest refractive index. An axis of a crystal molecule in the solid crystal 115 may refer to as an axis along which the crystal molecule may have a highest or largest refractive index. The orientation of the axis of the solid crystal 115 may be an aggregated effect of the orientations of the axes of the crystal molecules included in the solid crystal 115. The solid crystal 115 may be disposed on the alignment structure 110. In some embodiments, the solid crystal 115 may be grown on the alignment structure 110. In some embodiments, the alignment structure 110 may be omitted. For example, the predetermined alignment pattern may be introduced inside the solid crystal 115 through crystallization in the presence of a ferroelectric or ferromagnetic material and a ferroelectric or ferromagnetic field.

In some embodiments, the optical device 100 may also include a substrate 105 configured to provide support and/or protection to various layers, films, and/or structures disposed at the substrate 105 (e.g., on the substrate 105). The alignment structure 110 may be disposed at the substrate. In some embodiments, the alignment structure 110 may be an integral part of the substrate 105. For example, the alignment structure 110 may be etched on or at least partially in a surface of the substrate 105. In some embodiments, the alignment structure 110 may be integrally formed inside the substrate 105. In some embodiments, the alignment structure 110 may be separately formed (e.g., deposited) onto the surface of the substrate 105.

In some embodiments, the substrate 105 may be compatible with (e.g., lattice constant-matched) the crystal molecules included in the solid crystal 115. In some embodiments, the substrate 105 may be optically transparent (e.g., having a light transmittance of at least about 60%) at least in a visible spectrum (e.g., wavelength ranging from about 380 nm to about 700 nm). In some embodiments, the substrate 105 may also be transparent in at least a portion of the infrared ("IR") spectrum (e.g., wavelength ranging from about 700 nm to about 1 mm). The substrate 105 may include a suitable material that is substantially transparent to lights of the above-listed wavelength ranges, such as, a glass, a plastic, a sapphire, a polymer, a semiconductor, or a combination thereof, etc. The substrate 105 may be rigid, semi-rigid, flexible, or semi-flexible. In some embodiments, the substrate 105 may have one or more surfaces in a flat, a convex, a concave, an asphere, or a freeform shape.

In some embodiments, the substrate 105 may be a part of another optical element or device, or a part of another opto-electrical element or device. For example, the substrate 105 may be a solid optical lens or a part of a solid optical lens. In some embodiments, the substrate 105 may be a part of a functional device, such as a display screen. In some embodiments, the substrate 105 may be used to fabricate, store, or transport the optical device 100. In some embodiments, the substrate 105 may be detachable or removable from the rest of the optical device 100 after the rest of the optical device 100 is fabricated or transported to another place or device. That is, the substrate 105 may be used in fabrication, transportation, and/or storage to support the solid crystal 115 provided on the substrate 105, and may be separated or removed from the solid crystal 115 of the optical device 100 when the fabrication of the optical device 100 is completed, or when the optical device 100 is to be implemented in another optical device or in an optical system.

In some embodiments, the solid crystal 115 may fabricated based on one or more solid crystal materials, such as anthracene, tetracene, pentacene or any other saturated or unsaturated, polycyclic hydrocarbons and their derivatives, nitrogen, sulfur and oxygen heterocycles, quinolines, benzothiophenes, and benzopyrans, bent and asymmetric acenes such as phenanthrene, phenanthroline, pyrene, and fluoranthene and their derivatives, 2,6-naphthalene dicarboxylic acid, 2,6-dimethyl carboxylic ester molecules and their derivatives, biphenyl, terphenyl, quaterphenyl, or phenylacetylene, or their derivatives including substitutes with alkyl groups, cyano groups, isothiocyanate groups, fluorine, chlorine or fluorinated ether. In some embodiments, the solid crystal 115 may include chiral crystal molecules or crystal molecules doped with chiral dopants, and the solid crystal 115 may exhibit chirality, i.e., handedness.

The solid crystal 115 may be a contiguous solid crystal film, where neighboring crystal lattices may be connected to each other across the entire optical device 100. In some embodiments, the solid crystal 115 may be optically anisotropic, for example, uniaxially or biaxially optically anisotropic. In some embodiments, the solid crystal 115 may be configured to have a spatially varying or a spatially uniform optical anisotropy within the contiguous solid crystal 115, which may be at least partially defined, configured, or set by the alignment structure 110. In some embodiments, the spatially varying or the spatially uniform optical anisotropy may be generated based on spatially varying or spatially uniform orientations of the axes of the molecules included in the solid crystal 115.

In some embodiments, the solid crystal 115 may have a first principal refractive index along a first direction, and a second principal refractive index along an in-plane direction perpendicular to the first direction. In some embodiments, the first direction may be parallel to the axis of the solid crystal 115 along which the solid crystal 115 may have the highest or largest refractive index. In some embodiments, the first principal refractive index of the solid crystal 115 may be at least about 1.5, at least about 1.6, at least about 1.7, at least about 1.8, at least about 1.9, at least about 2.0, at least about 2.1, or at least about 2.2. In some embodiments, an optical anisotropy (e.g., an in-plane birefringence) of the solid crystal 115 may be at least about 0.03, at least about 0.05, at least about 0.1, at least about 0.2, at least about 0.3, at least one about 0.35, or at least about 0.4.

The solid crystal 115 may be structurally configured or fabricated to realize at least one predetermined optical function of the optical device 100. In some embodiments, the solid crystal 115 may be structurally configured or fabricated to have a substantially spatially non-varying (e.g., constant) orientation of the axis of the solid crystal 115. In some embodiments, the solid crystal 115 may be structurally configured or fabricated to have a spatially varying orientation of the axis of the solid crystal 115. In some embodiments, configuring the spatially constant or spatially varying orientation of the axis of the solid crystal 115 may be realized by aligning the crystal molecules included in the solid crystal 115 in a predetermined alignment pattern, e.g., a spatially uniform alignment pattern, or a spatially varying alignment pattern. That is, the solid crystal 115 may be structurally configured or fabricated to have the crystal molecules aligned in a predetermined alignment pattern, thereby providing at least one predetermined optical function.

In some embodiments, the alignment structure 110 may be configured to at least partially align the crystal molecules in the predetermined alignment pattern. In some embodiments, the orientations of the axes of the crystal molecules that are in contact with the alignment structure 110 may be aligned by (or with) the alignment structure 110, and the orientations of the axes of remaining crystal molecules may be aligned according to the neighboring crystal molecules that have been aligned and/or configured by the alignment structure 110. In some embodiments, the predetermined alignment pattern of the crystal molecules may result in uniform orientations, periodic linear orientations, periodic radial orientations, periodic azimuthal orientations, or a combination thereof of the axes of the crystal molecules within the solid crystal 115. Accordingly, the axis of the solid crystal 115 may be configured to have a constant orientation, a periodic linear orientation, a periodic radial orientation, a periodic azimuthal orientation, or a combination thereof within the solid crystal 115.

Depending on different orientations of the axis of the solid crystal 115, the optical device 100 may provide different optical functions. For example, depending on different orientations of the axis of the solid crystal 115, the optical device 100 may function as an optical waveguide, a grating, a prism, a lens, an axicon, an optical rotator, a waveplate or a phase retarder, a lens array, a prism array, or a combination thereof. The optical device 100 may function as a transmissive-type optical device, a reflective-type optical device, or a transmissive-reflective-type optical device. In some embodiments, when the optical device 100 functions as a transmissive-type optical device, the solid crystal 115 may be optically transparent (e.g., having a light transmittance of at least about 60%) at least in the visible spectrum (e.g., about 380 nm to about 700 nm). In some embodiments, the solid crystal 115 may also be optically transparent at least a portion of the IR spectrum, e.g., having a light transmittance of at least about 60% in the near IR spectrum.

In some embodiments, the solid crystal 115 at an aligned crystal state may be polarization dependent due to the optical anisotropy. For example, the solid crystal 115 may exhibit different optical functions for incident lights having different polarizations. In some embodiments, the solid crystal 115 may be switchable between an amorphous state and the aligned crystal state through various methods, for example, through a polarization based switching, a thermal based switching, or an external field based switching, etc. In the amorphous state, the solid crystal 115 may remain in a solid state, and the crystal molecules may not be in the predetermined alignment pattern. As a result, the solid crystal 115 in the amorphous state may not exhibit the predetermined optical function that is determined by the predetermined alignment pattern of the crystal molecules in the solid crystal 115. In some embodiments, the solid crystal 115 may be switchable between the amorphous state and the aligned crystal state by switching a polarization of a light incident onto the solid crystal 115. In some embodiments, the solid crystal 115 may be switchable to the amorphous state at an elevated temperature. In some embodiments, the solid crystal 115 may be switchable between the amorphous state and the aligned crystal state through applying an external field (e.g., an external light field) to the crystal molecules in the solid crystal 115, where the external field may change the orientations/alignments of the crystal molecules in the solid crystal 115. After the external field is removed, the crystal molecules may return to the initial orientations/alignments. For example, the crystal molecules may be aligned according to an interference pattern (e.g., formed by two optical beams with different states of polarization). The interference pattern may create regions of constructive or destructive interference, where the crystal molecules may be selectively aligned. For example, the crystal molecules may be aligned differently in the regions of constructive or destructive interference. Through creating a holographic pattern or an active exposure that the crystal molecules are subject to and through configuring time scales and length scales, the orientations/alignments of the crystal molecules may be dynamically controlled. That is, active orientations/alignments of the crystal molecules may be achieved.

In some embodiments, the spatial variation of the orientation of the axis of the solid crystal 115 (or the spatially varying orientation of the axis of the solid crystal 115) may substantially smooth throughout the solid crystal 115. In some embodiments, the solid crystal 115 may include a plurality of grains (or sections) with at least one grain boundary, where each or multiple grains may be at least partially aligned by the alignment structure 110. To realize a smooth transition between neighboring grains and crystal molecules, in some embodiments, one or more additional functional groups may be incorporated into the crystal molecules. In some embodiments, one or more additives or one or more plasticizers configured to release local crystalline strain may be added to the solid crystal 115. In some embodiments, the plasticizers may include molecules with alkyl/alkoxy chains (e.g., liquid crystal molecules) that may exhibit weak affinity to crystallinity, thereby making the crystal phase softer and more malleable to deformations and structural changes.

In some embodiments, the alignment structure 110 may include an alignment layer, which may be separate film formed on or bonded to the substrate 105. The alignment layer may be disposed between the substrate 105 and the solid crystal 115, and may be in contact with the solid crystal 115. In some embodiments, the alignment layer may be a photo-alignment material ("PAM") layer, which may include one or more photo-alignment materials. In some embodiments, the photo-alignment materials may include photosensitive molecules that may undergo orientational ordering when subject to a polarized light irradiation. In some embodiments, the photosensitive molecules may include elongated anisotropic photosensitive units (e.g., small molecules or fragments of polymeric molecules), which may be aligned in an alignment structure pattern when subject to the polarized light irradiation.

In some embodiments, the photosensitive units may be polarization sensitive. For example, the photosensitive units may be aligned by a light with a predetermined polarization, and may not be aligned by a light with a different polarization. In some embodiments, the alignment layer may be a mechanically rubbed layer (e.g., a mechanically rubbed polymer layer). In some embodiments, the alignment layer may be a polymer layer with anisotropic nanoimprint. In some embodiments, the alignment layer may include a ferroelectric or ferromagnetic material configured to at least partially align the crystal molecules in the solid crystal 115 in a presence of a magnetic field or an electric field. In some embodiments, the alignment layer may be a substantially thin crystalline film (or layer) or a crystalline substrate configured to at least partially align the crystal molecules in the solid crystal 115. The crystalline film or the crystalline substrate may include solid crystal molecules that have already been aligned in an alignment structure pattern. When crystal molecules that form the solid crystal 115 are grown on the crystalline film or crystalline substrate, through lattice constant matching, the growth of the crystal molecules that form the solid crystal 115 may be configured, affected, or determined by the alignment structure pattern defined by the molecules of the crystalline film or crystalline substrate. The alignment structure pattern of the thin crystalline film or crystalline substrate may be formed using any suitable methods disclosed herein. In a process of fabricating the solid crystal 115, crystal molecules of the solid crystal 115 may be deposited on (e.g., grown on) the thin crystalline film or substrate. The crystal molecules of the solid crystal 115 in contact with the thin crystalline film or substrate may be align with the crystal molecules included in the thin crystalline film or substrate. Multiple thin crystalline films or substrates may be used to form a stack of layers of crystal molecules in the solid crystal 115 having different alignment patterns. In some embodiments, the alignment layer may be configured to at least partially align the crystal molecules in the solid crystal 115 based on a crystallization occurring in a presence of a magnetic field or an electric field. In some embodiments, the alignment layer may include a hexagonal boron nitride (h-BN) layer or a graphene layer.

In some embodiments, the alignment structure 110 may include features directly formed on or at least partially in the substrate 105 or formed on or at least partially in the solid crystal 115. In some embodiments, the alignment structure 110 may be generated in the solid crystal 115 based on a crystallization occurring in a presence of a magnetic field or an electric field. In some embodiments, the alignment structure 110 may be generated in the solid crystal 115 based on an external light field, which may at least partially align the crystal molecules in the solid crystal 115 in the predetermined alignment structure. For example, the crystal molecules included in the solid crystal 115 may be aligned according to an interference pattern (e.g., formed by two optical beams with different states of polarization). The interference pattern may create regions of constructive or destructive interference, where the crystal molecules may be selectively aligned. For example, the crystal molecules may be aligned differently in the regions of constructive or destructive interference.

In some embodiments, the substrate 105 may be nanofabricated to have the alignment structure 110 for at least partially aligning the crystal molecules in the solid crystal 115. For example, the substrate 105 may be fabricated from an organic material, such as amorphous or liquid crystalline polymers, crosslinkable monomers including those having liquid crystal properties. In some embodiments, the substrate 105 may be fabricated from an inorganic material, such as metals or oxides used for manufacturing of metasurfaces. The material(s) of the substrate 105 may be isotropic or anisotropic. In some embodiments, the substrate 105 may be nanofabricated from a resist material that is transparent or nearly transparent to a range of electromagnetic frequencies, such as the visible wavelength spectrum. The resist material may be in a form of thermoplastic, polymer, optically transparent photoresist, etc. After being set or cured, the resist material may provide an alignment to the crystal molecules included in the solid crystal 115. That is, in some embodiments, the substrate 105 may also function as an alignment layer for at least partially aligning the crystal molecules included in the solid crystal 115. Various alignment patterns and features may be realized using the nanofabrication techniques of the substrate 105, which allow for the creation of an alignment structure 110 to at least partially align the crystal molecules included in the solid crystal 115 with high customizability. In some embodiments, the alignment structure 110 may include an anisotropic relief, which may be formed by wet or dry etching the anisotropic relief directly on a surface (e.g., an upper surface in FIG. 1A) of the substrate 105 or on a surface (e.g., a lower surface in FIG. 1A) of the solid crystal 115. In some embodiments, the substrate 105 may be a substantially thin crystalline substrate configured at least partially align the crystal molecules included in the solid crystal 115, and the substrate 105 may function as the alignment structure 110.

Figure 1B:
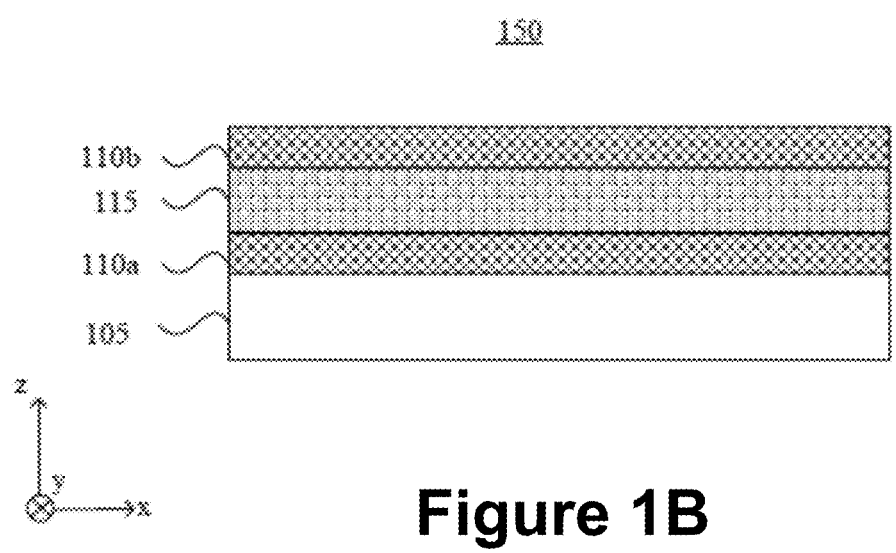
FIG. 1B schematically illustrates a cross-sectional view of an optical device in accordance with some embodiments.

In some embodiments, as shown in FIG. 1B, an optical device 150 may include two alignment structures 110a and 110b sandwiching the solid crystal 115. The solid crystal 115 may be in contact with both alignment structures 110a and 110b. The alignment structures 110a and 110b may be configured to at least partially align the crystal molecules included in the solid crystal 115 in the predetermined alignment pattern. In some embodiments, the orientations of the axes of the crystal molecules that are in contact with the alignment structures 110a and 110b may be determined by the alignment structures 110a and 110b, respectively. The orientations of the axes of other crystal molecules included in the solid crystal 115 may be aligned according to the neighboring crystal molecules that are in contact with and that have been aligned by the alignment structure 110a and/or the alignment structure 110b. The two alignment structures 110a and 110b may each define or have an alignment structure pattern. The alignment structure pattern of the two alignment structures 110a and 110b may be the same, or may be different.

Returning to FIG. 1A, in some embodiments, the optical device 100 may include other elements. For example, the substrate 105 may have a first surface (e.g., an upper surface shown in the view shown in FIG. 1A) and an opposing second surface (a lower surface in the view shown in FIG. 1A). The solid crystal 115 may be disposed at the first surface of the substrate 105. In some embodiments, the optical device 100 may also include a reflective coating disposed at the second surface of the substrate 105. The solid crystal 115 may have a first surface (e.g., an upper surface in the view shown in FIG. 1A) and an opposing second surface (e.g., a lower surface in the view shown in FIG. 1A). In some embodiments, the optical device 100 may include an anti-reflective coating disposed at least one of the first surface or the second surface of the solid crystal 115. In some embodiments, the optical device 100 may include two substrates disposed opposite to each other. For example, a second substrate may be disposed on the alignment structure 110.

Likewise, the optical device 150 shown in FIG. 1B may include other elements. For example, a reflective coating may be disposed at a lower surface (the surface opposite to the surface where the alignment structure 110a is disposed) of the substrate 105. An anti-reflective coating may be disposed at least one of an upper surface or a lower surface of the solid crystal 115. In some embodiments, the optical device 150 may include a second substrate disposed on the alignment structure 110b.

FIG. 1A and FIG. 1B show one solid crystal 115 for illustrative purposes. The number of solid crystals (e.g., solid crystal films, layers, or plates) included in the optical device 100 or 150 may be any suitable number, such as two, three, four, five, six, etc. In some embodiments, the number of alignment structures (e.g., alignment layers) included in the optical device 100 or 150 may not be limited to one or two, and may be more than two, such as three, four, five, six, etc. The number of solid crystals (e.g., solid crystal films, layers, or plates) and the alignment structures that may be included in the optical device 100 or 150 may be determined based on specific applications. For example, the optical device 100 or 150 may include a stack of multiple contiguous solid crystals (e.g., solid crystal films, layers, or plates) and multiple alignment structures (e.g., alignment layers) alternately arranged. The crystal molecules included in the solid crystal may be at least partially aligned by respective alignment structures on which the crystal molecules are disposed. For example, the crystal molecules in a solid crystal film may be at least partially aligned by an alignment structure on which the solid crystal film is disposed. In some embodiments, the multiple alignment structures may be the same. For example, the multiple alignment structures may be configured to at least partially align the crystal molecules included in the respective solid crystal films in a substantially same predetermined alignment pattern. In some embodiments, at least two of the multiple alignment structures may be different from each other. For example, at least two of the multiple alignment structures may be configured to at least partially align the crystal molecules included in the corresponding at least two respective solid crystal films in at least two different predetermined alignment patterns. In some embodiments, when the thick of the stack is greater than or equal to a predetermined thickness, the multiple alignment structures may offer the advantage of resetting or realigning the orientations of the crystal molecules in the respective solid crystal films.

In some embodiments, the multiple solid crystal films may include same solid crystals. In some embodiments, at least two of the multiple solid crystal films may include different solid crystals. For example, the solid crystals may have different optical dispersions (e.g., different birefringence dispersions). For example, two solid crystal films respectively including solid crystals of a positive birefringence dispersion and a negative birefringence dispersion may compensate for each other, resulting in a substantially achromatic optical device in a predetermined wavelength range (e.g., the visible wavelength range). In some embodiments, a single solid crystal film may include a combination of a first solid crystal material having a positive birefringence dispersion and a second solid crystal material having a negative birefringence dispersion, resulting in a substantially achromatic optical device in a predetermined wavelength range.

Furthermore, an organic solid crystal including a contiguous volume of an organic single crystal or a polycrystalline structure may be formed. In some embodiments, the organic solid crystal has a size no less than 100 micrometer in one dimension and no less than 30 millimeter in the other two dimensions. In some embodiments, a first high refractive index in the range of 1.6 to 2.6, and the optical anisotropy is larger than 0.1.

Figure 1C:
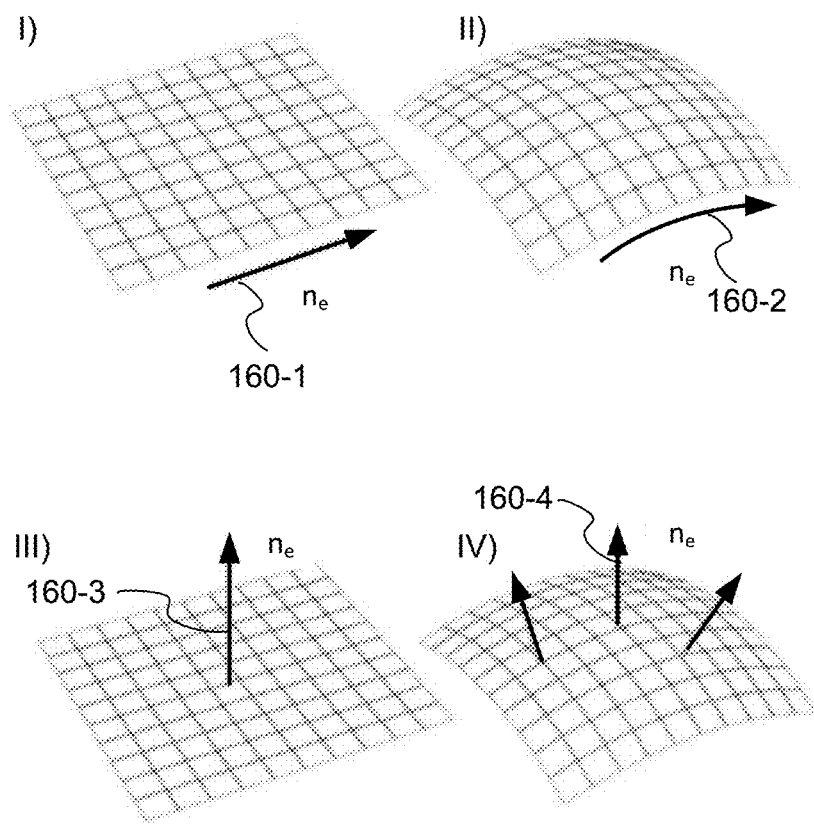
FIG. 1C illustrates an orientation of anisotropic refractive index on flat and curved substrates in accordance with some embodiments.
Figure 1D:
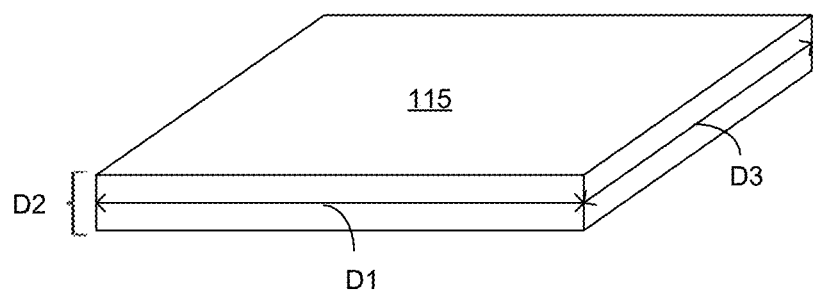
FIG. 1D schematically illustrates dimensions of a solid crystal in accordance with some embodiments.

FIG. 1C illustrates an orientation of anisotropic refractive index on flat and curved substrates in accordance with some embodiments. In some embodiments, an orientation of the first refractive index is perpendicular to any of in-plane direction or in parallel with one of the in-plane directions as shown in FIG. 1C. For example, in Sections I and II of FIG. 1C, refractive index ne is parallel with one of the in-plane directions as indicated with arrow 160-1 for a flat surface and with arrow 160-2 for a non-flat surface. As another example, in Sections III and IV of FIG. 1C, refractive index ne is normal to the surface as indicated with arrow 160-3 for the flat surface and with arrows 160-4 for the non-flat surface (e.g., refractive index ne is parallel to a portion of the surface). FIG. 1D schematically illustrates dimensions of solid crystal 115 (e.g., a contiguous volume of an organic single crystal or a polycrystalline structure) in accordance with some embodiments. In FIG. 1A, solid crystal 115 is shown together with alignment structure 110 and substrate 105. However, it is understood that solid crystal 115 may also be a standalone optical device, as shown with solid crystal 115 in FIG. 1D. For example, solid crystal 115 is fabricated on substrate 105 with alignment structure 110 and is separated (e.g., cleaved), from substrate 105 and/or alignment structure 110 after the fabrication. In some embodiments, solid crystal 115 has a first dimension (e.g., dimension D2 in FIG. 1D) no less than 100 micrometer and a second dimension distinct from the first dimension (e.g., no less than 1 centimeter, 2 centimeters, or 3 centimeters) (e.g., dimension D1 or dimension D3 in FIG. 1D).

In some embodiments, the contiguous volume of an organic single crystal or a polycrystalline structure (e.g., solid crystal 115) includes at least one of the polycyclic aromatic hydrocarbon molecules: naphthalene, anthracene, tetracene, pentacene, pyrene, polycene, fluoranthene, benzophenone, benzochromene, benzil, benzimidazole, benzene, hexachlorobenzene, nitropyridine-N-oxide, benzene-1, 4-dicarboxylic acid, diphenylacetylene, N-(4-nitrophenyl)-(s)-prolinal, 4,5-dicyanoimidazole, benzodithiophene, cyanopyridine, thienothiophene, stilbene, azobenzene, and their derivatives.

In some embodiments, the contiguous volume of an organic single crystal or a polycrystalline structure includes a molecule containing a ring structure system and two terminal group systems. The ring structure system includes saturated cyclic groups such as cyclohexane, cyclopentane, tetrahydropyran, piperidine, tetrahydrofuran, pyrrolidine, tetrahydrothiophene and their derivatives. The ring structure system also includes unsaturated aromatic groups such as benzene, naphthalene, anthracene, thiophene, bi-phenyl, tolane, benzimidazole, diphenylacetylene, cyanopyridine, thienothiophene, dibenzothiophene, carbazole, silafluorene and their derivatives. The terminal groups system includes one or more C1-C10 alkyl, alkoxy, alkenyl groups, —CN, —NCS, —SCN, —SF$_5$, —Br, —Cl, —F, —OCF$_3$, —CF$_3$, mono- or polyfluorinated C$_1$-C$_{10}$ alkyl or alkoxy group.

In some embodiments, the contiguous volume of an organic single crystal or a polycrystalline structure includes crystalline polymers with precursors with aromatic hydrocarbon or heteroarene groups and their derivatives. Examples of such polymer include polyethylene naphthalate, poly (vinyl phenyl sulfide), poly(a-methylstyrene, polythienothiophene, polythiophene, poly(n-vinylphtalimide), parylene, polysulfide, polysulfone, poly(bromophenyl), poly (vinlynaphthalene), liquid crystal polymer with precursors with functional groups described above (e.g., the terminal groups).

In some embodiments, the contiguous volume of an organic single crystal or a polycrystalline structure includes amorphous polymers with aliphatic, hetroaliphatic, aromatic hydrocarbon or heteroarene groups (e.g., polystyrene) as binder. In some embodiments, the organic solid crystal layer includes additives, such as fatty acid, lipids, plasticizer and surfactant (e.g., molecules with mono- or polyfluorinated alkyl or alkoxy group).

In some embodiments, the contiguous volume of an organic single crystal or the polycrystalline structure is formed of one or more organic crystal molecules selected from the group consisting the organic crystal molecules of Formulas 1-1 through 1-46, Formulas 2-1 through 2-4, and Formulas 3-1 through 3-28:

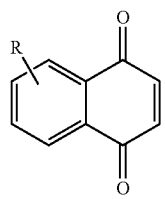

Formula 1-1

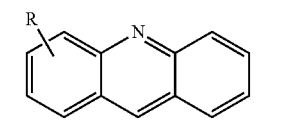

Formula 1-2

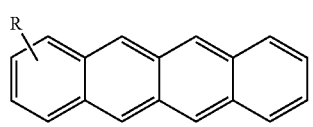

Formula 1-3

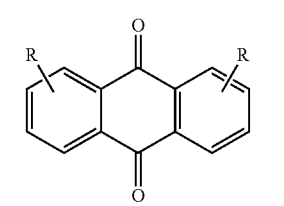

Formula 1-4

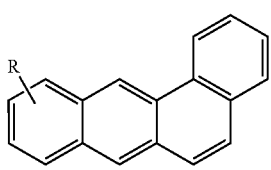

Formula 1-5

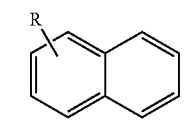

Formula 1-6

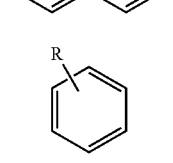

Formula 1-7

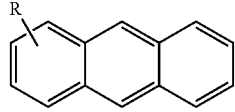

Formula 1-8

Formula 1-9

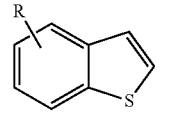

Formula 1-10

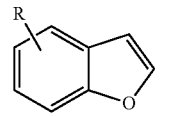

Formula 1-11

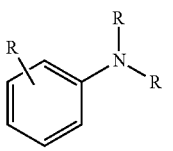

Formula 1-12

-continued
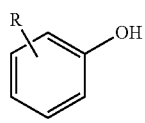
Formula 1-13
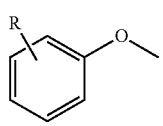
Formula 1-14
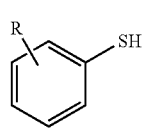
Formula 1-15
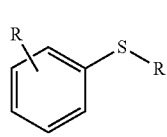
Formula 1-16
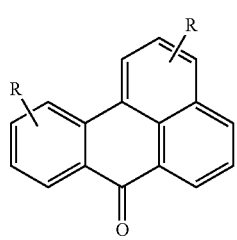
Formula 1-17
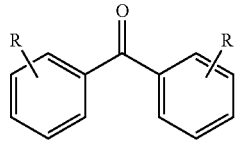
Formula 1-18
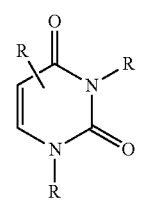
Formula 1-19
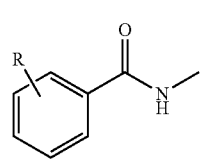
Formula 1-20
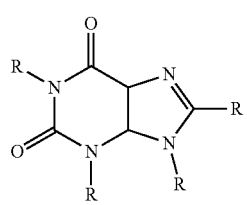
Formula 1-21
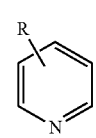
Formula 1-22
-continued
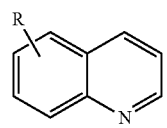
Formula 1-23
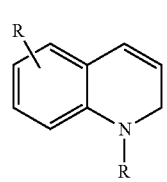
Formula 1-24
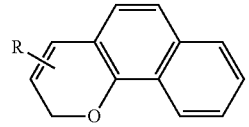
Formula 1-25
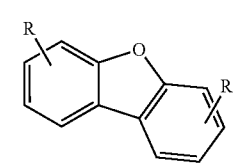
Formula 1-26
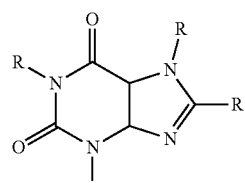
Formula 1-27
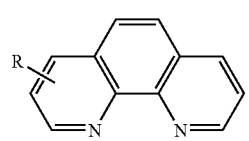
Formula 1-28
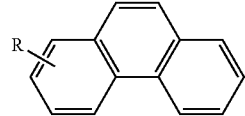
Formula 1-29
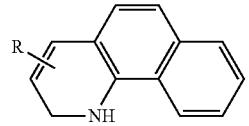
Formula 1-30
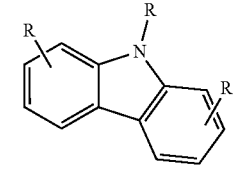
Formula 1-31
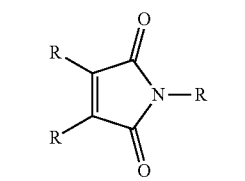
Formula 1-32

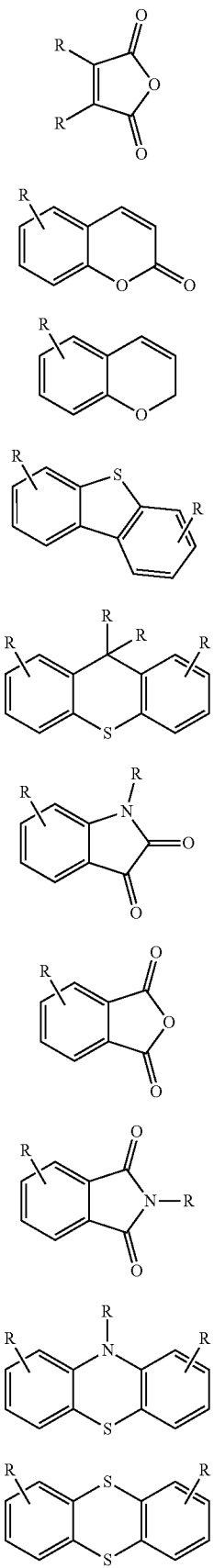
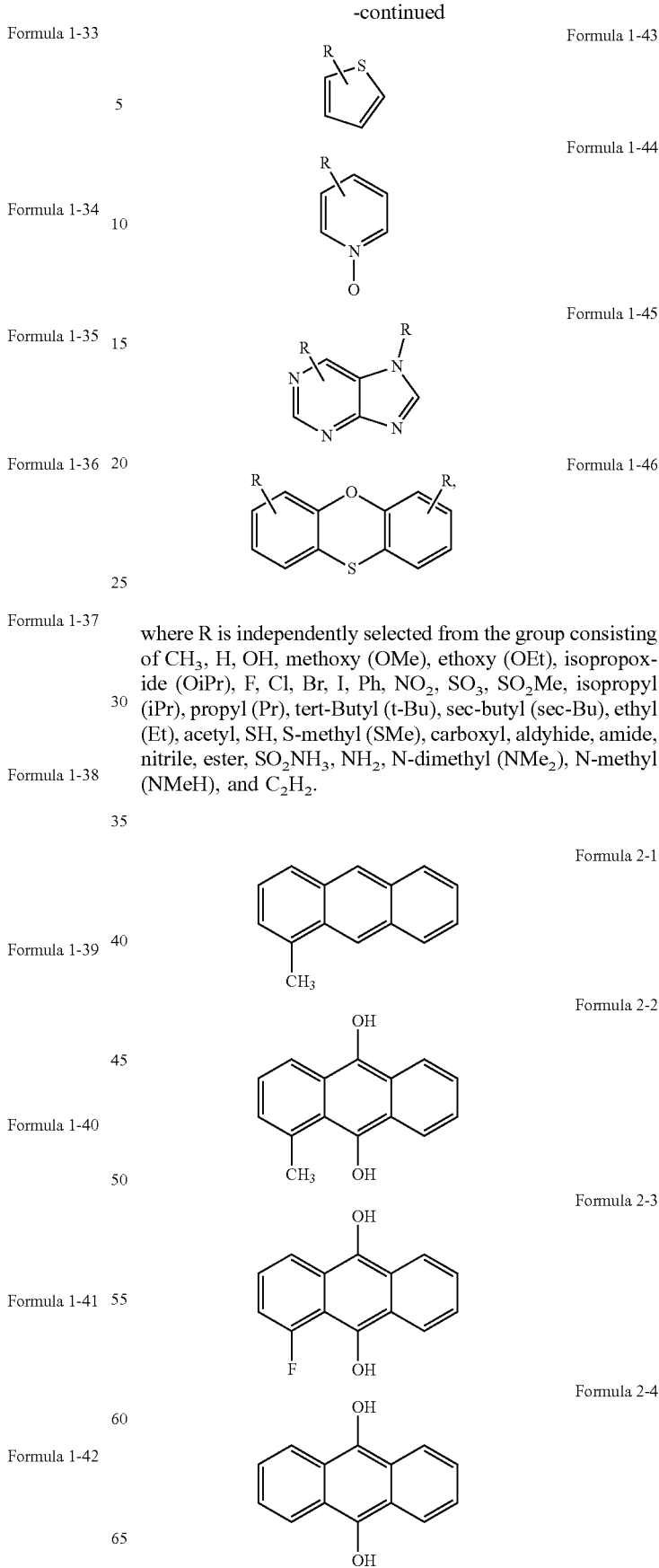
where R is independently selected from the group consisting of CH₃, H, OH, methoxy (OMe), ethoxy (OEt), isopropoxide (OiPr), F, Cl, Br, I, Ph, NO₂, SO₃, SO₂Me, isopropyl (iPr), propyl (Pr), tert-Butyl (t-Bu), sec-butyl (sec-Bu), ethyl (Et), acetyl, SH, S-methyl (SMe), carboxyl, aldyhide, amide, nitrile, ester, SO₂NH₃, NH₂, N-dimethyl (NMe₂), N-methyl (NMeH), and C₂H₂.

-continued
Formula 3-1*
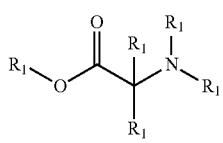
Formula 3-2*
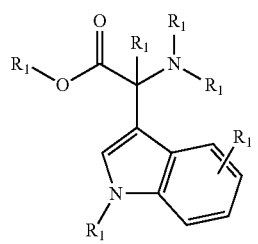
Formula 3-3*
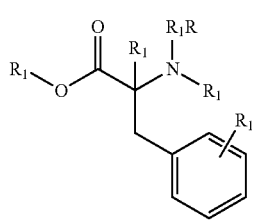
Formula 3-4*
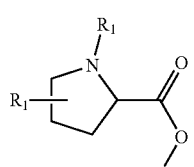
Formula 3-5*
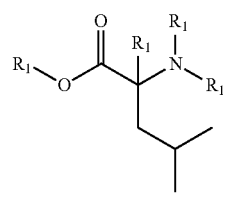
Formula 3-6*
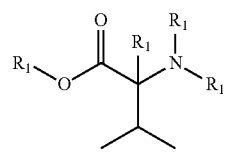
Formula 3-7*
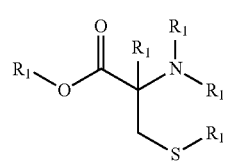
Formula 3-8*
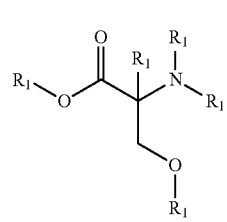
Formula 3-9
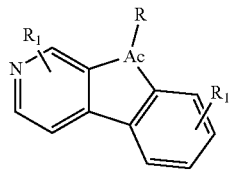
Formula 3-10
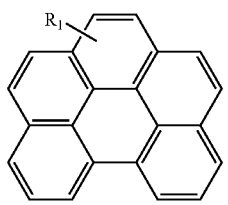
Formula 3-11
Formula 3-12
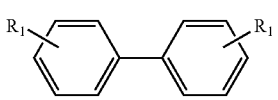
Formula 3-13
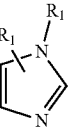
Formula 3-14
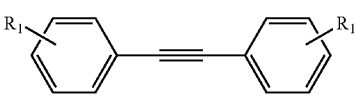
Formula 3-15
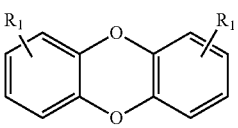
Formula 3-16
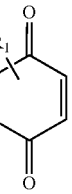
Formula 3-17
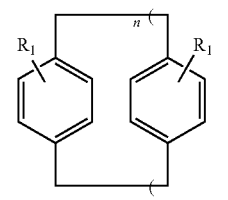
n = 1, 2, 3, 4,
Formula 3-18
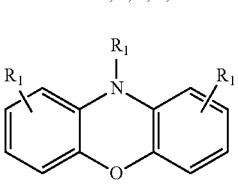

Formula 3-19
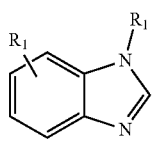

Formula 3-20
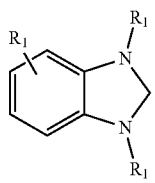

Formula 3-21
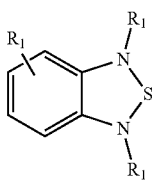

Formula 3-22
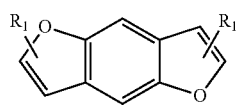

Formula 3-23
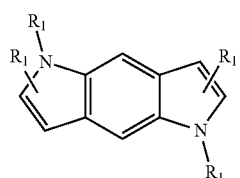

Formula 3-24
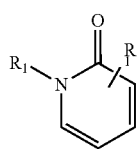

Formula 3-25
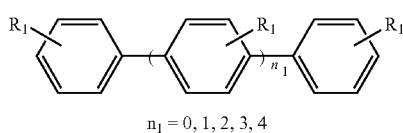

$n_1 = 0, 1, 2, 3, 4$

Formula 3-26
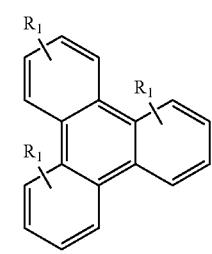

Formula 3-27
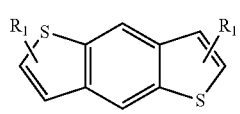

Formula 3-28
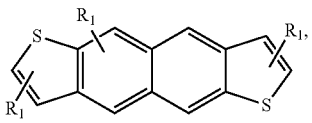

where $R_1$ is independently selected from the group consisting of $CH_3$, H, OH, OMe, OEt, OiPr, F, Cl, Br, I, Ph, $NO_2$, $SO_3$, $SO_2Me$, iPr, Pr, t-Bu, sec-Bu, Et, acetyl, SH, SMe, carboxyl, aldyhide, amide, nitrile, ester, $SO_2NH_3$, $NH_2$, $NMe_2$, NMeH, and $C_2H_2$, n is greater than or equal to one and $n_1$ is greater than or equal to zero.

Formula 4-1*
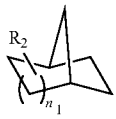

$n_1 = 0, 1, 2, 3, 4,$

Formula 4-2*
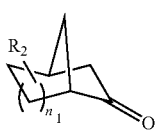

$n_1 = 0, 1, 2, 3, 4,$

Formula 4-3
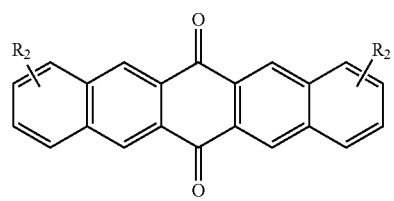

Formula 4-4
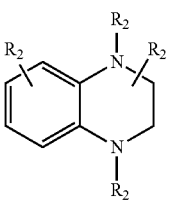

Formula 4-5
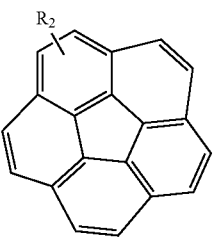

Formula 4-6
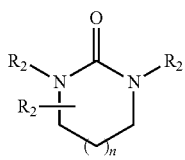

-continued
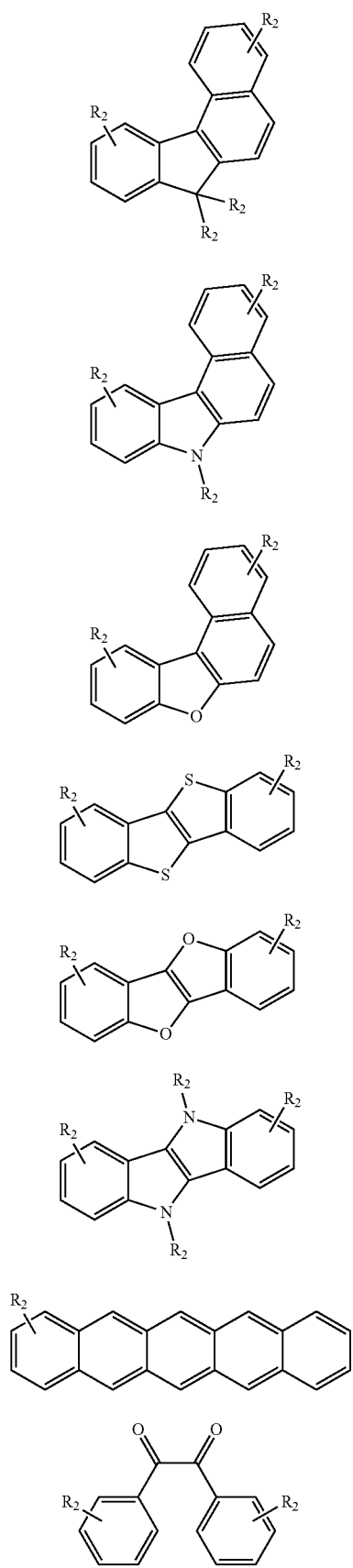
Formula 4-7
Formula 4-8
Formula 4-9
Formula 4-10
Formula 4-11
Formula 4-12
Formula 4-13
Formula 4-14
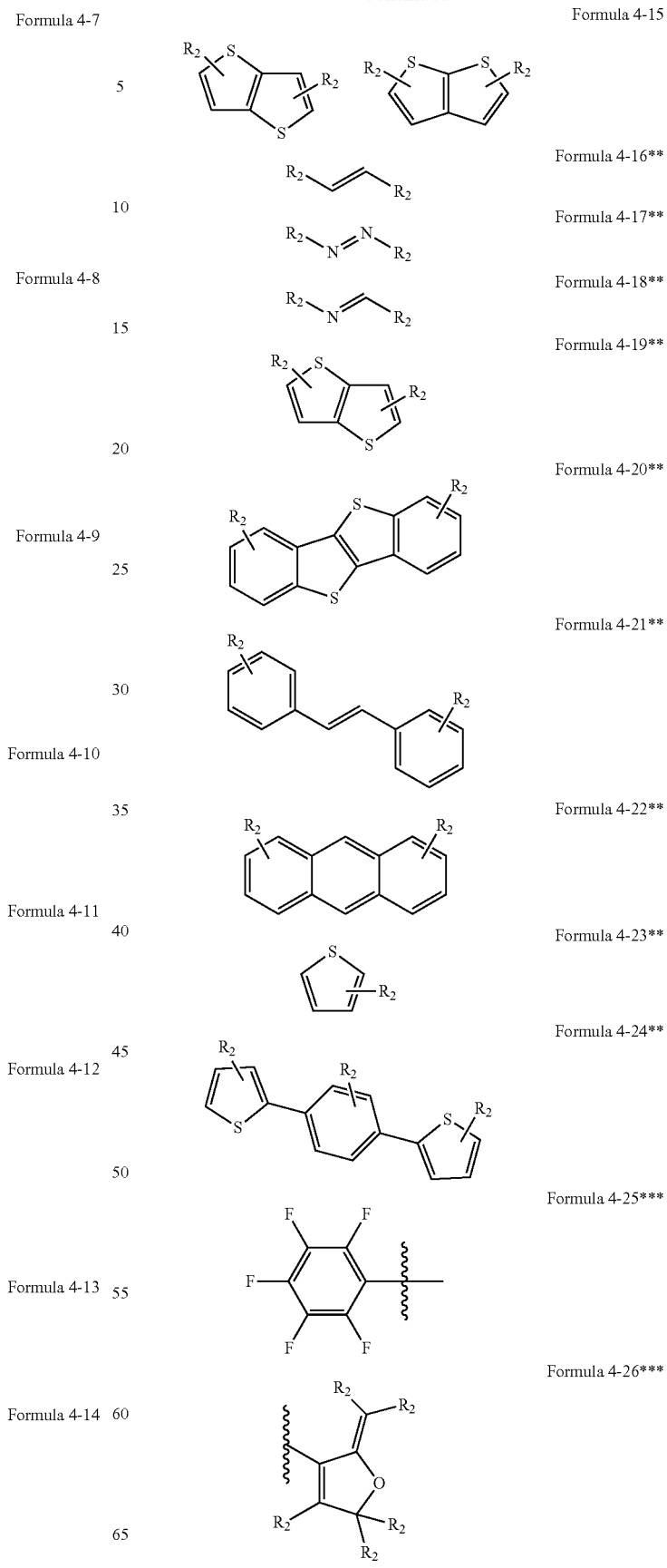
Formula 4-15
Formula 4-16**
Formula 4-17**
Formula 4-18**
Formula 4-19**
Formula 4-20**
Formula 4-21**
Formula 4-22**
Formula 4-23**
Formula 4-24**
Formula 4-25***
Formula 4-26***

-continued

Formula 4-27***
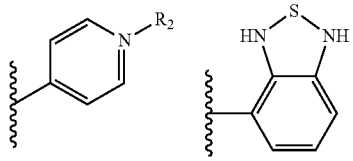

Formula 4-28****
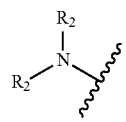

Formula 4-29****
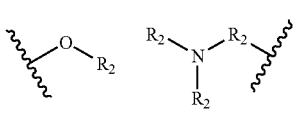

Formula 4-30****
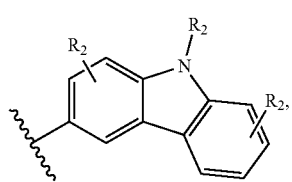

where $R_2$ is independently selected from the group consisting of $CH_3$, H, OH, OMe, OEt, OiPr, F, Cl, Br, I, Ph, $NO_2$, $SO_3$, $SO_2Me$, iPr, Pr, t-Bu, sec-Bu, Et, acetyle, SH, SMe, carboxyl, aldyhide, amide, nitrile, ester, $SO_2NH_3$, $NH_2$, $NMe_2$, NMeH, and $C_2H_2$ and $n_1$ is greater than or equal to zero. *An enantiomerically pure compound or a racemic mixture. Examples of bridge functional groups. *Examples of acceptor functional groups. ****Examples of donor functional groups.

In some embodiments, the contiguous volume of an organic single crystal or the polycrystalline structure is formed of organo-salts including a combination of anionic molecules (e.g., Formulas 5-1 through 5-11 below) and cationic molecules (e.g., Formulas 5-12 through 5-25 below). In some embodiments, at least one of: anionic molecules or cationic molecules is organic (e.g., anionic molecules are organic while cationic molecules are not organic, cationic molecules are organic while anionic molecules are not organic, or both anionic molecules and cationic molecules are organic). In some embodiments, the contiguous volume of an organic single crystal or the polycrystalline structure includes a combination of an anionic molecule selected from Formulas 5-1 through 5-11 and a cationic molecule selected from Formulas 5-12 through 5-25.

Formula 5-1*
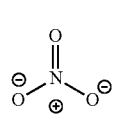

Formula 5-2*
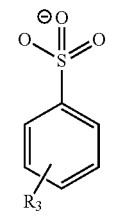

Formula 5-3*
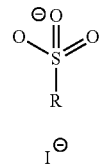

Formula 5-4*
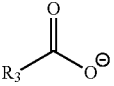

Formula 5-5*
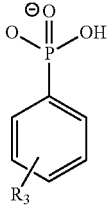

Formula 5-6*
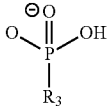

Formula 5-7*
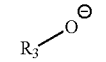

Formula 5-8*
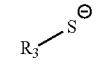

Formula 5-9*
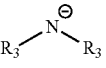

Formula 5-10*
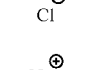

Formula 5-11*
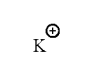

Formula 5-12**
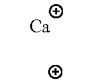

Formula 5-13**
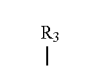

Formula 5-14**
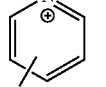

Formula 5-15**

Formula 5-16**
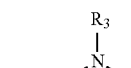

Formula 5-17**
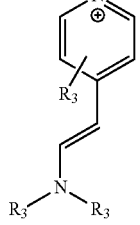

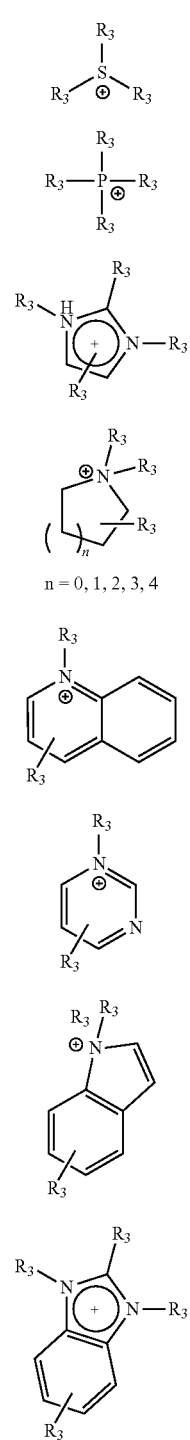

Formula 5-18**

Formula 5-19**

Formula 5-20**

Formula 5-21** n = 0, 1, 2, 3, 4

Formula 5-22**

Formula 5-23**

Formula 5-24**

Formula 5-25** where $R_3$ is independently selected from the group consisting of $CH_3$, H, OH, OMe, OEt, OiPr, F, Cl, Br, I, Ph, $NO_2$, $SO_3$, $SO_2Me$, iPr, Pr, t-Bu, sec-Bu, Et, acetyle, SH, SMe, carboxyl, aldyhide, amide, nitrile, ester, $SO_2NH_3$, $NH_2$, $NMe_2$, NMeH, and $C_2H_2$. *Anionic molecules. **Cationic molecules.

In some embodiments, the contiguous volume of an organic single crystal or the polycrystalline structure is formed on an alignment layer (e.g., alignment structure 110 in FIG. 1A). In some embodiments, the alignment layer includes a controlled-nucleation surface (e.g., a plurality of controlled-nucleation sites on a surface of a substrate such as substrate 105 in FIG. 1A). In some embodiments, the controlled-nucleation surface includes a non-polymer based coating selected from a silane based fluorinated group, alkyl groups cyclic aliphatic group, cyclic aromatic group, heteroarene group, organic small molecule based crystalline and any of Formulas 6-1 through 6-5:

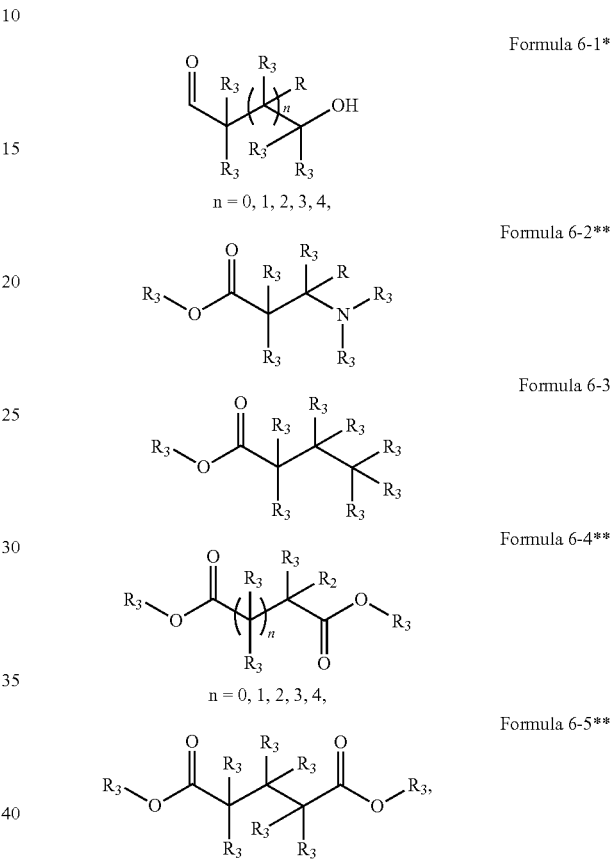

Formula 6-1* n = 0, 1, 2, 3, 4,

Formula 6-2**

Formula 6-3

Formula 6-4** n = 0, 1, 2, 3, 4,

Formula 6-5** where $R_3$ is independently selected from the group consisting of $CH_3$, H, OH, OMe, OEt, OiPr, F, Cl, Br, I, Ph, $NO_2$, $SO_3$, $SO_2Me$, iPr, Pr, t-Bu, sec-Bu, Et, acetyle, SH, SMe, carboxyl, aldyhide, amide, nitrile, ester, $SO_2NH_3$, $NH_2$, $NMe_2$, NMeH, and $C_2H_2$. * An enantiomerically pure compound or a racemic mixture of sugars, open or closed ring. ** An enantiomerically pure compound or a racemic mixture.

FIGS. 2A-2D schematically illustrate x-z sectional views of optical devices, according to various embodiments. In the embodiments shown in FIGS. 2A-2D, the crystal molecules in the respective solid crystal films may be substantially uniformly aligned in a predetermined alignment pattern (e.g., a predetermined direction). The optical devices shown in FIGS. 2A-2D may include structures or elements that are the same as or similar to those included in the optical device 100 shown in FIG. 1A or the optical device 150 shown in FIG. 1B. Descriptions of the same or similar structures or elements included in the embodiments shown in FIGS. 2A-2D can refer to the above descriptions, including those rendered in connection with the embodiments shown in FIG. 1A and FIG. 1B.

Figure 2A:
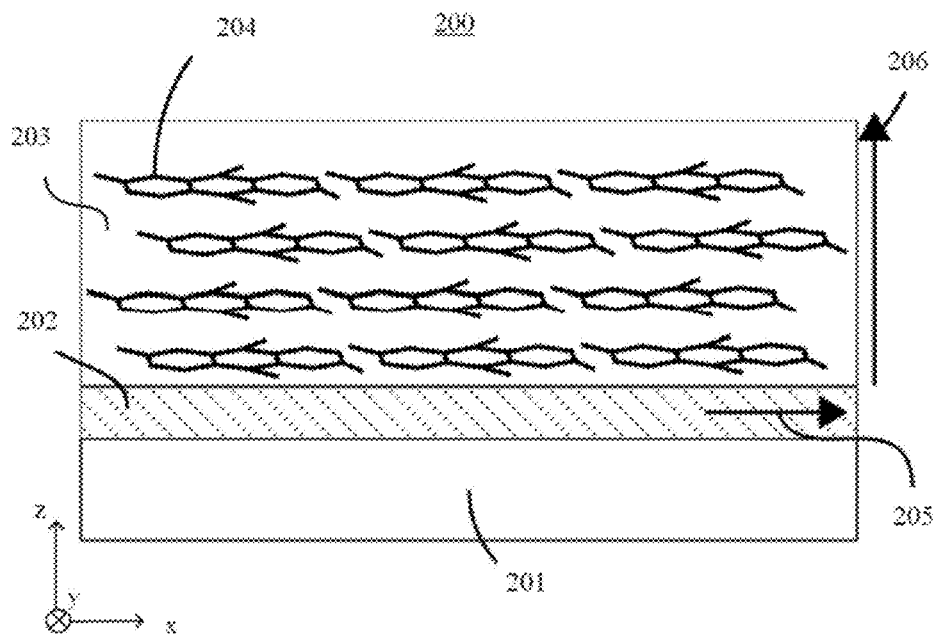
FIG. 2A schematically illustrates a cross-sectional view of an optical device in accordance with some embodiments.

As shown in FIG. 2A, an optical device 200 may include a substrate 201, an alignment structure 202 disposed at (e.g., on or at least partially in) the substrate 201, and a solid crystal film 203 disposed at (e.g., on) the alignment structure 202. The solid crystal film 203 may be in a form of a film, a layer, or a plate. For convenience of discussion, the solid crystal 203 may also be referred to as a solid crystal 203 or a solid crystal layer 203. For illustrative purposes, the substrate 201, the alignment structure 202, and the solid crystal film 203 are shown as having a flat shape. In some embodiments, at least one of the substrate 201, the alignment structure 202, or the solid crystal film 203 may be have a curved shape. The solid crystal film 203 may be in contact with the alignment structure 202, and crystal molecules 204 included in the solid crystal film 203 may be at least partially aligned by the alignment structure 202. In some embodiments, each layer of the crystal molecules 204 included in the solid crystal film 203 may lie flat on the alignment structure 202 in the x-y plane, and may follow an orientation or an alignment direction 205 (denoted by an arrow as shown in FIG. 2A) within the x-y plane perpendicular to a thickness direction 206 (e.g., a z-axis direction) of the solid crystal film 203. For example, the crystal molecules 204 may be spatially uniformly aligned along an x-axis direction as shown in FIG. 2A. Multiple layers of the crystal molecules 204 may be disposed (e.g., grown) along the z-axis direction to form the solid crystal film 203. For discussion purposes, each molecule 204 is depicted as having a longitudinal direction (or a length direction) and a lateral direction (or a width direction), and an axis of the molecule 204 is presumed to be in the longitudinal direction of the molecule 204, along the presumed axis of highest refractive index for molecule 204. As shown in FIG. 2A, the orientations of the axes of the molecules 204 are uniformly aligned by the alignment structure 202 in the alignment direction 205. That is, different layers of molecules 204 may be aligned substantially in the same alignment direction 205. A plane including the longitudinal direction and the lateral direction of the molecule 204 is parallel to the surface of the substrate 201 or the x-y plane (i.e., the molecule 204 lies flat in the x-y plane). For illustrative purposes, the crystal molecules 204 in the solid crystal film 203 or the solid crystal layer 203 are drawn to have a same shape. In some embodiments, the crystal molecules 204 in a solid crystal layer may be the same (e.g., molecules of the same crystal material). In some embodiments, the crystal molecules 204 in one solid crystal layer may include two or more different molecules (e.g., molecules of two or more different crystal materials).

Figure 2B:
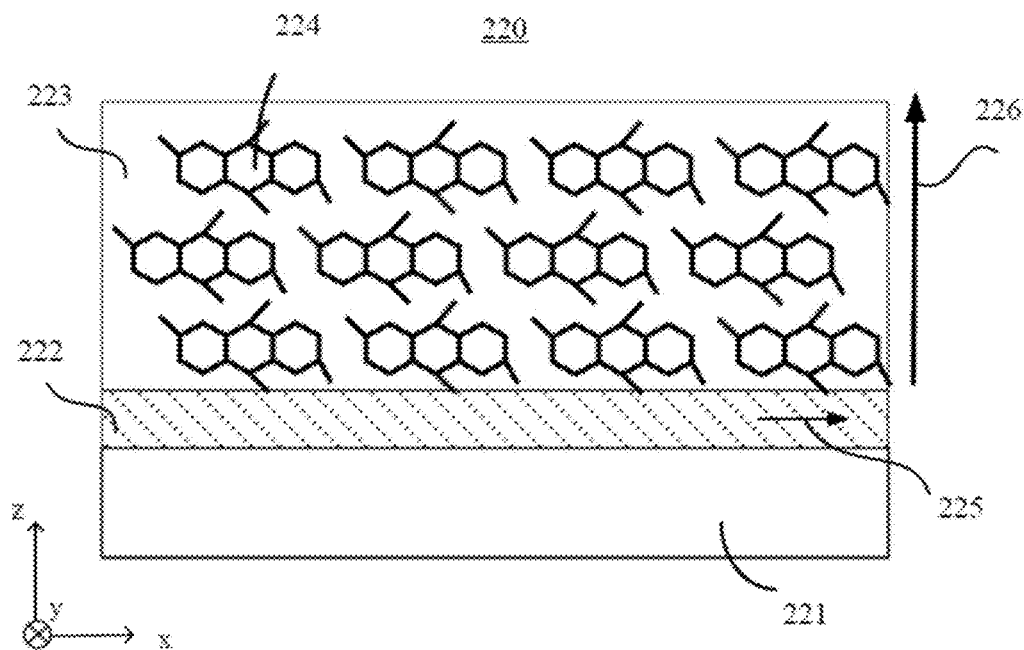
FIG. 2B schematically illustrates a cross-sectional view of an optical device in accordance with some embodiments.

As shown in FIG. 2B, an optical device 220 may include a solid crystal film 223. Crystal molecules 224 included in the solid crystal film 223 may be at least partially aligned by an alignment structure 222. In the embodiment shown in FIG. 2A, the crystal molecules 204 lie flat in the x-y plane (e.g., a plane including a longitudinal direction and a lateral direction of the crystal molecules 204 is parallel to the surface of the substrate 201, or the x-y plane). In the embodiment shown in FIG. 2B, the crystal molecules 224 may not lie flat in the x-y plane, but may lie flat in the x-z plane. That is, a plane including the longitudinal direction and the lateral direction of the crystal molecules 204 may be perpendicular to the surface of the substrate 221, or the x-y plane. Each layer of the crystal molecules 224 may follow an orientation or an alignment direction 225 (denoted by an arrow as shown in FIG. 2B) within the x-y plane that is perpendicular to a thickness direction 226 (e.g., a z-axis direction) of the solid crystal film 223. For example, the crystal molecules 224 may be spatially uniformly aligned along the x-axis direction as shown in FIG. 2B. In other words, the orientations of the axes of the molecules 224 may be uniformly aligned by the alignment structure 222. That is, different layers of molecules 224 may be uniformly aligned in the same alignment direction 225.

Figure 2C:
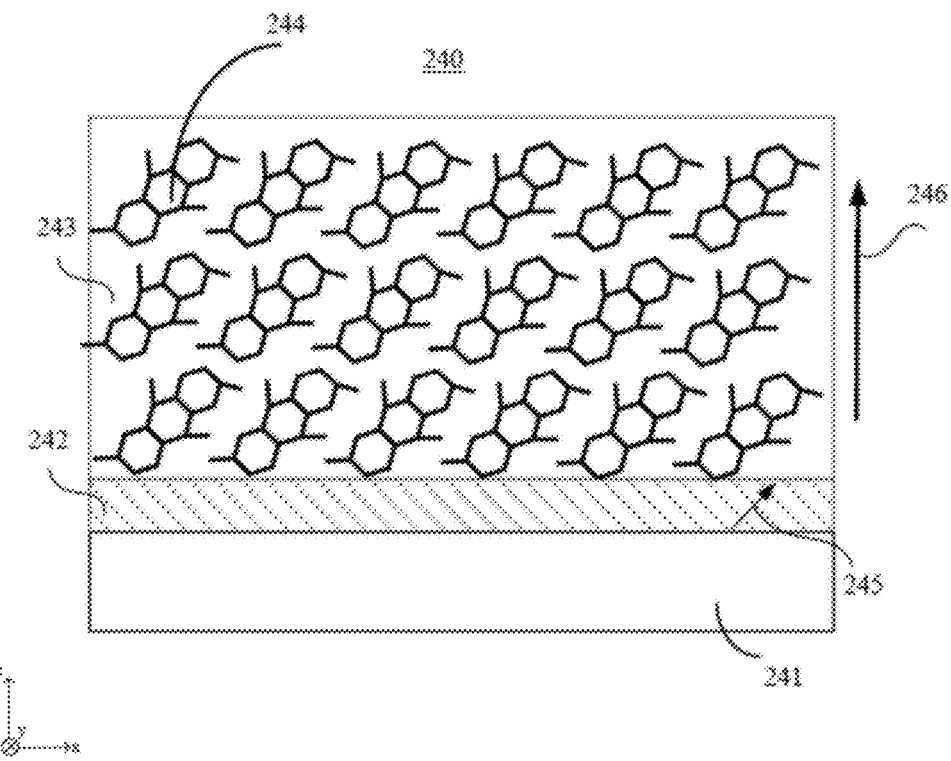
FIG. 2C schematically illustrates a cross-sectional view of an optical device in accordance with some embodiments.

As shown in FIG. 2C, an optical device 240 may include a solid crystal film 243. Crystal molecules 244 included in the solid crystal film 243 may be at least partially aligned by an alignment structure 242. The longitudinal direction (e.g., orientation of the axis) of each crystal molecule 244 in the x-z plane may form an angle with respective to a surface of a substrate 241 (or a surface of the alignment structure 242). For example, the crystal molecules 244 may follow an orientation or an alignment direction 245 (denoted by an arrow as shown in FIG. 2C) within an x-z plane. That is, the orientations of axes of the molecules 244 may be uniformly aligned in the alignment direction 245 in the x-z plane, forming a suitable angle relative to a surface of the substrate 241 (or a surface of the alignment structure 242). The angle of the crystal molecules 244 (e.g., the orientations of the axes of the molecules 244) with respective to the surface of the substrate 241 may be any suitable angles, such as 30°, 45°, etc. In some embodiments, the crystal molecules 244 included in the solid crystal film 243 may have other suitable orientations or alignment directions under appropriate crystal growth conditions. For example, the crystal molecules 244 may follow an orientation or an alignment direction in the thickness direction (e.g., the z-axis direction) of the solid crystal film 243.

Figure 2D:
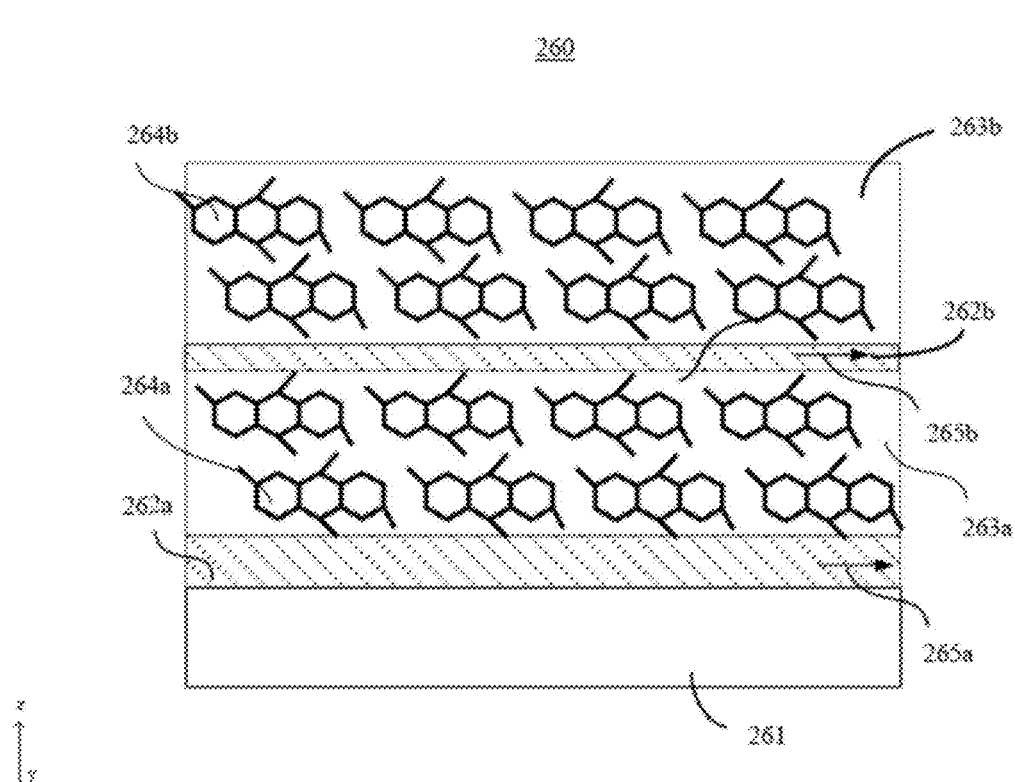
FIG. 2D schematically illustrates a cross-sectional view of an optical device in accordance with some embodiments.

As shown in FIG. 2D, an optical device 260 may include a stack of multiple contiguous solid crystal films and multiple alignment structures (e.g., alignment layers) alternately arranged. For illustrative purposes, two solid crystal films 263a and 263b, and two alignment structures 262a and 262b are shown to be included in the optical device 260. Crystal molecules 264a included in the solid crystal film 263a may be at least partially aligned by the alignment structure 262a, and crystal molecules 264b included in the solid crystal film 263b may be at least partially aligned by the alignment structure 262b. The multiple alignment structures may define the same or different predetermined alignment patterns for aligning crystal molecules disposed thereon. In the embodiment shown in FIG. 2D, the two alignment structures may provide a substantially same alignment pattern for the crystal molecules included in the respective solid crystal films. For example, the crystal molecules 264a and 264b may be aligned in the x-axis directions 265a and 265b, as shown in FIG. 2D. Although each solid crystal film 263a and 263b is shown to be similar to the solid crystal film 223 shown in FIG. 2B, in some embodiments, each solid crystal film 263a and 263b may be similar to the solid crystal film 203 shown in FIG. 2A or the solid crystal film 243 shown in FIG. 2C.

Figure 3A:
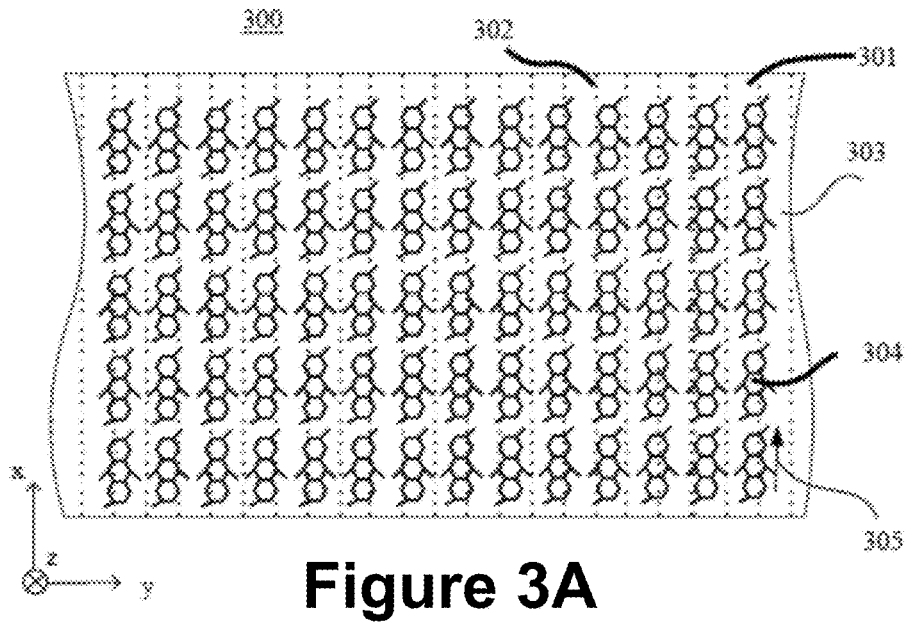
FIG. 3A schematically illustrates a top view of an optical device in accordance with some embodiments.
Figure 3B:
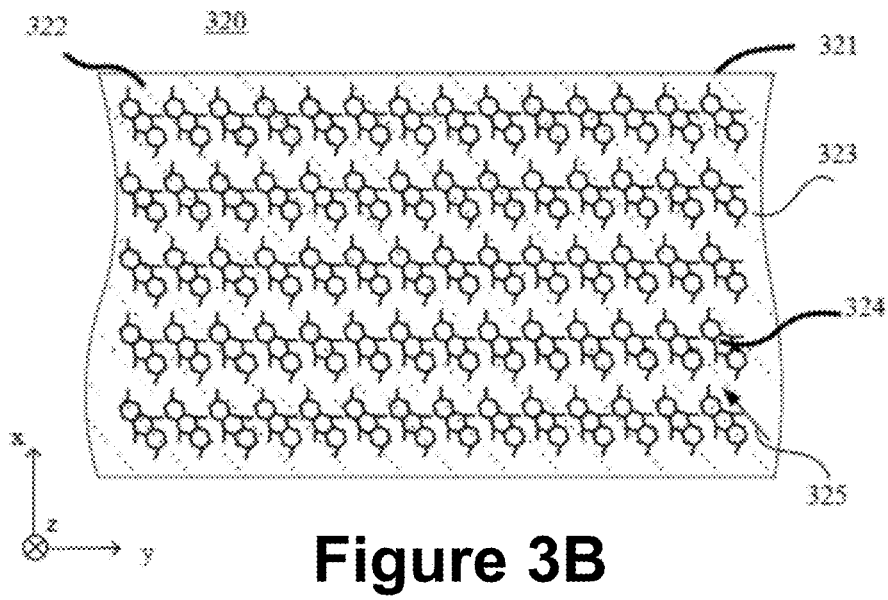
FIG. 3B schematically illustrates a top view of an optical device in accordance with some embodiments.

FIGS. 3A and 3B schematically illustrate top views (e.g., x-y sectional views) of optical devices, according to various embodiments. In the embodiments shown in FIGS. 3A and 3B, the crystal molecules in the respective solid crystal films may be substantially uniformly aligned in a predetermined pattern (e.g., in a predetermined direction). The optical devices shown in FIGS. 3A and 3B may include structures or elements that are the same as or similar to those included in the optical devices shown in FIGS. 1A-2D (e.g., optical device 100 shown in FIG. 1A). Descriptions of the same or similar structures or elements included in the embodiments shown in FIGS. 3A and 3B can refer to the above descriptions (including, e.g., those rendered in connection with the embodiment shown in FIG. 1A). The specific alignment of the molecules in the top views of FIG. 3A and FIG. 3B are for illustrative purposes.

As shown in FIG. 3A, an optical device 300 may include a substrate 301, an alignment structure 302 disposed at (e.g., on) the substrate 301, and a solid crystal film 303 disposed at (e.g., on) the alignment structure 302. The solid crystal film 303 may be in contact with the alignment structure 302. Crystal molecules 304 included in the solid crystal film 303 may be at least partially aligned by the alignment structure 302. The crystal molecules 304 included in the solid crystal film 303 may lie flat on the alignment structure 302, and may follow an orientation or an alignment pattern (e.g., direction 305) (denoted by an arrow as shown in FIG. 3A) within a plane (e.g., an x-y plane) perpendicular to a thickness direction (e.g., a z-axis) of the solid crystal film 303. For example, the crystal molecules 304 may be aligned along an x-axis direction in FIG. 3A. In other words, the orientations of the axes of the molecules may be aligned in the alignment direction 305. In some embodiments, the crystal molecules 304 may be aligned along a y-axis direction. In some embodiments, the crystal molecules 304 may be aligned in a suitable direction within an x-y plane. In some embodiments, the optical device 300 having the top view shown in FIG. 3A may have a corresponding cross-sectional view shown in FIG. 2A.

As shown in FIG. 3B, an optical device 320 may include a substrate 321, an alignment structure 322 disposed at (e.g., on) the substrate 321, and a solid crystal film 323 disposed at (e.g., on) the alignment structure 322. Crystal molecules 324 included in the solid crystal film 323 may lie flat on the alignment structure 322, and may follow an orientation or an alignment pattern (e.g., direction 325) (denoted by an arrow as shown in FIG. 3B) within a plane (e.g., the x-y plane) perpendicular to a thickness direction (e.g., a z-axis) of the solid crystal film 323. In other words, the orientations of the axes of the molecules may be aligned in the alignment direction 325. The alignment direction 325 may form an angle relative to the x or y axis. Any suitable angle may be configured. For example, in some embodiments, the crystal molecules 324 may be aligned in a direction having an angle of about 45° with respect to the x-axis direction.

Figure 4A:
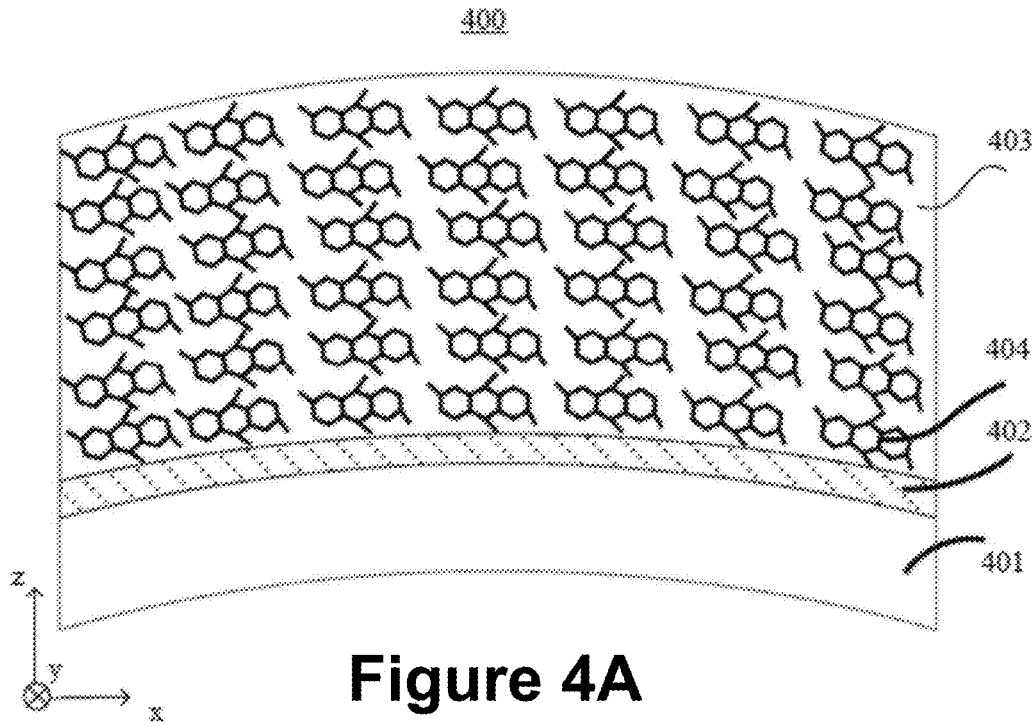
FIG. 4A schematically illustrates a cross-sectional view of an optical device in accordance with some embodiments.
Figure 4B:
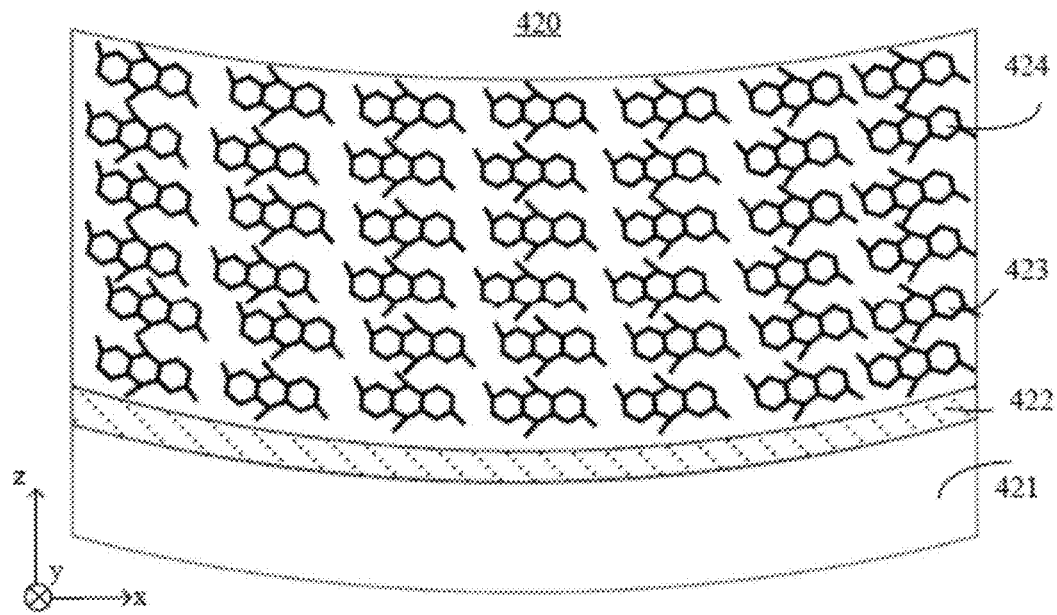
FIG. 4B schematically illustrates a cross-sectional view of an optical device in accordance with some embodiments.
Figure 4C:
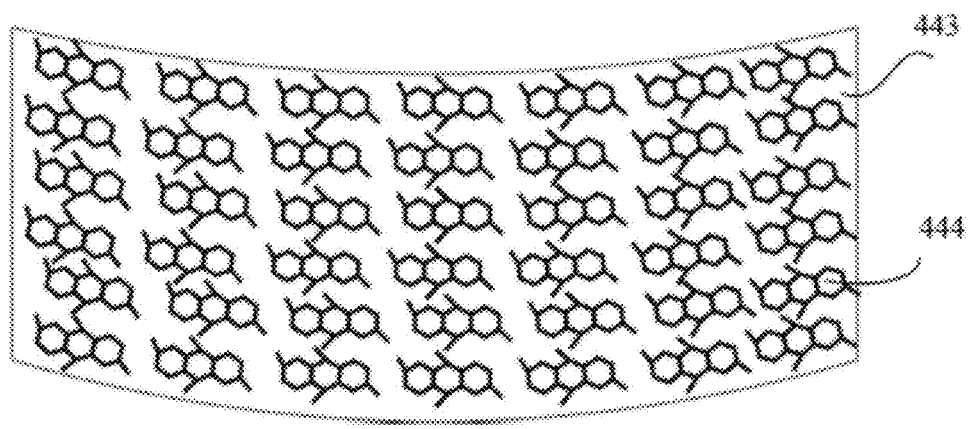
FIG. 4C schematically illustrates a cross-sectional view of an optical device in accordance with some embodiments.
Figure 4C:
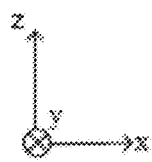

FIGS. 4A-4C schematically illustrate x-z sectional views of optical devices, according to various embodiment. The optical devices shown in FIGS. 4A-4C may include curved substrates and curved solid crystal films, and may function as curved optical waveguides. The optical devices shown in FIGS. 4A-4C may include structures or elements that are the same as or similar to those included in the optical device shown in FIGS. 1A-3B (e.g., the optical device 100 shown in FIG. 1A). Descriptions of the same or similar structures or elements included in the embodiments shown in FIGS. 4A-4C can refer to the above descriptions (including, e.g., those rendered in connection with the embodiment shown in FIG. 1A).

As shown in FIG. 4A, an optical device 400 may include a substrate 401, an alignment structure 402 disposed at (e.g., on) the substrate 401, and a solid crystal film 403 disposed at (e.g., on) the alignment structure 402. The solid crystal film 403 may be in contact with the alignment structure 402. Crystal molecules 404 included in the solid crystal film 403 may be at least partially aligned by the alignment structure 402. The crystal molecules 404 included in the solid crystal film 403 may have substantially uniform orientations or alignments within the solid crystal film 403. The substrate 401 may include one or more curved surfaces. For example, one or both of an upper surface and a lower surface of the substrate 401 may have a curved shape. In some embodiments, the alignment structure 402 disposed at the substrate 401 may include one or more curved surfaces. For example, at least a lower surface of the alignment structure 402 that faces the upper surface of the substrate 401 may have a curved shape. The curved shape of the alignment structure 402 may match with the curved shape of the upper surface of the substrate 401. In some embodiments, as shown in FIG. 4A, both the substrate 401 and the alignment structure 402 may have a convex shape. In some embodiments, the alignment structure 402 may directly formed (e.g., etched) on a curved surface of the substrate 401.

The solid crystal film 403 may have a first surface and an opposing second surface. One or both of the first surface and second surface of the solid crystal film 403 may be non-rectilinear. In some embodiments, both the first surface and second surface of the solid crystal film 403 may be non-rectilinear. For example, both the first surface (e.g., an upper surface) and the second surface (e.g., a lower surface) of the solid crystal film 403 may have a curved shape that matches with the curved shape of the alignment structure 402. For example, as shown in FIG. 4A, the solid crystal film 403 may have a convex shape that may match with the convex shape of the substrate 402. The solid crystal film 403 may guide an electromagnetic radiation (e.g., a light) to propagate internally within the solid crystal film 403 via TIR. In some embodiments, the solid crystal film 403 may be grown on a top surface of the substrate 401. The growing process may include first disposing the alignment structure 402 on the top surface of the substrate 401, and then epitaxially depositing (e.g., growing) the crystal molecules 404 on the alignment structure 402. In some embodiments, a front surface (or top surface) and an opposing back surface (or bottom surface) of the solid crystal film 403 may not be parallel to one another.

As shown in FIG. 4B, an optical device 420 may include a substrate 421 having a concave shape, an alignment structure 422 having a concave shape, and a solid crystal film 423 having a concave shape. Although in the embodiment shown in FIG. 4B, the alignment structure 422 is shown as a separate element disposed on the substrate 421, in some embodiments, the alignment structure 422 may be directly formed (e.g., etched) on a curved surface of the substrate 421. The alignment structure 422 may be configured to at least partially align the solid crystal molecules 423 in a predetermined alignment pattern.

As shown in FIG. 4C, an optical device 440 may include a curved (e.g., concave) solid crystal film 443. In some embodiments, the curved solid crystal film 443 may be obtained by shaping a meniscus during a crystal growth process. Crystal molecules 444 may be aligned during the growth process based on the shape of the meniscus. In such some embodiments, an alignment structure and a substrate may be omitted during the fabrication process of the solid crystal film 443.

Figure 5A:
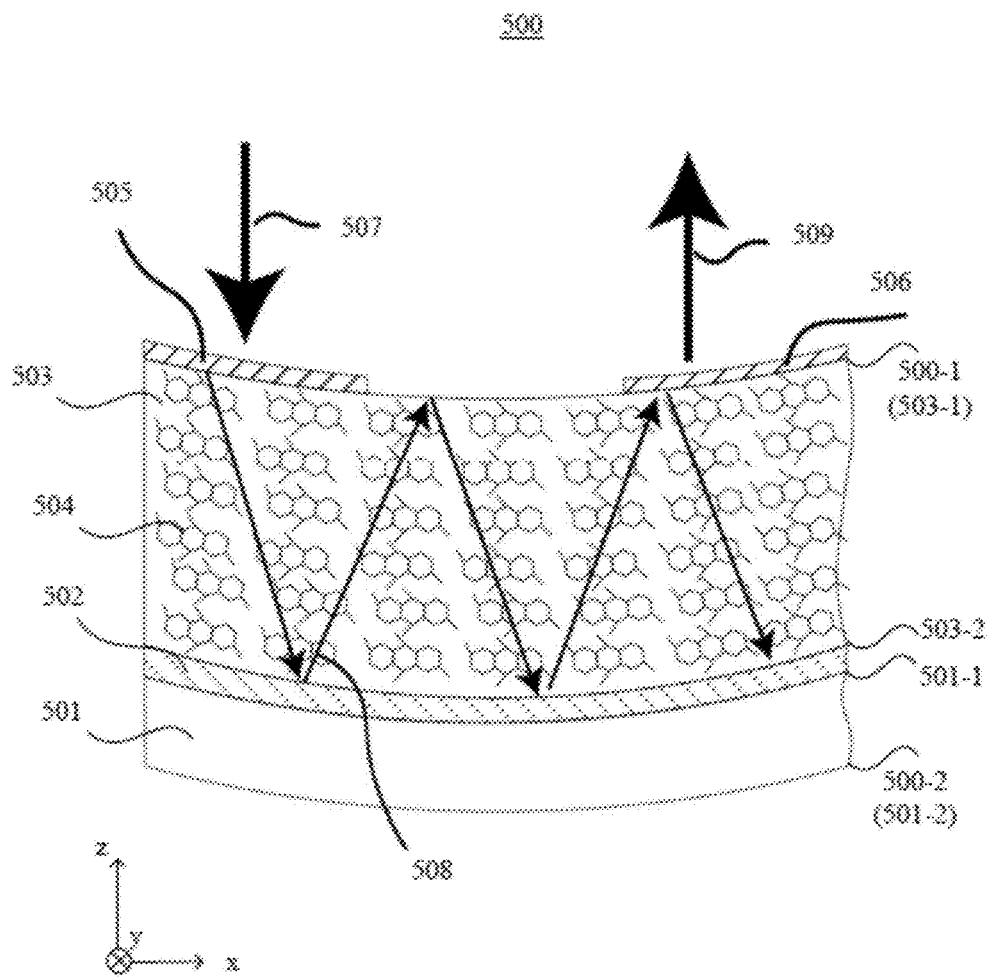
FIG. 5A schematically illustrates a cross-sectional view of an optical waveguide with in-coupling and out-coupling elements in accordance with some embodiments.

FIG. 5A schematically illustrates an x-z sectional view of an optical waveguide 500 with in-coupling and out-coupling elements in accordance with some embodiments. The optical waveguide 500 shown in FIG. 5A may include structures or elements that are the same as or similar to those included in the optical device shown in FIGS. 1A-4C. Descriptions of the same or similar structures or elements included in the embodiment shown in FIG. 5A can refer to the above descriptions (including, e.g., those rendered in connection with the embodiment shown in FIG. 1A).

As shown in FIG. 5A, the optical waveguide 500 may be a curved optical waveguide. The optical waveguide 500 may include a substrate 501, an alignment structure 502 disposed at (e.g., on) the substrate 501, and a solid crystal film (or a solid crystal) 503 disposed at (e.g., on) the alignment structure 502. The solid crystal film 503 may be in contact with the alignment structure 502. Crystal molecules 504 in the solid crystal film 503 may be at least partially aligned by the alignment structure 502. For example, the crystal molecules 504 included in the solid crystal film 503 may be substantially uniformly aligned within the solid crystal film 503. In other words, the alignment structure 502 may include or define an alignment structure pattern for aligning at least a portion of the crystal molecules 504 disposed on the alignment structure 502. In some embodiments, the crystal molecules 504 may be aligned in a uniform predetermined alignment pattern, as shown in FIG. 5A. In some embodiments, the thickness of the optical waveguide 500 may be about 300 μm to about 1 mm, and the at least one lateral dimension of the optical waveguide 500 may be about 30 mm to about 100 mm.

The optical waveguide 500 may be configured to receive an input light 507 at one or more in-coupling elements 505 disposed at a side (e.g., an upper side) of the optical waveguide 500. The wavelength of the input light 507 may be in the visible spectrum or the near IR spectrum. The one or more in-coupling elements 505 may be configured to couple the input light 507 into the optical waveguide 500 as an in-coupled light 508. The optical waveguide 500 may guide the in-coupled light 508 to one or more out-coupling elements 506 disposed at the optical waveguide 500 via total internal reflection ("TIR"). The in-coupled light 508 may also be referred to as a totally internally reflected light 508. One or more out-coupling elements 506 may be disposed at a side (e.g., an upper side) away from the one or more in-coupling elements 505. The one or more out-coupling elements 506 may be configured to couple the in-coupled light 508 out of the optical waveguide 500 as an output light 509, which may be delivered to an eye of a user or other optical elements. In the embodiment shown in FIG. 5A, the one or more in-coupling elements 505 and the one or more out-coupling elements 506 are disposed at the same side or surface of the optical waveguide 500. In some embodiments, the one or more in-coupling elements 505 and the one or more out-coupling elements 506 may be disposed at different sides or surfaces of the optical waveguide 500.

The optical waveguide 500 may include a first surface (or side) 500-1 and an opposing second surface (or side) 500-2. The solid crystal film 503 may include a first surface (or side) 503-1 and an opposing second surface (or side) 503-2. The substrate 501 may include a first surface (or side) 501-1 and an opposing second surface (or side) 501-2. In some embodiments, the first surface (or side) 500-1 of the optical waveguide 500 may also be the first surface (side) 503-1 of the solid crystal film 503, and the second surface (or side) 500-2 of the optical waveguide 500 may also be the second surface (side) 501-2 of the substrate 501.

In some embodiments, the in-coupling element 505 may be disposed at the first surface 500-1 or the second surface 500-2 of the optical waveguide 500. For example, in some embodiments, the in-coupling element 505 may be an integral part of the first surface 500-1 or the second surface 500-2. In some embodiments, the in-coupling element 505 may be a separate element attached, bonded, affixed, or otherwise coupled to the first surface 500-1 or the second surface 500-2.

In some embodiments, the out-coupling element 506 may be disposed at the first surface 500-1 or the second surface 500-2 of the optical waveguide 500. For example, in some embodiments, the out-coupling element 506 may be an integral part of the first surface 500-1 or the second surface 500-2. In some embodiments, the out-coupling element 506 may be a separate element attached, bonded, affixed, or otherwise coupled to the first surface 500-1 or the second surface 500-2. In some embodiments, the in-coupling element 505 and the out-coupling element 506 may be disposed at the same or different surfaces of the optical waveguide 500. In some embodiments, although not shown in FIG. 5A, at least one of the in-coupling element 505 or the out-coupling element 506 may disposed at the second surface 500-2 of the optical waveguide 500.

In some embodiments, the in-coupling element 505 and the out-coupling element 506 may be disposed at a same surface or different surfaces of the solid crystal film 503. For example, although FIG. 5A shows that the in-coupling element 505 and the out-coupling element 506 are disposed on the first surface 503-1 of the solid crystal film 503, at least one of the in-coupling element 505 and the out-coupling element 506 may be disposed at the second surface 503-2 of the solid crystal film 503. In some embodiments, the in-coupling element 505 and the out-coupling element 506 may be disposed at the same or different surfaces of the substrate 501. For example, at least one of the in-coupling element 505 or the out-coupling element 506 may be disposed at the first surface 501-1 of the substrate 501 or the second surface 501-2 of the substrate 501. In some embodiments, when one of the in-coupling element 505 or the out-coupling element 506 is disposed at the second surface (side) 501-2 of the substrate 501, the other one of the in-coupling element 505 or the out-coupling element 506 may be disposed at the first surface (side) 503-1 of the solid crystal film 503. The in-coupling element 505 and the out-coupling element 506 may be disposed at various combinations of locations, including the first surface 503-1 of the solid crystal film 503, the second surface 503-2 of the solid crystal film 503, a first surface of the alignment structure 502 facing the solid crystal film 503, a second surface of the alignment structure 502 facing the substrate 501, the first surface 501-1 of the substrate, or the second surface 501-2 of the substrate 501.

In some embodiments, the in-coupling element 505 may include a one-dimensional ("1D") or a two-dimensional ("2D") diffraction grating, which may be referred to as an in-coupling diffraction grating. The 1D diffraction grating may diffract a light beam along one axis, and the 2D diffraction grating may diffract a light beam along two axes. In some embodiments, a 2D diffraction grating may be produced by orthogonally overlaying two 1D grating structures. A pitch of the in-coupling diffraction grating may be configured, such that the in-coupling diffraction grating may be configured to couple the input light 507 into the optical waveguide 500 at a suitable angle via diffraction, and the in-coupled light 508 may propagate within the optical waveguide 500 via TIR. In some embodiments, the out-coupling element 506 may include a 1D or 2D diffraction grating, which may be referred to as an out-coupling diffraction grating. A pitch of the out-coupling diffraction grating may be configured, such that the out-coupling diffraction grating may couple the light 508 propagating inside the optical waveguide 500 through TIR out of the optical waveguide 500 via diffraction. In some embodiments, at least one of the in-coupling diffraction grating or out-coupling diffraction grating may be polarization dependent. For example, at least one of the in-coupling diffraction grating or out-coupling diffraction grating may selectively diffract a light having a first polarization, and transmit a light having a different polarization with negligible or no diffraction.

In some embodiments, at least one of the in-coupling diffraction grating or the out-coupling diffraction grating may include 1D or 2D periodic structures (e.g., ridges) configured (e.g., etched) in the substrate 501 or the solid crystal film 503. In some embodiments, the 1D or 2D periodic ridges may be configured (e.g., etched) in an upper portion of the substrate 501 shown in FIG. 5A. In some embodiments, the 1D or 2D periodic ridges may be configured (e.g., etched) in an upper portion and/or a lower portion of the solid crystal film 503 shown in FIG. 5A. In some embodiments, at least one of the in-coupling diffraction grating or the out-coupling diffraction grating may include 1D or 2D periodic ridges configured (e.g., etched) in a separate polymer or glass disposed at the optical waveguide 500. In some embodiments, at least one of the in-coupling diffraction grating or the out-coupling diffraction grating may be formed from volume holograms recorded in a photosensitive material.

Figure 5B:
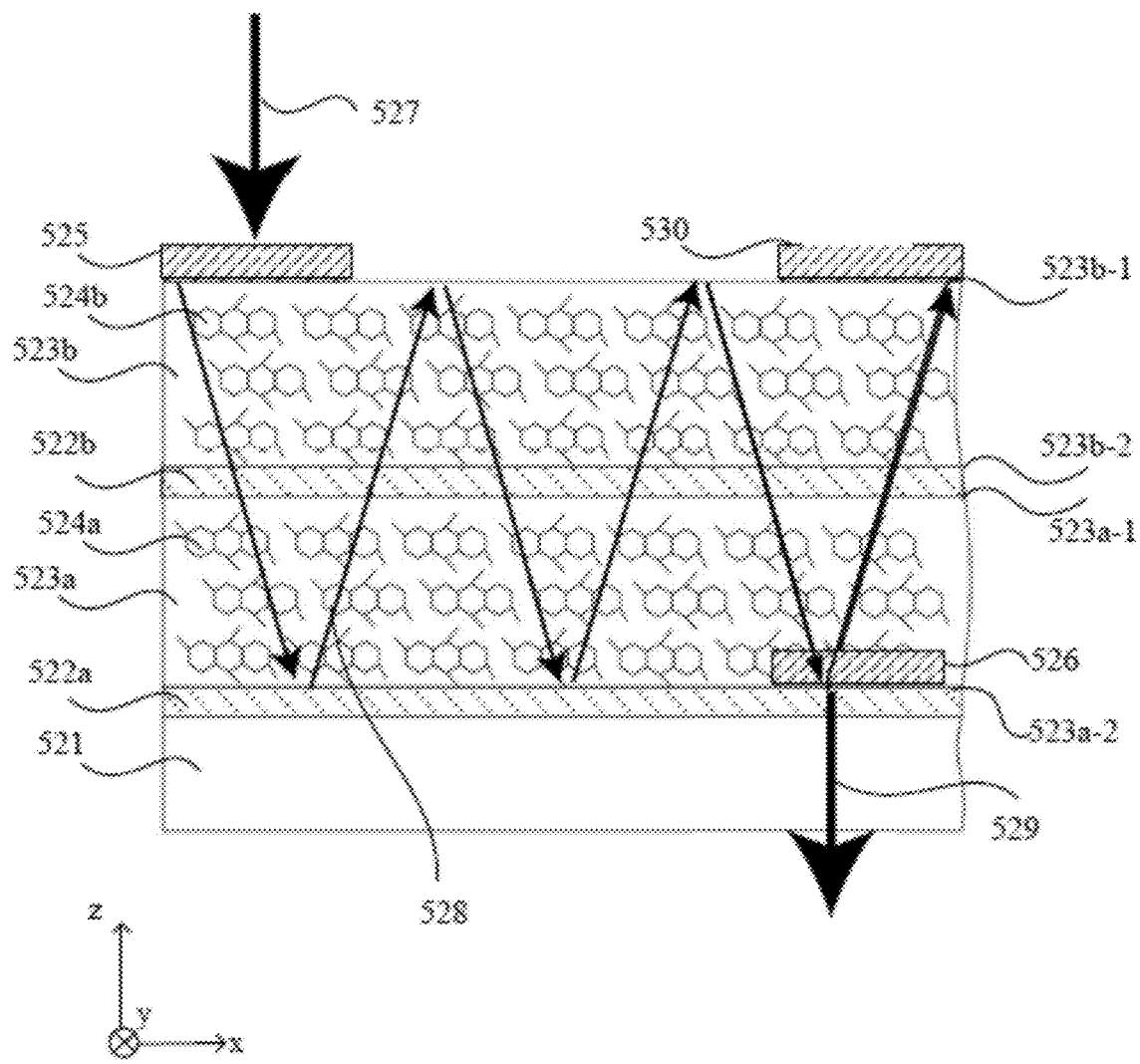
FIG. 5B schematically illustrates a cross-sectional view of an optical waveguide with in-coupling and out-coupling elements in accordance with some embodiments.

FIG. 5B schematically illustrates an x-z sectional view of an optical waveguide 520 with in-coupling and out-coupling elements in accordance with some embodiments. The optical waveguide 520 shown in FIG. 5B may include structures or elements that are the same as or similar to those included in the optical devices shown in FIGS. 1A-4C (e.g., the optical device 260 shown in FIG. 2D). The optical waveguide 520 may include structures or elements that are the same as or similar to those included in the optical waveguide 500 shown in FIG. 5A. Descriptions of the same or similar structures or elements included in the embodiment shown in FIG. 5B can refer to the above descriptions.

As shown in FIG. 5B, the optical waveguide 520 may be a flat optical waveguide. The optical device 520 may include a stack of multiple contiguous solid crystal films and multiple alignment structures alternately arranged. Crystal molecules included in a solid crystal film may be at least partially aligned by an alignment structure, on which the solid crystal film is disposed. For illustrative purposes, the optical device 520 shown in FIG. 5B may include a substrate 521, a first solid crystal film 523a and a second solid crystal film 523b, and a first alignment structure 522a and a second alignment structure 522b. The first alignment structure 522a may be disposed at (e.g., on) a surface (e.g., a top surface) of the substrate 521. The first solid crystal film 523a may be disposed at (e.g., on) a surface (e.g., a top surface) of the first alignment structure 522a. The second alignment structure 522b may be disposed at (e.g., on) a surface (e.g., a top surface) of the first solid crystal film 523a. The second solid crystal film 523b may be disposed at (e.g., on) a surface (e.g., a top surface) of the second alignment structure 522b.

The first alignment structure 522a may include or define a first alignment structure pattern for at least partially aligning at least a portion of crystal molecules 524a included in the first solid crystal film 523a. The crystal molecules 524a may be aligned in a first predetermined alignment pattern, which may or may not be the same as the first alignment structure pattern. The second alignment structure 522b may include or define a second alignment structure pattern for at least partially aligning at least a portion of crystal molecules 524b included in the second solid crystal film 523b. The crystal molecules 524b may be aligned in a second predetermined alignment pattern, which may or may not be the same as the second alignment structure pattern. The first alignment structure pattern may or may not be the same as the second alignment structure pattern. In other words, the first alignment structure may or may not be the same as the second alignment structure.

The crystal molecules 524a included in the first solid crystal film 523a may or may not have the same properties as the crystal molecules 524b included in the second solid crystal film 523b. In some embodiments, crystal molecules 524a may be the same type of crystal molecules as the crystal molecules 524b. In some embodiments, the crystal molecules 524a may be aligned in the first predetermined alignment pattern, and the crystal molecules 524b may be aligned in the second predetermined alignment pattern. The first predetermined alignment pattern may or may not be the same as the second predetermined alignment pattern. In the embodiment shown in FIG. 5B, crystal molecules 524a included in the first solid crystal film 523a, and crystal molecules 524b included in the second solid crystal film 523b are spatially uniformly aligned in a same predetermined alignment pattern (e.g., a same predetermined direction such as the x-axis direction shown in FIG. 5B).

The optical waveguide 520 may include one or more in-coupling elements 525 configured to couple an input light 527 into the optical waveguide 520. The in-coupled light 527 may propagate as a light 528 within the optical waveguide 520 via TIR. The optical waveguide 520 may include one or more out-coupling elements 526 configured to couple the light 528 out of the optical waveguide 520 as an output light 529. The in-coupling element 525 and the out-coupling element 526 may be disposed at various combinations of locations in the optical waveguide 520. For example, as shown in FIG. 5B, the in-coupling element 525 and the out-coupling element 526 may be disposed at a first side (surface) 523b-1 of the second solid crystal film 523b and a second side (surface) 523a-2 of the first solid crystal film 523a, respectively. In some embodiments, the in-coupling element 525 and the out-coupling element 526 may each include one or more 1D or 2D diffraction gratings.

In some embodiments, the optical waveguide 520 may also include a directing element 530 configured to redirect the light 528 propagating inside the optical waveguide 520 via TIR to the out-coupling element 526. The directing element 530 may be disposed at a suitable location (or portion) of the optical waveguide 520. For example, the directing element 530 may be disposed at a first side (surface) 523b-1 of the second solid crystal film 523b, and may face the out-coupling element 526 disposed at a second side (surface) 523a-2 of the first solid crystal film 523a. In some embodiments, the directing element 530 and the out-coupling element 526 may have a similar structure. The directing element 530 may include, for example, a 1D or 2D diffraction gratings. The pitch of the diffraction grating may be configured, such that the directing element 530 may direct the light 528 propagating inside the optical waveguide 520 via TIR toward the out-coupling element 526 at a predetermined incident angle. In some embodiments, the directing element 530 may be referred to as a folding grating. In some embodiments, multiple functions, e.g., redirecting, folding, and/or expanding a pupil of the optical waveguide 520 may be combined in a single diffraction grating, e.g., an out-coupling diffraction grating. In some embodiments, the above-mentioned gratings may be divided in a plurality of sections (or subgratings) to provide other functions, such as for tiling a field of view ("FOV"), delivering single-color images of different colors, etc.

In some embodiments, the disclosed optical device having spatial uniform orientations of axes of the crystal molecules in the solid crystal film, such as the optical devices shown in FIGS. 2A-4C, may function as a phase retarder. Referring to FIG. 2B as an example, to effectively change the phase of a transmitted light, a linearly polarized light incident onto the optical device 220 may align its polarization axis substantially along the alignment direction 225 (e.g., the x-axis direction) of the crystal molecules 224. The optical device 220 functioning as a phase retarder may alternatively or additionally be effectively configured to function as a polarization management component in an optical device or an optical system. For example, when the phase retarder is configured to provide a half-wave birefringence for lights in a predetermined wavelength spectrum (e.g., visible spectrum), a linearly polarized input light having a first polarization direction may be converted into a linearly polarized output light having a second polarization direction perpendicular to the first polarization direction, or a circularly polarized input light may be converted into a circularly polarized output light having a reversed handedness. When the phase retarder is configured to provide a quarter-wave birefringence for lights in a predetermined wavelength spectrum (e.g., visible spectrum), a linearly polarized input light may be converted into a circularly polarized output light or vice versa.

Figure 6A:
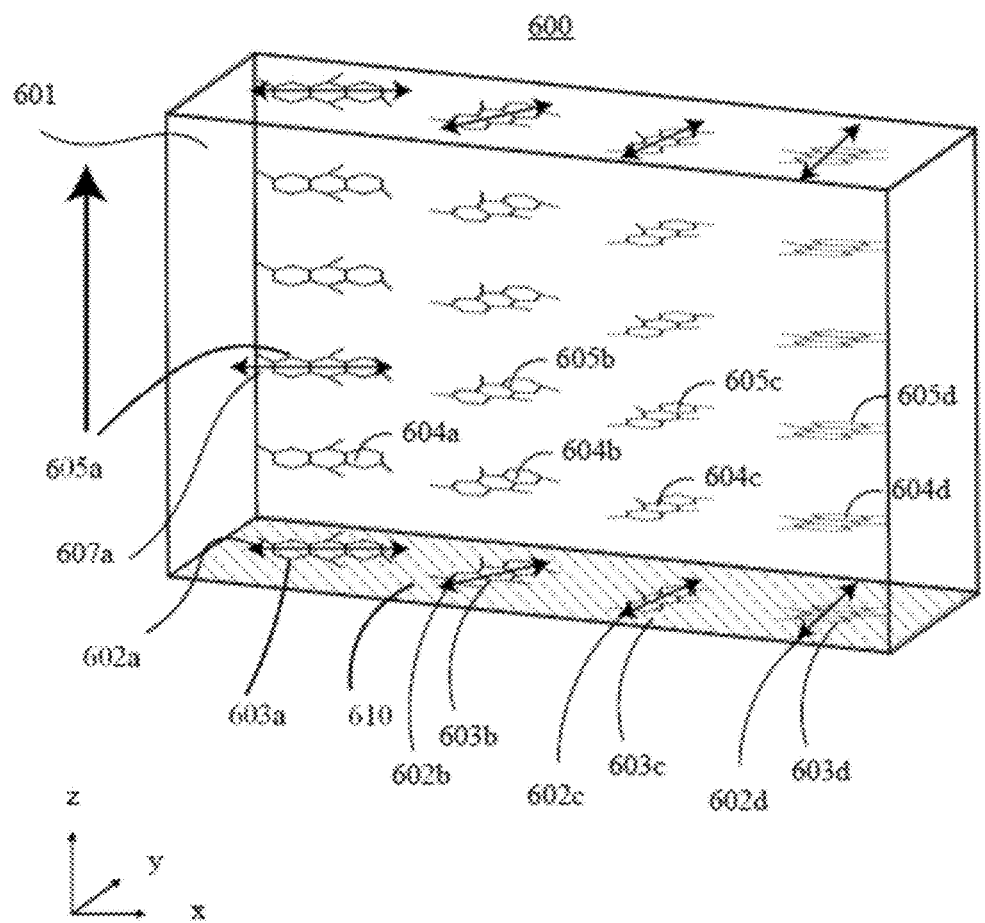
FIG. 6A schematically illustrates a three-dimensional ("3D") diagram of spatially varying orientations of axes of crystal molecules in a solid crystal film in accordance with some embodiments.
Figure 6B:
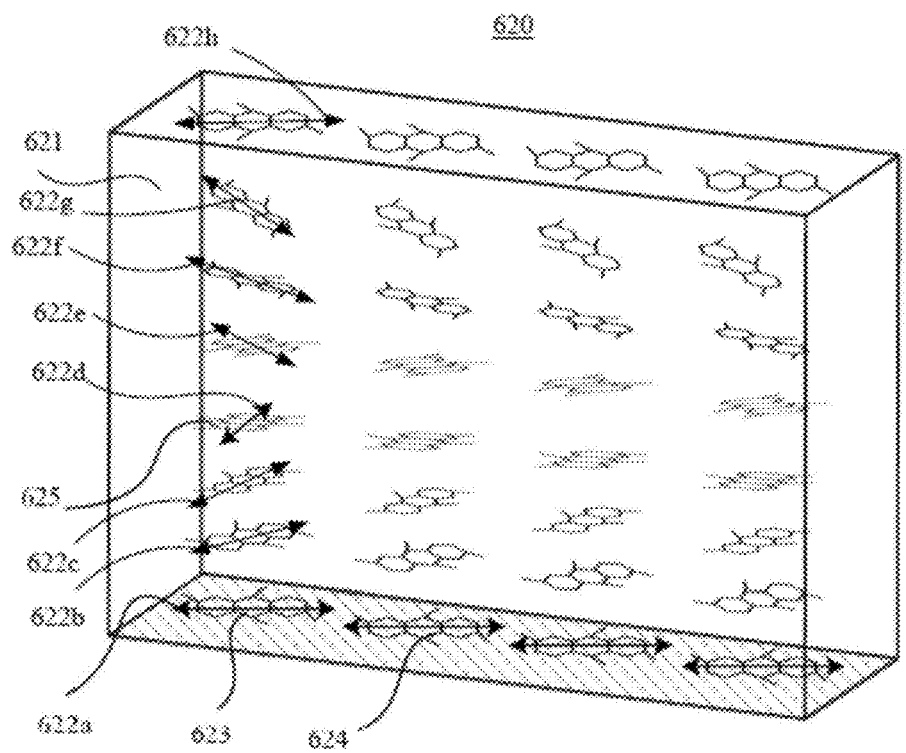
FIG. 6B schematically illustrates a 3D diagram of spatially varying orientations of axes of crystal molecules in a solid crystal film in accordance with some embodiments.
Figure 6C:
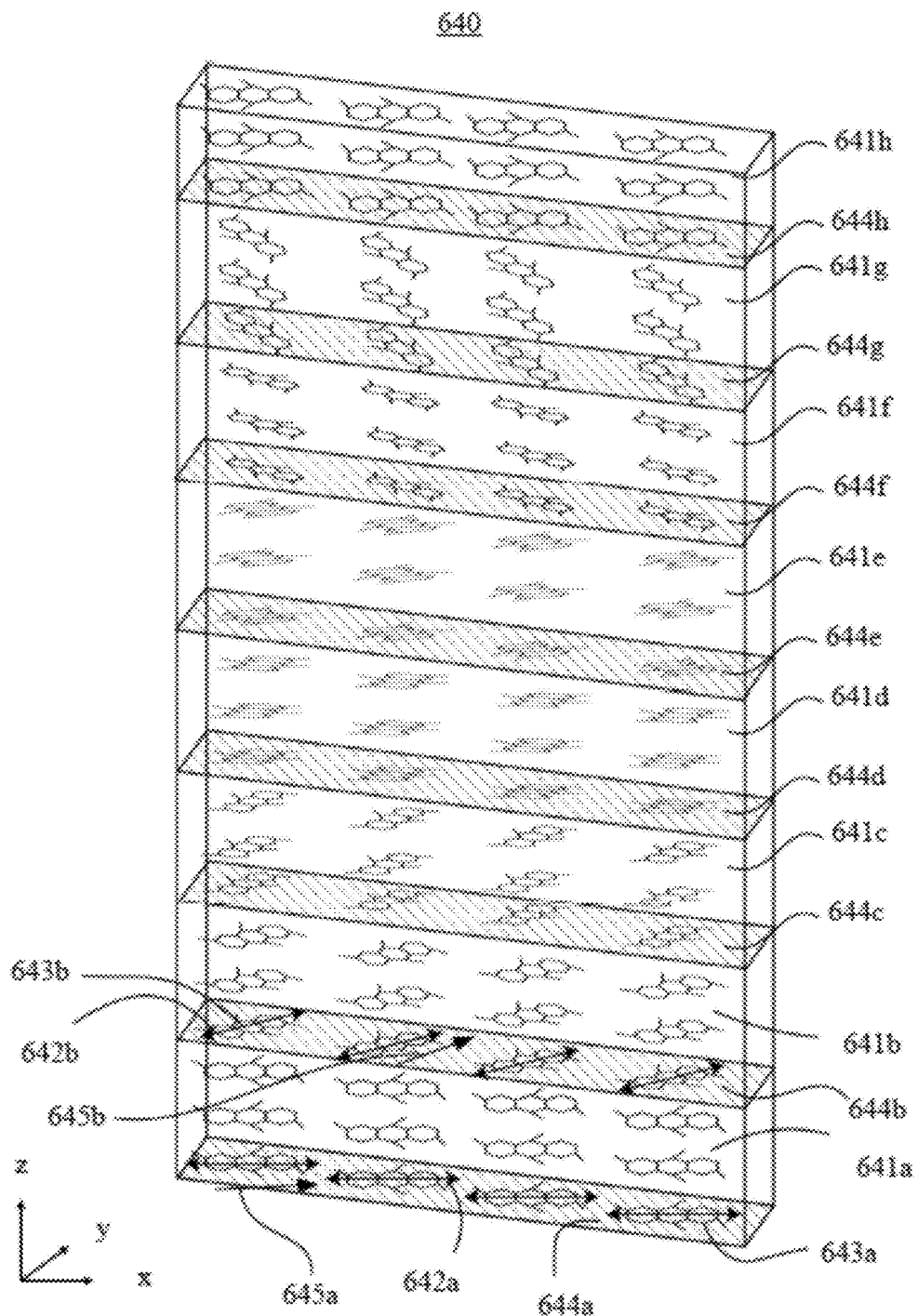
FIG. 6C schematically illustrates a 3D diagram of spatially varying orientations of axes of crystal molecules in a solid crystal film in accordance with some embodiments.

FIGS. 6A-6C illustrate 3D schematic views of spatially varying orientations of the axes of crystal molecules in respective solid crystal films, according to various embodiment. When the orientations of the axes of the crystal molecules vary spatially, the orientation of the axis of the solid crystal may also vary spatially within the solid crystal film. The solid crystal films and alignment structures shown in FIGS. 6A-6C may have structures or components that may be the same as or similar to those described above (e.g., those described above in connection with the optical device 100 shown in FIG. 1A). Descriptions of the solid crystal films and alignment structures included in the embodiments shown in FIGS. 6A-6C can refer to the above descriptions (including, e.g., those rendered in connection with the embodiment shown in FIG. 1A).

As shown in FIG. 6A, an optical device 600 may include a solid crystal 601 (which may be in a form of a layer, a film, or a plate). For discussion purposes, the solid crystal 601 may be referred to as a solid crystal film 601. The solid crystal film 601 may be disposed on an alignment structure 610. In some embodiments, the solid crystal film 601 may be formed on the alignment structure 610 by a suitable crystal growth process. For illustrative purposes, the alignment structure 610 is shown as a thin layer. The alignment structure 610 may define or include an alignment structure pattern for at least partially aligning crystal molecules of the solid crystal film 601.

The solid crystal film 601 may include a plurality of crystal molecules. The crystal molecules be disposed on the alignment structure 610 in layers. For example, the embodiment shown in FIG. 6A shows 6 layers of crystal molecules. For illustrative purposes, only the first layer of crystal molecules 603a-603d (also referred to as a first plurality of crystal molecules 603), the second layer of crystal molecules 604a-604d (also referred to as a second plurality of crystal molecules 604), and the third layer of crystal molecules 605a-605d (also referred to as a third plurality of crystal molecules 605) are labeled.

The first plurality of crystal molecules 603 may be in contact with the alignment structure 610. The second plurality of crystal molecules 604 and the third plurality of crystal molecules 605 may be disposed or stacked over or on the first plurality of crystal molecules 603, and may not be in contact with the alignment structure 610. The alignment structure 610 may at least partially align the crystal molecules included in the solid crystal film 601. For example, the first plurality of crystal molecules 603 that are in contact with the alignment structure 610 may be aligned in the alignment structure pattern provided by the alignment structure 610.

As shown in FIG. 6A, the first plurality of crystal molecules 603a-603d may not be aligned in the same direction or orientation. In other words, the orientations of the axes of the crystal molecules are spatially varying. Reference numbers 602a-602d indicates an axis of a crystal molecule (along which the refractive index may be the largest). As shown in FIG. 6A, the axes 602a-602d of the first plurality of crystal molecules 603a-603d may not be aligned in the same direction or orientation. Crystal molecules in each layer in the z-axis direction (e.g., the first plurality of crystal molecules 603) may have spatially varying orientations and/or alignments in a plane (e.g., the x-y plane) parallel to a surface (e.g., top surface) of the alignment structures (e.g., crystal molecules 604). This pattern may be at least partially defined by the alignment structure pattern of the alignment structure 610. As a result, an orientation of an axis of the solid crystal may also be spatially varying within the solid crystal 601.

In each layer of crystal molecules in the x-y plane, an orientation of an axis of a crystal molecule may be rotated by a predetermined rotation angle relative to an orientation of an axis of a neighboring crystal molecule. For example, each of the first plurality of crystal molecules 603a-603d may have its corresponding axis rotated by a predetermined rotation angle relative to a neighboring crystal molecule in the same layer (i.e., in the same x-y plane). For example, the orientation of the axis 602b of the crystal molecule 603b may be rotated by a first predetermined rotation angle relative to the orientation of the axis 602a of the crystal molecule 603a. The orientation of the axis 602c of the crystal molecule 603c may be rotated by a second predetermined rotation angle relative to the orientation of the axis 602b of the crystal molecule 603b. The orientation of the axis 602d of the crystal molecule 603d may be rotated by a third predetermined rotation angle relative to the orientation of the axis 602c of the crystal molecule 603c. The first predetermined rotation angle, the second predetermined rotation angle, and the third predetermined rotation angle may or may not be the same. In some embodiments, the first predetermined rotation angle, the second predetermined rotation angle, and the third predetermined rotation angle may be the same. In some embodiments, at least two of the first predetermined rotation angle, the second predetermined rotation angle, and the third predetermined rotation angle may be different.

The first plurality of crystal molecules 603 that are in contact with the alignment structure 610 may be aligned in the alignment structure pattern of the alignment structure 610. The second and the third plurality of crystal molecules 604 and 605 (and other crystal molecules in other layers) may or may not follow the same alignment pattern as the first plurality of crystal molecules 603. In the embodiment shown in FIG. 6A, the second and the third plurality of crystal molecules 604 and 605 (and other crystal molecules in other layers) follow the same alignment pattern as the first plurality of crystal molecules 603. That is, orientations of the axes of the crystal molecules disposed or stacked over the first plurality of crystal molecules 603 follow the same orientations of the axes of the first plurality of crystal molecules 603. In other words, in each layer of crystal molecules disposed over the first plurality of crystal molecules 603, the orientation of the axis of each crystal molecule is the same as the orientation of the axis of a corresponding crystal molecule located at a lower layer. For example, the orientation of the axis of the crystal molecule 604b is the same as the orientation of the axis of the crystal molecule 603b, and the orientation of the axis of the crystal molecule 605b is the same as the orientation of the axis of the crystal molecule 604b, and so on. As shown in FIG. 6A, the orientation of an axis 607a of the crystal molecule 605a in the third layer is the same as the orientation of the axis 602a of the crystal molecule 603a in the first layer. The crystal molecule 603a and the crystal molecule 605a are in the same column in the z-axis direction.

As shown in FIG. 6B, an optical device 620 may include a solid crystal film 621, and an alignment structure 624. The solid crystal film 621 may be disposed on the alignment structure 624. In some embodiments, the solid crystal film 621 may be a cholesteric crystal film. In some embodiments, the solid crystal film 621 may include chiral crystal molecules or crystal molecules doped with chiral dopants, and the optical device 620 may exhibit chirality, i.e., handedness.

The solid crystal film 621 may include a first plurality of crystal molecules 623 and a second plurality of (i.e., the remaining) crystal molecules 625 stacked or disposed over the first plurality of crystal molecules 623. The first plurality of crystal molecules 623 may be in contact with an alignment structure 624 and remaining (i.e., the second plurality of) crystal molecules 625 may not be in contact with the alignment structure 624. Crystal molecules 623 in contact with the alignment structure 624 may be spatially uniformly aligned within a surface (e.g., a top surface within the x-y plane) of the alignment structure 624. The second plurality of crystal molecules 625 may be stacked in a twisted helical structure in a direction (e.g., the z-axis direction) perpendicular to the surface of the alignment structure 624. In FIG. 6B, the reference number 622a-622h indicates the orientation of an axis of a crystal molecule in each layer. In the embodiment shown in FIG. 6B, in each layer, the orientations of the axes of the crystal molecules are the same (e.g., spatially uniform in the layer). As shown in FIG. 6B, orientations of axes 622a of the crystal molecules 623 in contact with the alignment structure 624 may be spatially uniform. That is, the axes 622a of the first plurality of crystal molecules 623 are aligned in the same direction or orientation. The orientations of the axes of the second plurality of crystal molecules 625 disposed over the first plurality of crystal molecules 623 may have a helical twist in the direction (e.g., the z-axis direction) perpendicular to the surface of the alignment structure 624. As shown in FIG. 6B, the orientation of each axis 622b-622h may be rotated by a predetermined rotation angle relative to an orientation of axis in a lower layer. The predetermined rotation angles between two neighboring layers in the z-axis direction may be the same or may be different (or at least two rotation angles may be different). In some embodiments, the handedness of the twisted helical structure or the helical twist (e.g., the rotation directions of the axes of the crystal molecules) may be determined by the types of chiral crystal molecules or the chiral dopants. A pitch of the twisted helical structure or the helical twist may be determined by a helical twist power of chiral crystal molecules or a helical twist power and a concentration of the chiral dopants.

For illustrative purposes, FIG. 6B shows one cholesteric crystal film 621. In some embodiments, a plurality of cholesteric crystal films may be stacked, one over another, or side by side, where neighboring cholesteric crystal films may be separated from each other by an alignment structure disposed between two neighboring cholesteric crystal films. Orientations of axes of the crystal molecules in the respective cholesteric crystal films may have a helical twist in the direction (e.g., the z-axis direction) perpendicular to the surface of the alignment structures along which a portion of the crystal molecules are aligned. In some embodiments, the helical twists in neighboring cholesteric crystal films may have opposite handedness. In some embodiments, the helical twists in neighboring cholesteric crystal films may have the same handedness.

FIG. 6C illustrates a 3D schematic view of an optical device 640 including a stack of multiple solid crystal films 641a-641h separated by respective alignment structures 644a-644h. As shown in FIG. 6C, orientations of axes of crystal molecules in the solid crystal films 641a-641h may be rotated (e.g., gradually rotated) from one solid crystal film to another along a direction (e.g., the z-axis direction) perpendicular to a surface of an alignment structure (or a surface of a substrate where the optical device 640 including a stack may be disposed at). In some embodiments, the optical device 640 may function as an optical rotator.

In a first solid crystal film 641a, axes 642a of crystal molecules 643a in contact with a first alignment structure 644a may be substantially oriented in a first direction or orientation 645a within the x-y plane, and axes of other crystal molecules disposed over the crystal molecules 643a in the first solid crystal film 641a may substantially follow the first orientation 645a. That is, the orientations of the axes of the crystal molecules in the first solid crystal film 641a may be spatially uniform. As a result, the orientation of the axis of the solid crystal 641a may be spatially non-varying (e.g., constant). In a second solid crystal film 641b, axes 642b of crystal molecules 643b in contact with a second alignment structure 644b may be substantially oriented in a second direction or orientation 645b within the x-y plane, and axes of other crystal molecules disposed over the crystal molecules 643b within the second solid crystal film 641b may substantially follow the same second orientation 645b. The second direction or orientation 645b may be the same as or different from the first direction or orientation 645a. For example, in some embodiments, the second direction or orientation 645b may be rotated by an angle of about 15° with respect to the first direction or orientation 645a. Orientations of axes of crystal molecules in the remaining solid crystal films 641c-641h may be determined by the alignment structures 644a-644h, respectively. The orientations of axes of crystal molecules in the remaining solid crystal films 641c-641h may be rotated (e.g., gradually rotated) from one solid crystal film to another along the direction (e.g., the z-axis direction) perpendicular to a surface of the first alignment structure 644a (or a surface of a substrate where the stack may be disposed). Each of the alignment structures 644a-644h in the stack may reset or realign the orientations of the crystal molecules disposed thereon in the respective solid crystal films 641a-641h, which may effectively rotate the axes of the solid crystal films 641a-641h along the z-axis direction.

A PBP optical element may have a spatially varying optic axis in a plane perpendicular to a direction of propagation of a light beam. Such a plane may also be referred to as a transverse plane or as an in-plane. LCs have been used to fabricate PBP optical elements by spatially varying LC directors in the transverse plane. Optical characteristics of the PBP optical elements based on LCs may depend on the refractive index and/or birefringence of LCs. For example, an angular and diffraction bandwidth of a polarization selective grating may increase as the birefringence of LCs increases. Currently available LCs may have a refractive index up to about 1.97 and a birefringence up to about 0.3. PBP optical elements based on materials having a higher refractive index and a larger birefringence are highly desirable to reduce the size and weight and to enhance the optical characteristics. The present disclosure provides PBP optical elements based on the disclosed solid crystal having a spatially varying orientation of axis in the transverse plane. That is, the orientation of the axis of the solid crystal may be configured vary spatially in the transverse plane, thereby forming a solid crystal based PBP optical element. In some embodiments, the PBP optical element fabricated based on the solid crystal may have a thickness of about 500 nm to about 5 μm.

The orientation of the axis of the solid crystal in the transverse plane may be referred to as an in-plane orientation of the axis of the solid crystal. In some embodiments, the spatially varying in-plane orientation of the axis of the solid crystal may be realized by configuring spatially varying in-plane orientations of the axes of the crystal molecules included in the solid crystal. In some embodiments, the in-plane orientations of the axes of the crystal molecules included in the solid crystal may be configured by aligning the crystal molecules in a predetermined in-plane alignment pattern. In some embodiments, the predetermined in-plane alignment pattern of the crystal molecules may be provided by an alignment structure on which the solid crystal is configured (e.g., grown), as described above.

Figure 7A:
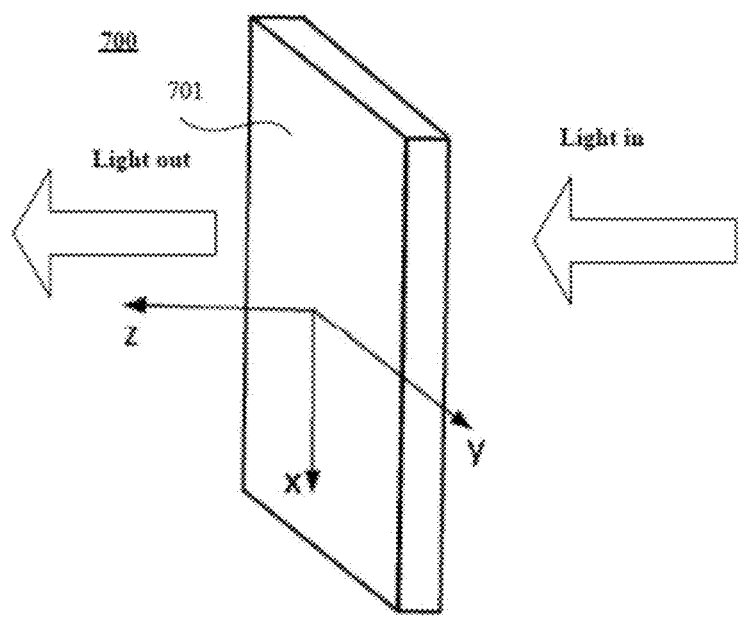
FIG. 7A schematically illustrates a diagram of a transmissive-type Pancharatnam Berry Phase ("PBP") optical device in accordance with some embodiments.

FIG. 7A illustrates a diagram of a transmissive-type PBP optical element or device 700, which may include a disclosed solid crystal or solid crystal film 701 in accordance with some embodiments. The solid crystal (or solid crystal film) 701 may be an embodiment of any of the solid crystals described above and herein. In some embodiments, the PBP optical device 700 may also include one or more alignment structures, which are not shown in FIG. 7A. In some embodiments, the PBP optical device 700 may include one or more substrates, which are not shown in FIG. 7A. According to the in-plane alignment pattern of the crystal molecules (or in-plane orientations of axes of the crystal molecules) in the solid crystal film 701, the PBP optical device 700 may operate as a transmissive-type PBP optical device to provide one or more optical functions, such as functioning as a prism, a lens, a beam refractor, a lens array, a prism array, or a combination thereof.

Figure 7B:
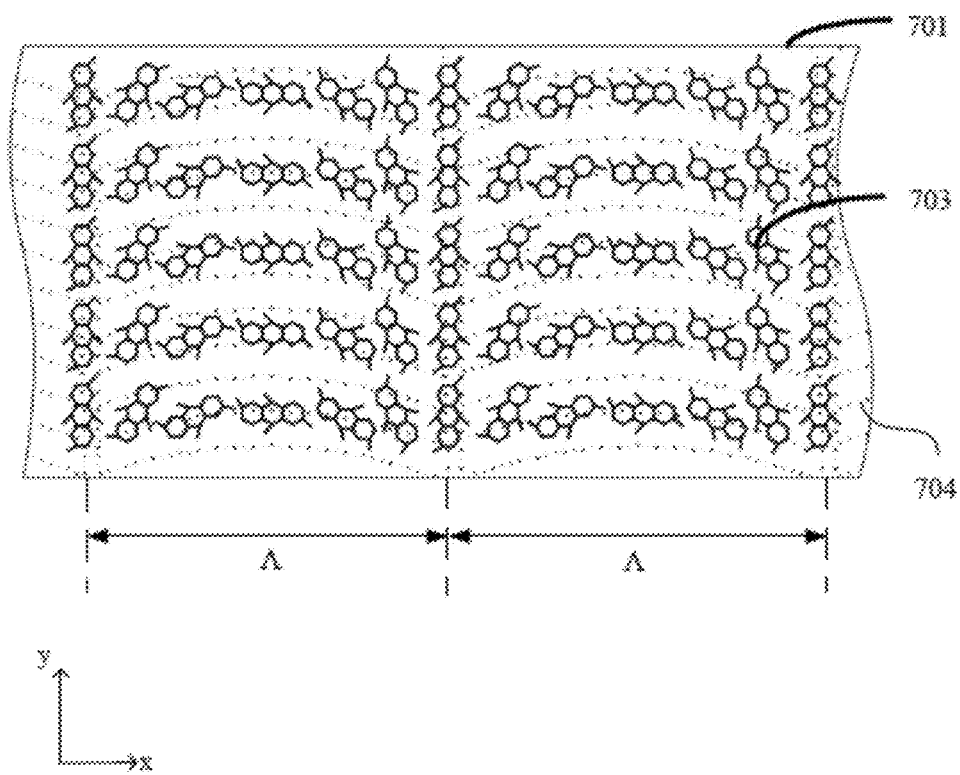
FIG. 7B schematically illustrates a cross-sectional view of a portion of orientations of axes of crystal molecules when the PBP optical device shown in FIG. 7A functions as a PBP grating in accordance with some embodiments.

FIG. 7B schematically illustrates an x-y sectional view of a portion of orientations 720 of crystal molecules 703 when the PBP optical device 700 in FIG. 7A functions as a PBP grating 700 in accordance with some embodiments. As shown in FIGS. 7A and 7B, the PBP grating 700 may include an alignment structure 704 configured to at least partially align crystal molecules 703 in the solid crystal film 701. For example, the crystal molecules 703 that are in contact with the alignment structure 704 may be aligned by the alignment structure 704, and the remaining crystal molecules 703 in the solid crystal film 701 may follow the alignment of neighboring crystal molecules 703 that haven been aligned. The crystal molecules 703 in the solid crystal film 701 may be periodically and linearly aligned along one or both in-plane directions, such that orientations of the axes of the crystal molecules 703 in the solid crystal film 701 may vary periodically and linearly along one or both in-plane directions.

For illustrative purposes, FIG. 7B shows that the orientations of the axes of the crystal molecules 703 may vary periodically and linearly along one in-plane direction (e.g., an x-axis direction in FIG. 7B). The in-plane orientations of the axes of the crystal molecules 703 may vary in a linearly repetitive pattern along the x-axis direction with a uniform pitch A. The pitch A of the PBP grating 700 may be half of the distance along the x-axis between repeated portions of the pattern. The pitch A may determine, in part, the optical properties of PBP grating 700. For example, a circularly polarized light incident along the optical axis (e.g., z-axis) of the PBP grating 700 may have a grating output including primary, conjugate, and leakage light corresponding to diffraction orders m=+1, −1, and 0, respectively. The pitch A may determine the diffraction angles of the diffracted light in the different diffraction orders. In some embodiments, the diffraction angle for a given wavelength of light may increase as the pitch A decreases.

In some embodiments, the PBP grating 700 may be a passive PBP grating having (or that can operate in) two optical states, a positive state and a negative state. The optical state of the PBP grating 700 may depend on the handedness of a circularly polarized input light and the handedness of the rotation of the crystal molecules in PBP grating 700. FIG. 7C and FIG. 7D schematically illustrate diagrams of a positive state and a negative state of the PBP grating 700, respectively in accordance with some embodiments. In some embodiments, as shown in FIG. 7C, the PBP grating 700 may operate in a positive state in response to a right-handed circularly polarized ("RHCP") input light 705, and may diffract the RHCP input light 705 at a specific wavelength to a positive angle (e.g., +θ). As shown in FIG. 7D, the PBP grating 700 may operate in a negative state in response to a left-handed circularly polarized ("LHCP") light input 707, and may diffract the LHCP input light 707 at a specific wavelength to a negative angle (e.g., −θ). In addition, the PBP grating 700 may reverse the handedness of a circularly polarized light transmitted through the PBP grating 700 in addition to diffracting the light. For example, in the configuration shown in FIG. 7C, the RHCP input light 705 may be converted to an LHCP output light 706 after passing through the PBP grating 700. In the configuration shown in FIG. 7D, the LHCP input light 707 may be converted to an RHCP output light 708 light after passing through the PBP grating 700. In some embodiments, the PBP grating 700 may operate in a positive state in response to an LHCP input light, and operate in a negative state in response to an RHCP input light. For an unpolarized input light at a specific wavelength, the PBP grating 700 may diffract an RHCP component and an LHCP component of the unpolarized input light a positive angle (e.g., +θ) and a negative angle (e.g., −θ), respectively. Thus, the PBP grating 700 may function as a circular polarization beam splitter.

In some embodiments, the PBP grating 700 may be switchable between the positive state and negative state when the handedness of a circularly polarized input light is switched by another optical device. For example, an active polarization switch may be coupled to the PBP grating 700. The PBP grating 700 may receive a light output from the active polarization switch. The active polarization switch may control (e.g., switch) the handedness of a circularly polarized light incident onto the PBP grating 700, thereby controlling the optical state of the PBP grating 700. The active polarization switch may maintain the handedness of a circularly polarized light or reverse the handedness of a circularly polarized light, in accordance with an operating state (e.g., a non-switching state or a switching state) of the active polarization switch. The switching speed of the active polarization switch may determine the switching speed of the PBP grating 700. In some embodiments, the active polarization switch may include a switchable half-wave plate ("SHWP").

In some embodiments, the PBP grating 700 may be operated in a neutral state when the solid crystal (or solid crystal film) 701 in the PBP grating 700 is configured to be at the amorphous state. In the neutral state, the PBP grating 700 may not diffract an input light, and may or may not affect the polarization of the light transmitted through the PBP grating 700. In some embodiments, the PBP grating 700 may be switchable between the positive/negative state and the neutral state, through switching the solid crystal 701 between the aligned crystal state and the amorphous state. In some embodiments, the solid crystal 701 may be switchable between the aligned crystal state and the amorphous state through various methods, for example, through a polarization based switching, a thermal based switching, or an external field based switching, etc. In some embodiments, the PBP grating 700 may function as an active PBP grating that is switchable between the positive/negative state and the neutral state.

Figure 8A:
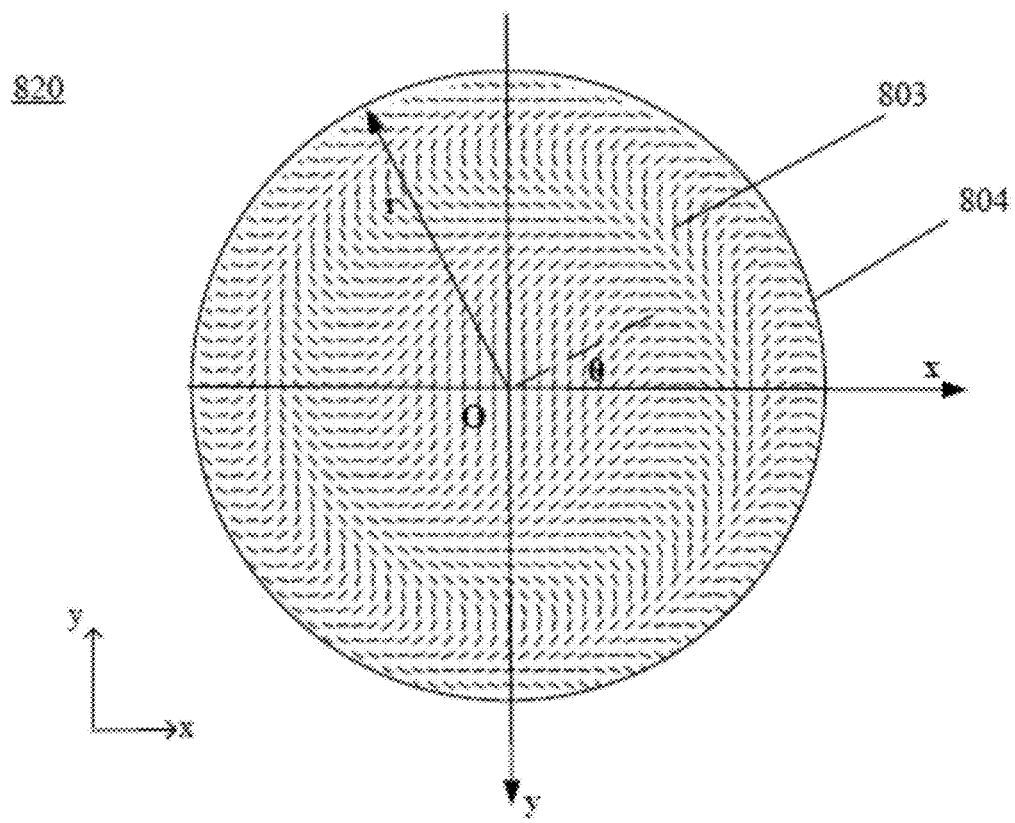
FIG. 8A schematically illustrates a cross-sectional view of orientations of axes of crystal molecules when the PBP optical device shown in FIG. 7A functions as a PBP lens in accordance with some embodiments.
Figure 8B:
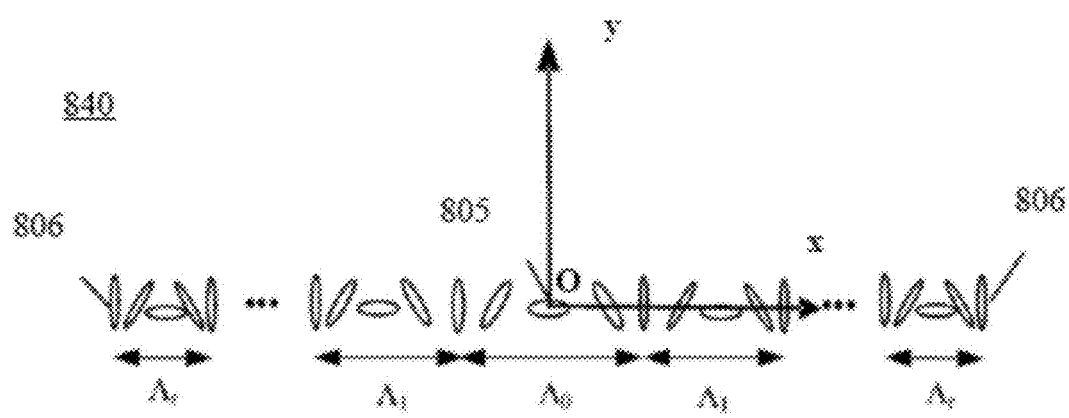
FIG. 8B illustrates a section of a portion of orientations of crystal molecules taken along an x-axis in PBP lens shown in FIG. 8A in accordance with some embodiments.

FIG. 8A schematically illustrates an x-y sectional view of a portion of orientations 820 of crystal molecules 803 when the PBP optical device 700 shown in FIG. 7A functions as a PBP lens 700 in accordance with some embodiments. FIG. 8B illustrates a section of a portion of orientations 820 of crystal molecules 803 taken along an x-axis in PBP lens 700 shown in FIG. 8A in accordance with some embodiments. To simplify the illustration, each crystal molecule 803 included in the solid crystal film 701 is represented by a small rod in FIG. 8A, where each rod is depicted as having a longitudinal direction (or a length direction) and a lateral direction (or a width direction). That is, each molecule 803 is depicted as having a longitudinal direction (or a length direction) and a lateral direction (or a width direction), and an axis of the molecule 803 is presumed to be in the longitudinal direction of the molecule 803, along the presumed axis of the highest refractive index for the molecule 803. The longitudinal direction (or the length direction) and the lateral direction (or the width direction) of the small rod may correspond to the longitudinal direction (or the length direction) and the lateral direction (or the width direction) of the molecule 803, respectively.

As shown in FIG. 7A and FIG. 8A, the PBP lens 700 may include an alignment structure 804 configured to at least partially align the crystal molecules 803 included in the solid crystal film 701. For example, the crystal molecules 803 that are in contact with the alignment structure 804 may be aligned by the alignment structure 804, and the remaining crystal molecules 803 (e.g., those disposed over the crystal molecules that are in contact with the alignment structure 804) included in the solid crystal film 701 may follow the alignment of neighboring crystal molecules 803 that haven been aligned. Orientations of the axes of the crystal molecules 803 included in the solid crystal film 701 may vary periodically along an in-plane radial direction (e.g., a radius direction).

The PBP lens 700 may generate a lens profile based on the in-plane orientations of the axes of the crystal molecules 803, in which the phase difference may be T=2θ, where θ is the angle between the orientation of the axis of the crystal molecule 803 and the x-axis direction. Referring to FIG. 8A and FIG. 8B, the orientations of the axes of the crystal molecules 803 may vary continuously from a center (O) 805 to an edge 806 of the PBP lens 700, with a variable pitch Λ. A pitch is defined as a distance between the crystal molecules 803, in which the orientation of the axis of the crystal molecule 803 is rotated by about 180° from an initial state. The pitch ($Λ_0$) at the center 805 is the largest, and the pitch ($Λ_r$) at the edge 806 is the smallest, i.e., $Λ_0 > Λ_1 > \ldots > Λ_r$.

In the x-y plane, for the PBP lens 700 with a lens radius (r) and a lens focus (+/−f), the θ may satisfy $$\theta = \frac{\pi r^2}{2 f \lambda},$$

where λ is the wavelength of an incident light. The continuous in-plane rotation of the axes of the crystal molecules 803 may accelerate by moving toward the edge 806 from the center (O) 805 of the PBP lens 700, such that the period of the obtained periodic structure (e.g., pitch) may decrease.

Figures 8C, 8D:
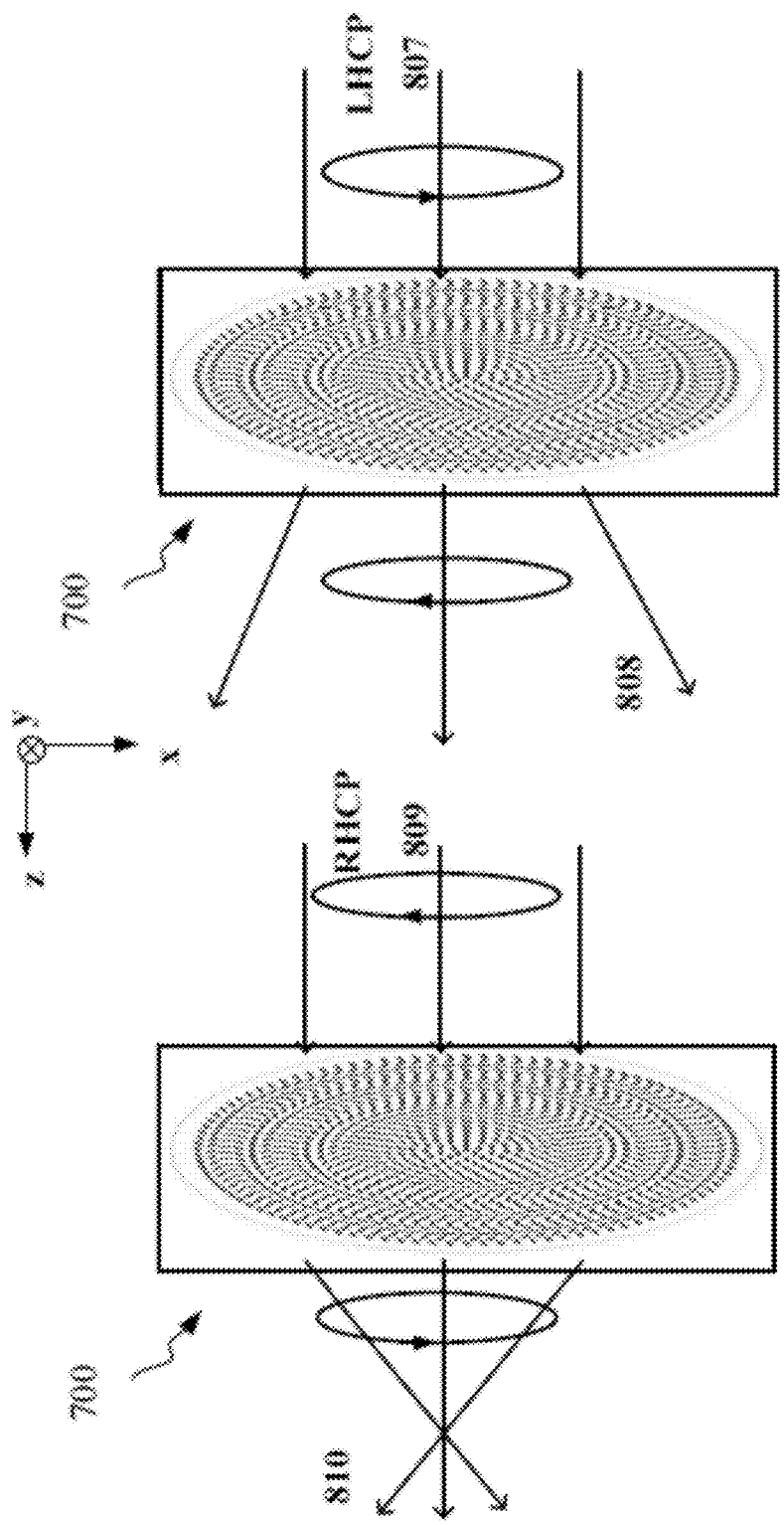
FIG. 8C schematically illustrates diagrams of a focusing state of the PBP lens shown in FIG. 8A in accordance with some embodiments.
FIG. 8D schematically illustrates diagrams of a defocusing state of the PBP lens shown in FIG. 8A in accordance with some embodiments.

The PBP lens 700 may be a passive PBP lens 700 having two optical states: a focusing state and a defocusing state. The optical state of the PBP lens 700 may depend on the handedness of a circularly polarized light incident onto the passive PBP lens 700 and the handedness of the rotation of the crystal molecules in PBP lens 700. FIG. 8C and FIG. 8D schematically illustrate diagrams of a focusing state and a defocusing state of the PBP lens 700, respectively in accordance with some embodiments. To simplify the illustration, the crystal molecules 803 included in the solid crystal film 701 are represented by small rods in FIG. 8C and FIG. 8D. In some embodiments, as shown in FIG. 8C, the PBP lens 700 may operate in a focusing state in response to an RHCP input light 809 and may have a positive focus of 'f'. As shown in FIG. 8D, the PBP lens 700 may operate in a defocusing state in response to an LHCP input light 807 and may have a negative focus of '−f.' In addition, the PBP lens 700 may reverse the handedness of a circularly polarized light transmitted through the PBP lens 700 in addition to focusing/defocusing the light. For example, in the configuration shown in FIG. 8C, the RHCP input light 809 may be converted to an LHCP output light 810 after passing through the PBP lens 700. In the configuration shown in FIG. 8D, the LHCP light input 807 may be converted to an RHCP output light 808 light after passing through the PBP lens 700. In some embodiments, the PBP lens 700 may operate in a defocusing state in response to an LHCP input light, and operate in a focusing state in response to an RHCP output light.

Similar to the passive PBP grating, the PBP lens 700 may be switchable between the focusing state and defocusing state when the handedness of a circularly polarized incident light is switched by another optical device. For example, an active polarization switch may be coupled to the PBP lens 700. The PBP lens 700 may receive a light output from the active polarization switch. The active polarization switch may control (e.g., switch) the handedness of a circularly polarized light incident onto the PBP lens 700, thereby controlling the optical state of the PBP lens 700. The active polarization switch may maintain the handedness of a circularly polarized light or reverse the handedness of a circularly polarized light after transmitted through the active polarization switch, in accordance with an operating state (e.g., a non-switching state or a switching state) of the active polarization switch. The switching speed of the active polarization switch may determine the switching speed of the PBP lens 700. In some embodiments, the active polarization switch may include an SHWP.

In some embodiments, the PBP lens 700 may be operated in a neutral state when the solid crystal (or solid crystal film) 701 in the PBP lens 700 is configured to be at the amorphous state. In the neutral state, the PBP lens 700 may not focus/defocus an input light, and may or may not affect the polarization of the light transmitted through the PBP lens 700. In some embodiments, the PBP lens 700 may be switchable between the focusing/defocusing state and the neutral state through switching the solid crystal 701 between the aligned crystal state and the amorphous state. In some embodiments, the solid crystal 701 may be switchable between the aligned crystal state and the amorphous state through various methods, for example, through a polarization based switching, a thermal based switching, or an external field based switching, etc. In some embodiments, the PBP lens 700 may function as an active PBP lens that is switchable between the focusing/defocusing state and the neutral state.

Figure 9A:
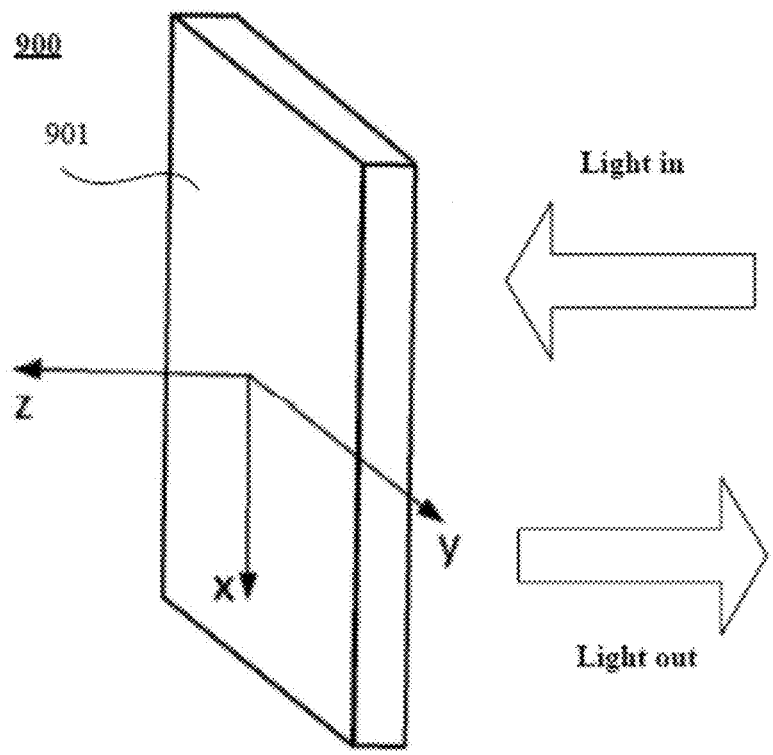
FIG. 9A schematically illustrates a diagram of a reflective-type PBP optical device in accordance with some embodiments.

In addition to the transmissive-type PBP optical elements or devices shown in FIGS. 7A-7D, and FIGS. 8A-8D, reflective-type PBP optical elements or devices may also be realized based on the disclosed solid crystals. FIG. 9A illustrates a diagram of a reflective-type PBP optical element or device 900, which may include a solid crystal or solid crystal film 901. The solid crystal film 901 may be some embodiments of any of the solid crystals or solid crystal films described above and herein. In some embodiments, the PBP optical device 900 may also include one or more alignment structures, which are not shown in FIG. 9A. In some embodiments, the PBP optical device 900 may also include one or more substrates, which are not shown in FIG. 9A. According to the in-plane alignment pattern of the crystal molecules (or in-plane orientations of axes of the crystal molecules) in the solid crystal film 901, the PBP optical device 900 may operate as a reflective-type PBP optical device having one or more optical functions.

Figure 9B:
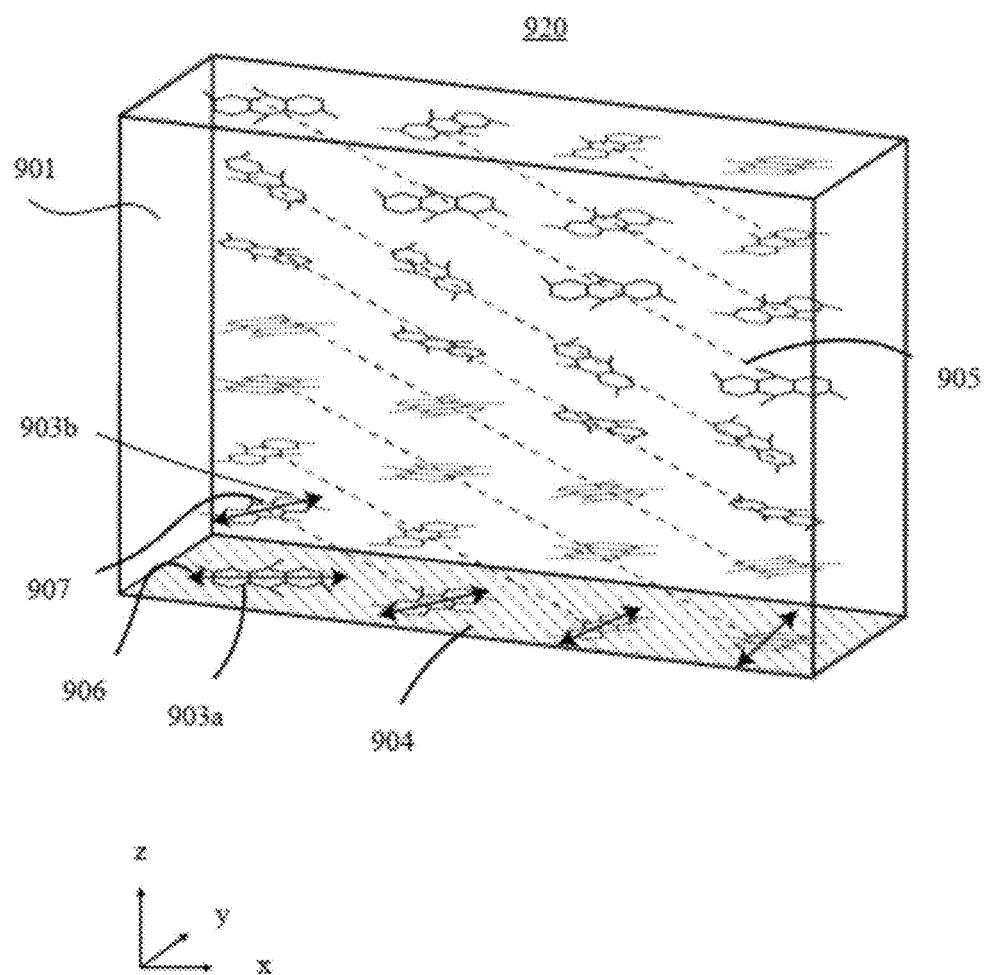
FIG. 9B schematically illustrates a 3D diagram of spatially varying orientations of axes of crystal molecules when the PBP optical device shown in FIG. 9A functions as a reflective polarization volume hologram ("PVH") grating in accordance with some embodiments.
Figure 9C:
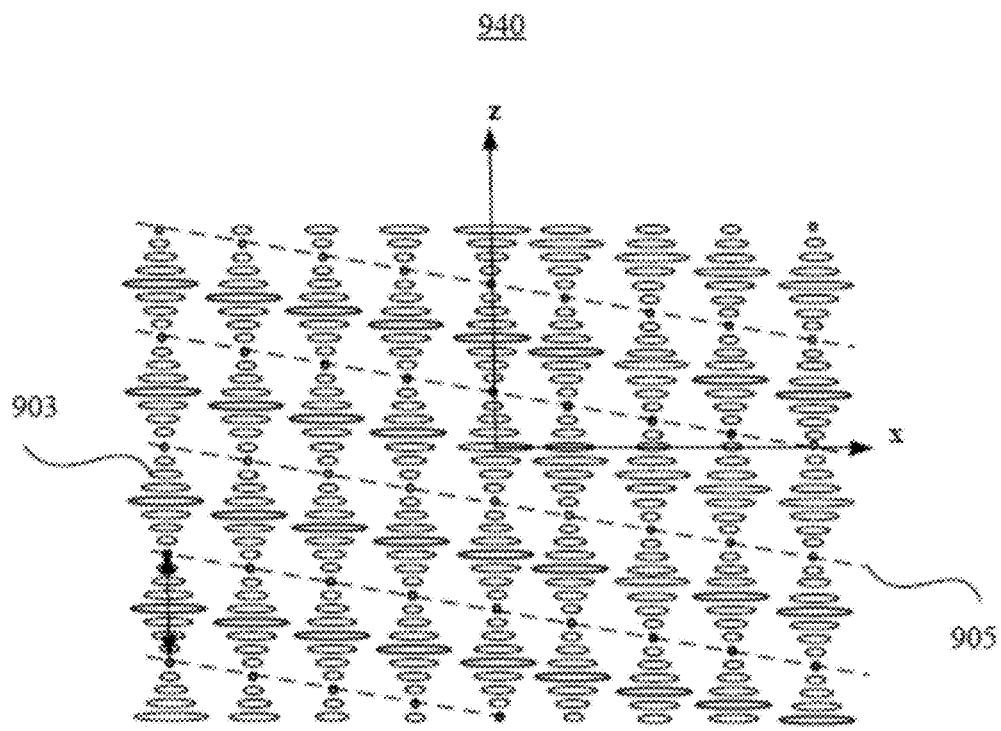
FIG. 9C schematically illustrates a cross-sectional view of orientations of axes of crystal molecules when the PBP optical device in FIG. 9A functions as a reflective PVH grating according to some embodiments.

FIG. 9B schematically illustrates a 3D diagram of a portion of orientations of axes of crystal molecules 903 (represented by 903a, 903b) included in a solid crystal film 901 of an optical device 920, and FIG. 9C schematically illustrates an x-z sectional view of orientations 940 of axes of crystal molecules 903 when the PBP optical device in FIG. 9A functions as a reflective PBP grating. For discussion purposes, each molecule 903 in FIG. 9B is depicted as having a longitudinal direction (or a length direction) and a lateral direction (or a width direction), an axis of the molecule 903 is presumed to be in the longitudinal direction of the molecule 903, along the presumed axis of a highest refractive index for the molecule 903. To simplify the illustration of the orientations of axes of crystal molecules 903 across the entire solid crystal film 901, each crystal molecules 903 included in the solid crystal film 901 are represented by small rods in FIG. 9C, where each rod is depicted as having a longitudinal direction (or a length direction) and a lateral direction (or a width direction). The longitudinal direction (or the length direction) and the lateral direction (or the width direction) of the small rod may correspond to the longitudinal direction (or the length direction) and the lateral direction (or the width direction) of the molecule 903, respectively.

The reflective PBP grating, due to its physical properties, may also be referred to as a reflective polarization volume grating ("PVG"). As shown in FIGS. 9B and 9C, in some embodiments, the solid crystal film 901 may be a cholesteric crystal film 901. In some embodiments, the solid crystal film 901 may include chiral crystal molecules or crystal molecules doped with chiral dopants, and the solid crystal may exhibit chirality, i.e., handedness. Axes 906 of crystal molecules 903a that are in contact with an alignment structure 904 may vary periodically and linearly along one of the in-plane directions (e.g., the x-axis in FIG. 9B). Axes 907 of the crystal molecule 903b stacked above the crystal molecules 903a in contact with the alignment structure 904 may twist in a helical fashion along a direction (e.g., the z-axis direction in FIG. 9B) perpendicular to a surface of the solid crystal film 901, e.g., a thickness direction of the solid crystal film 901. Such orientations of the axes of the crystal molecules 903 generated by the alignment structure 904 may result in periodic and slanted planes 905 of constant refractive index within the solid crystal film 901. In other words, the crystal molecules 903 from different layers of crystal molecules having the same orientations of the axes may form slanted periodic planes 905 of a constant refractive index within the solid crystal film 901.

Different from the transmissive PBP grating that diffracts an input light via modulating the phase of the input light, the reflective PVG 900 may diffract an input light through Bragg reflection (or slanted multiplayer reflection). The reflective PVG 900 may primarily diffract a circularly polarized light having a handedness that is the same as the handedness of the helical structure of the reflective PVG 900, and primarily transmit a light having other polarizations without changing the polarization of the transmitted light. For example, when a circularly polarized input light has a handedness that is opposite to the handedness of the helical structure of the reflective PVG 900, the input light may be primarily transmitted to the 0-th order, and the polarization of the transmitted light may be substantially retained (e.g., unaffected). The diffraction efficiency of the reflective PVG 900 may be a function of the thickness of the solid crystal film 901. For example, the diffraction efficiency of the reflective PVG 900 may increase monotonically with the thickness and then gradually saturate (e.g., remain substantially constant).

The optical elements or devices in accordance with embodiments may be implemented in a variety of fields. Such implementations are within the scope. In some embodiments, the disclosed optical elements or devices may be implemented as multifunctional optical components in near-eye displays ("NEDs") for augmented reality ("AR"), virtual reality ("VR"), and/or mixed reality ("MR"). For example, the disclosed optical elements or devices may be implemented as waveguide-based combiners, eye-tracking components, accommodation components for realizing multiple focuses or a variable focus, display resolution enhancement components, pupil steering elements, and polarization controlling components (e.g., a quarter-wave plate or a half-wave plate), etc., which may significantly reduce the weight and size, and enhance the optical performance of the NEDs.

Figure 10A:
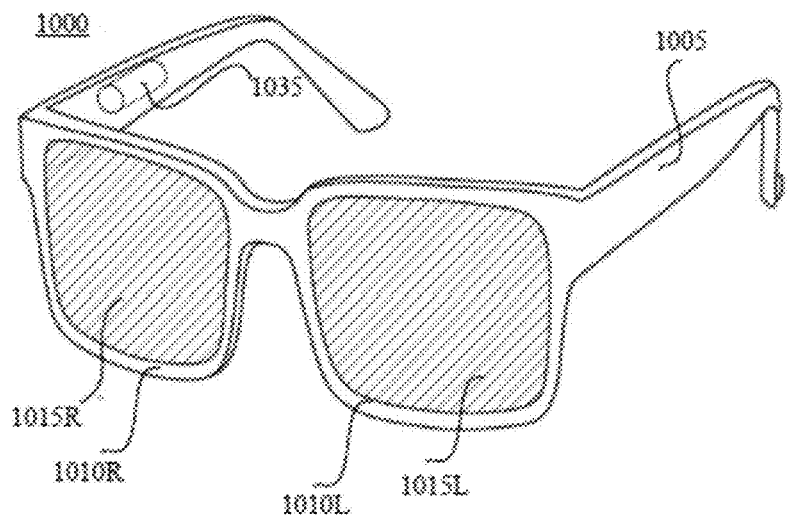
FIG. 10A schematically illustrates a diagram of a near-eye display ("NED") in accordance with some embodiments.
Figure 10B:
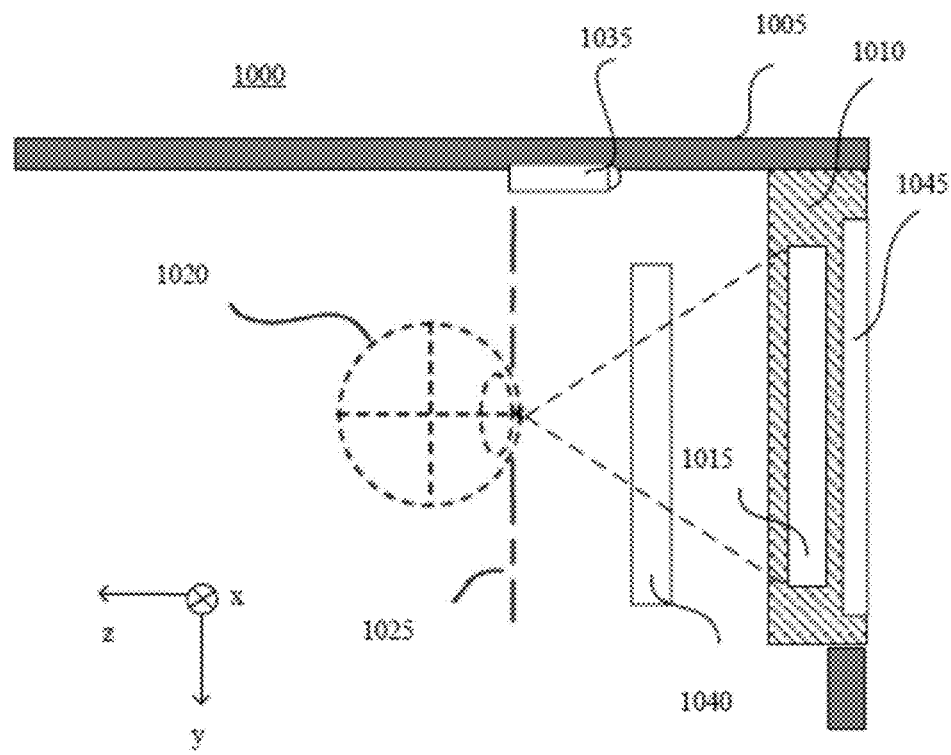
FIG. 10B schematically illustrates a top, cross-sectional view of a portion of the NED shown in FIG. 10A in accordance with some embodiments.

FIG. 10A illustrates a diagram of an NED 1000 according to some embodiments. FIG. 10B illustrates a cross-sectional top view of a half of the NED 1000 shown in FIG. 10A according to some embodiments. The NED 1000 may include one or more of the disclosed optical elements or devices, such as the waveguide, PBP lens, PBP grating, or reflective PVH grating. As shown in FIG. 10A, the NED 1000 may include a frame 1005 configured to be worn by a user. The NED 1000 may include a left-eye display system 1010L and a right-eye display system 1010R, which are mounted to the frame 1005. Each of the left-eye display system 1010L and the right-eye display system 1010R may include one or more image display components configured to project computer-generated virtual images onto a left display window 1015L and a right display window 1015R in the user's FOV. An example of the left-eye display system 1010L and the right-eye display system 1010R may include a waveguide display system. For illustrative purposes, FIG. 10A shows that the display system may include a light source assembly 1035 coupled to (e.g., mounted on) the frame 1005. The NED 1000 may function as a VR device, an AR device, an MR device, or a combination thereof. In some embodiments, when the NED 1000 functions as an AR and/or an MR device, the right display window 1015R and the left display window 1015L may be fully or at least partially transparent from the perspective of the user, thereby enabling the user to view a surrounding real world environment. In some embodiments, when the NED 1000 functions as a VR device, the right display window 1015R and the left display window 1015L may be opaque, such that the user may be immersed in the VR imagery provided by the NED 1000.

FIG. 10B is a cross-sectional top view of the NED 1000 shown in FIG. 10A in accordance with some embodiments. As shown in FIG. 10B, a display system 1010 (which may represent the right-eye display system 1010R or the left-eye display systems 1010L) may be a waveguide display system, which may include a waveguide display or a stacked waveguide display for one or more eye 1020 of the user. For example, the stacked waveguide display may be a polychromatic display (e.g., a red-green-blue ("RGB") display) including a stack of waveguide displays, the respective monochromatic light sources of which may be configured to emit lights of different colors. In some embodiments, the waveguide display system may include the light source assembly 1035 configured to generate an image light, and an output waveguide 1015 configured to output an expanded image light to the eye 1020 of the user. In some embodiments, the output waveguide 1015 may function as a waveguide-based combiner in the NED 1000 to overlay the virtual and real world images. The waveguide-based combiner may function as a display window (e.g., the left display window 1015L or the right display window 1015R). The output waveguide 1015 may include one or more in-coupling elements configured to couple a light from the light source assembly into the output waveguide. In some embodiments, the output waveguide 1015 may include one or more out-coupling (or decoupling) elements configured to couple the light out of the output waveguide toward the eye 1020 of the user. In some embodiments, the output waveguide 1015 may include one or more directing elements configured to direct the light output by the one or more coupling elements to the one or more decoupling elements.

In some embodiments, the NED 1000 may include a varifocal/multifocal block 1040. The display system 1010 and the varifocal/multifocal block 1040 together may provide the image light to an exit pupil 1025. The exit pupil 1025 may be a location where an eye 1020 of the user is positioned. For illustrative purposes, FIG. 10B shows a cross section view associated with a single eye 1020. A similar display system, separate from the display system 1010, and a similar varifocal/multifocal block, separate from the varifocal/multifocal block 1040, may be included in the other half of the NED 1000 (that is not shown) to direct the image light to another eye of the user.

In some embodiments, the NED 1000 may include an eye tracking system (not shown). The eye tracking system may include, e.g., one or more light sources configured to illuminate one or both eyes of the user, and one or more cameras configured to capture images of one or both eyes of the user based on the light emitted by the light sources and reflected by the one or both eyes. In some embodiments, the NED 1000 may include an adaptive dimming element 1045, which may dynamically adjust the transmittance for the real world objects viewed through the NED 1000, thereby switching the NED 1000 between a VR device and an AR device or between a VR device and a MR device. In some embodiments, along with switching between the AR/MR device and the VR device, the adaptive dimming element 1045 may be used in the AR and/MR device to mitigate difference in brightness between real and virtual objects.

In some embodiments, the waveguide-based combiner 1015 may be realized by a disclosed optical device based on a solid crystal film having spatially uniform orientations of the axes of the crystal molecules within the solid crystal film, such as the waveguide 500 in FIG. 5A or the waveguide 520 in FIG. 5B. In some embodiments, the in-coupling element, the directing element, and/or the out-coupling (or decoupling) element disposed at the waveguide-based combiner 1015 may be realized by a disclosed optical device based on a solid crystal film having periodic and linear orientations of axes of the crystal molecules in an-plane direction of the solid crystal film, such as the PBP gratings 700 shown in FIG. 7A-7D, or the reflective PVG grating 900 shown in FIGS. 9A-9C. Compared to various gratings used in conventional NEDs, such as surface-relief gratings ("SRGs") and holographic gratings ("HGs"), the disclosed optical device functioning as the PBP grating may have a high efficiency over a large field of view and a broad wavelength spectrum (e.g., the band of visible wavelengths), and may provide advantages for waveguide-coupling NEDs used for VR, AR, and/or MR applications. In addition, the reflective PVG grating 900 shown in FIGS. 9A-9C may be configured to deflect a circularly polarized light having a specified handedness, and transmit a circularly polarized light having an orthogonal handedness. When reflective PVG grating 900 is used as a combiner that combines the displayed images and the real world light in the NED 1000 for AR and/or MR applications, the overall transmittance of the real world light may be increased. The waveguide combiner based on high refractive index solid crystal may be configured to increase the FOV of the waveguide based NEDs and reduce the weight of the display optics by reducing the number of combiner plates to one (from multiple) for an efficient RGB in and out-coupling. The in-coupling element, the directing element, and/or the out-coupling (or decoupling) element (e.g., gratings) based on high refractive index solid crystal may be configured to be compatible with high refractive index and high FOV waveguides for NEDs.

Further, the varifocal/multifocal block 1040 shown in FIG. 10B may be configured to adjust a distance of a light emitted from the waveguide display system, such that the light appears at predetermined focal distances from the eye(s) 1020 of the user. The varifocal/multifocal block 1040 may include one or more varifocal/multifocal structures arranged in an optical series. A varifocal/multifocal structure may be referred to as an optical device configured to dynamically adjust its focus in accordance with instructions from a controller. The varifocal/multifocal structure may include one or more single-focus lenses having a fixed optical power and/or one or more variable-focus or multi-focus lenses having an adjustable (or variable) optical power. The one or more multi-focus lenses may be realized by the disclosed optical devices based on a solid crystal film having periodic orientations of axes of the crystal molecules in an in-plane radial direction of the solid crystal film, such as the PBP lens 700 shown in FIG. 8A-8D.

The above-mentioned applications of the disclosed optical devices in the NEDs are merely for illustrative purposes. In addition, the disclosed optical devices based on solid crystals may also be used to realize eye-tracking components, display resolution enhancement components, and pupil steering elements, etc., which is not limited by the present disclosure. The disclosed optical devices based on solid crystals may be light-weight, thin, compact, and customized. Thus, through using the disclosed optical devices as multifunctional optical components in the NEDs, the weight and size of NEDs may be significantly reduced while the optical performance and appearance may be enhanced, therefore opening up the possibilities to the futuristic smart glasses.

In addition, the disclosed solid crystal formed on one or more alignment structures may be implemented in electronic devices to improve electronic performances thereof. Conventional solid crystals, such as polycyclic hydrocarbons, have been used as organic semiconductors in various organic electronic devices, such as field-effect transistors ("FETs"), thin-film transistors ("TFTs"), photovoltaics, etc., in the field of flexible electronics. It has been demonstrated that changing the lattice constant of a conventional solid crystal (for example, compressing the conventional solid crystal) may enhance the charge carrier mobility and, thus, enhance the electronic transport properties of the organic electronic devices. The disclosed solid crystals formed (e.g., grown) on one or more alignment structures may be configured to have a controllable amount of strain, through adjusting the alignment structure so that a certain desirable crystal lattice may be achieved for the crystal. In some embodiments, the strain may vary across the solid crystal, e.g., the stain may vary in the same device based on the disclosed solid crystal. In some embodiments, the strain may vary across multiple solid crystals disposed at (e.g., on) the same substrate, e.g., the strain may vary across multiple devices including the respective solid crystals. In some embodiments, the strain may vary in a specific spatial pattern (such as a PBP type pattern), which may aid in novel electronic transport properties.

Figure 11A:
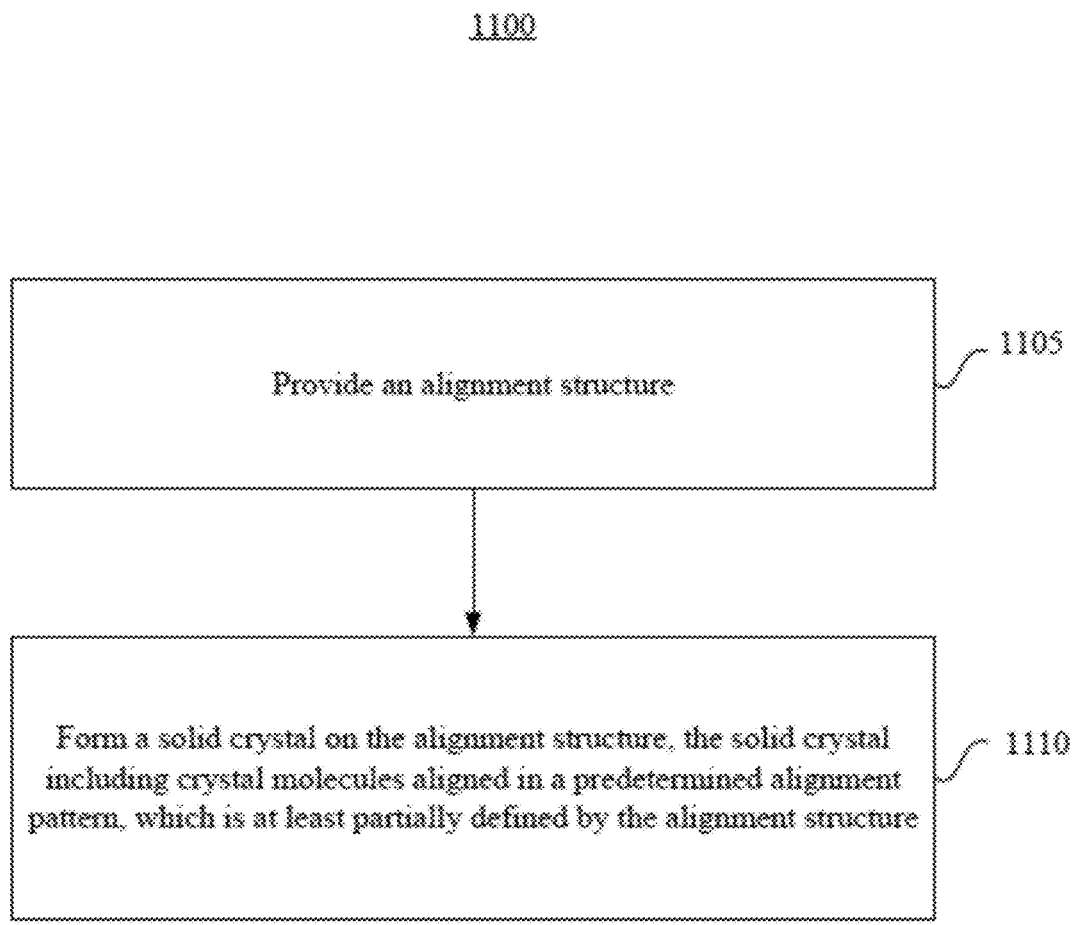
FIG. 11A is a flowchart illustrating a method for fabricating an optical device in accordance with some embodiments.

The present disclosure also provides various methods for fabricating the disclosed optical elements or devices, which are formed based on solid crystals. Such optical elements or devices may include the PBP optical elements or optical waveguides disclosed herein and described above. For example, FIG. 11A is a flowchart illustrating a method 1100 for fabricating an optical device. The optical device may include a solid crystal. Method 1100 may include providing an alignment structure (step 1105). Various methods may be used to provide the alignment structure. For example, the alignment structure may be provided on a substrate. In some embodiments, the alignment structure may be formed (e.g., deposited, coated) as a separate element on a surface of the substrate. In some embodiments, the alignment structure may be integrally formed on or at least partially in the surface of the substrate through a suitable process (e.g., etching). In some embodiments, the alignment structure may be provided without using the substrate. For example, the alignment structure may be a pre-fabricated structure. The alignment structure may include or define an alignment structure pattern.

In some embodiments, providing the alignment structure may include at least one of: forming a photoalignment layer on a surface of a substrate by processing a photosensitive material by a light, forming a mechanically rubbed alignment layer on the surface of the substrate, forming an alignment layer with anisotropic nanoimprint on the surface of the substrate, forming an anisotropic relief directly on the surface of the substrate through wet or dry etching of the surface of the substrate, forming the alignment structure on the surface of the substrate based on a ferroelectric or ferromagnetic material deposited on the surface of the substrate, providing a crystalline layer or a crystalline substrate that defines an alignment pattern as the alignment structure, or forming the alignment structure on the surface of the substrate by crystallization in the presence of a magnetic or electric field.

Figure 15:
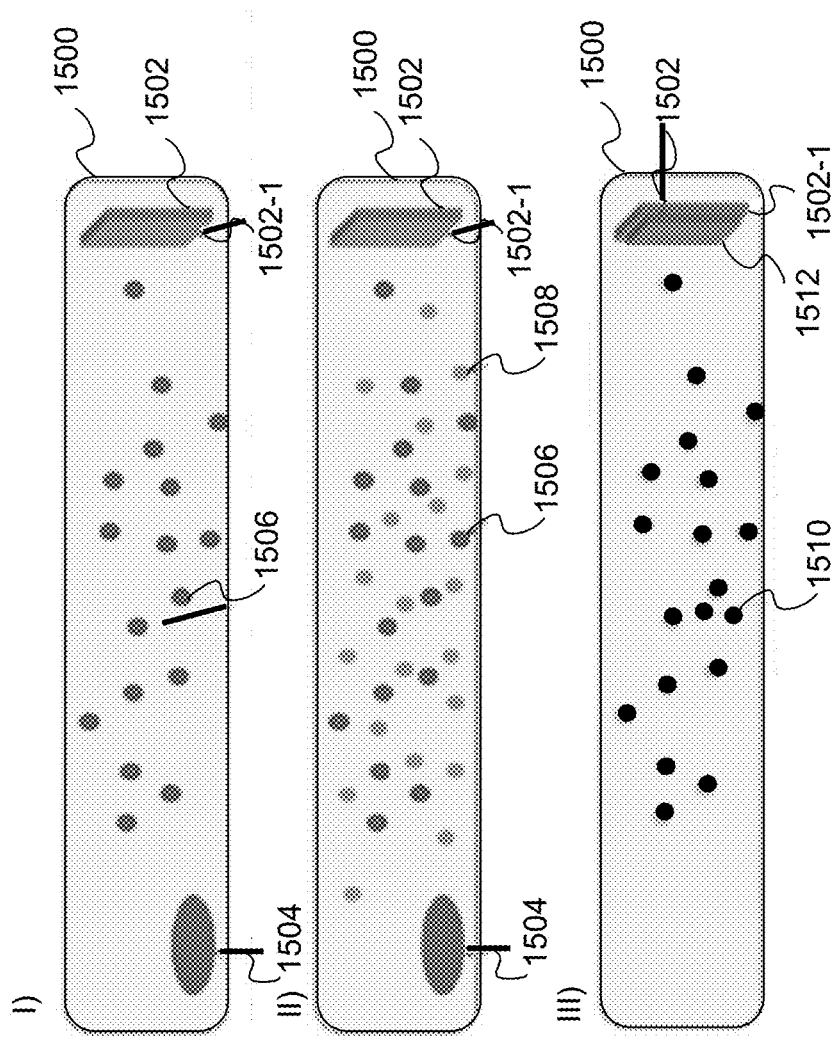
FIG. 15 illustrates a method of fabricating an organic crystal using physical vapor transport in accordance with some embodiments.
Figure 16:
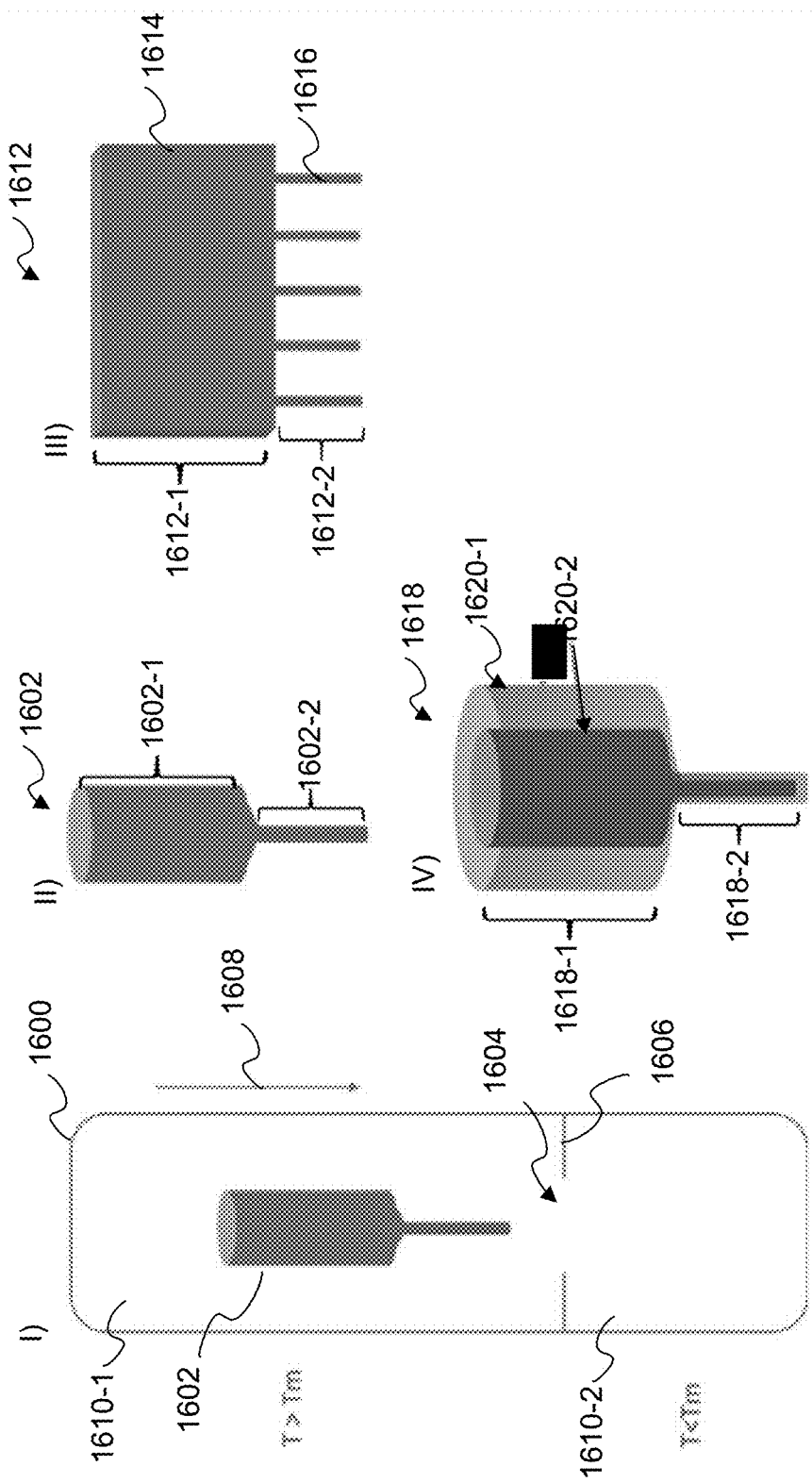
FIG. 16 illustrates a method of fabricating an organic crystal using melting recrystallization in accordance with some embodiments.
Figure 17:
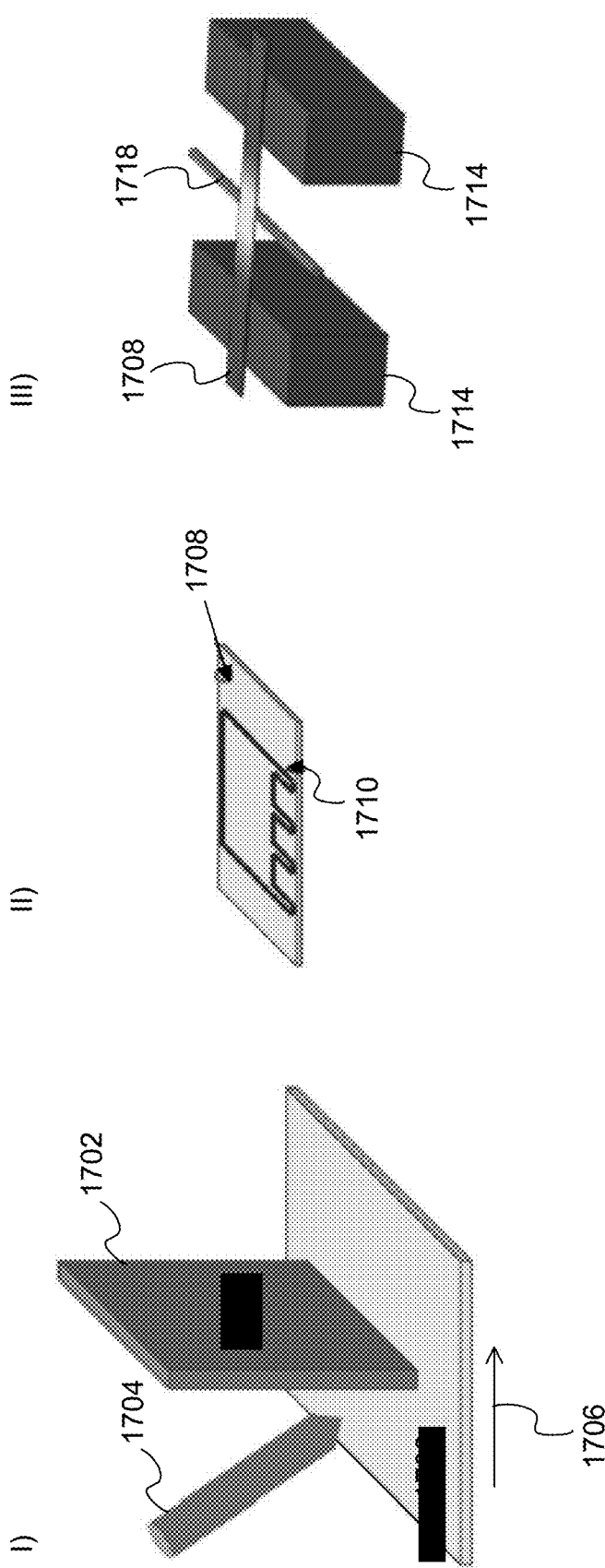
FIG. 17 illustrates a method of fabricating an organic crystal using solvent coating and zone annealing in accordance with some embodiments.

Method 1100 may also include forming a solid crystal on the alignment structure, the solid crystal including crystal molecules aligned in a predetermined alignment pattern, which is at least partially defined by the alignment structure (step 1110). Various methods may be used to form the solid crystal (or solid crystal film, layer, or plate) on the alignment structure. For example, in some embodiments, the solid crystal may be grown on the alignment structure based on a molten solid crystal material. Thus, forming the solid crystal on the alignment structure may include growing the solid crystal on the alignment structure. In some embodiments, forming the solid crystal on the alignment structure is performed using at least one of the following processes: a vapor deposition including at least one of an organic crystal molecule beam epitaxy, or a hot wall epitaxy of organic crystal molecules, a solvent assisted deposition via a thermal alignment, a mold alignment, or a surface alignment, a polymer assisted continuous casting, a physical vapor transport (as shown in FIG. 15), a crystal growth process based on a molten crystal material as shown in FIG. 16), a temperature assisted zone annealing (as shown in FIG. 17), or a spin coating.

Method 1100 may include other processes not shown in FIG. 11A. For example, in some embodiments, multiple alignment structures may be provided and multiple solid crystals (or solid crystal layers) may be formed. The alignment structure may be a first alignment structure, the predetermined alignment pattern may be a first predetermined alignment pattern, the solid crystal may be a first solid crystal, and the crystal molecules may be first crystal molecules. Method 1100 may also include providing a second alignment structure on the first solid crystal, and forming a second solid crystal on the second alignment structure. The second solid crystal may include second crystal molecules aligned in a second predetermined alignment pattern, which is at least partially defined by the second alignment structure.

In some embodiments, the solid crystal formed by method 1100 may be optically anisotropic with a principal refractive index of at least about 1.5 and an optical anisotropy (e.g., birefringence) of at least about 0.1. The principal refractive index of the solid crystal may be a refractive index in a direction parallel to an axis of the solid crystal. The axis of the solid crystal may be an axis along which the solid crystal has a highest refractive index.

Figure 11B:
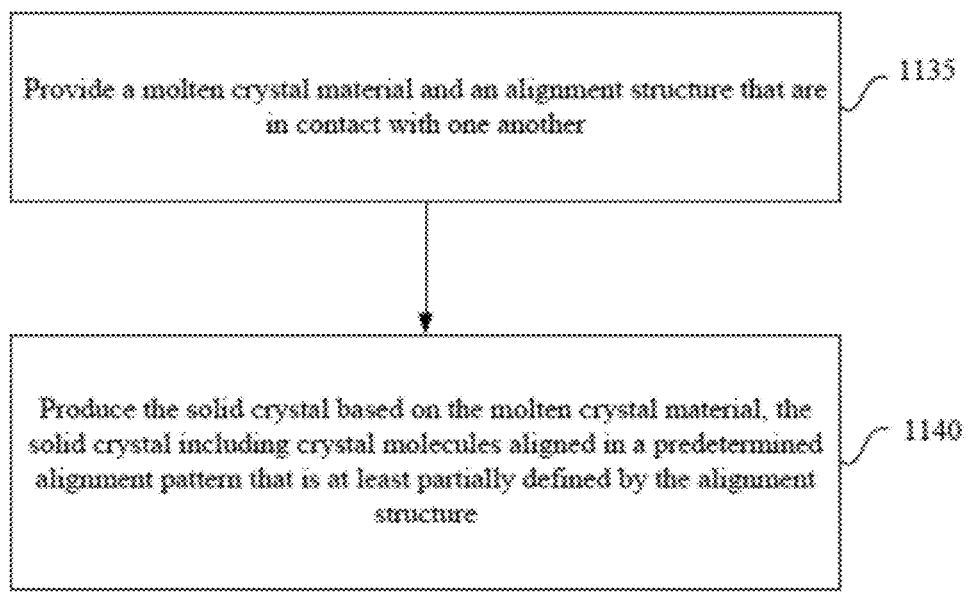
FIG. 11B is a flowchart illustrating a method for fabricating an optical device in accordance with some embodiments.

FIG. 11B is a flowchart illustrating a method 1130 for fabricating an optical device, which may include a solid crystal. Method 1130 may include providing a molten crystal material and an alignment structure that are in contact with one another (step 1135). Various methods may be used to provide the molten crystal material and the alignment structure that are in contact with one another. In some embodiments, the molten crystal material may be coated onto the alignment structure. In some embodiments, the molten crystal material may be deposited onto the alignment structure. In some embodiments, the molten crystal material may be introduced into a container and the alignment structure may be provided at least one wall (e.g., bottom wall, side walls) of the container. In some embodiments, the alignment structure may be dipped or inserted into the molten crystal material.

Method 1130 may also include producing the solid crystal based on the molten crystal material, wherein the solid crystal includes crystal molecules aligned in a predetermined alignment pattern that is at least partially defined by the alignment structure (step 1140). Various methods disclosed herein may be used to produce the solid crystal based on the molten crystal material.

Method 1130 may include other processes not shown in FIG. 11B. For example, in some embodiments, producing the solid crystal includes cooling the molten crystal material. In some embodiments, producing the solid crystal may include growing the solid crystal based on the molten crystal material by pulling a seed crystal away from a die. The die may include at least one capillary at least partially configured to allow the molten crystal material to flow therethrough during the growth of the solid crystal. The die may also include a surface having a predetermined shape and having the alignment structure. The solid crystal may grow along the surface of the die according to the alignment structure.

FIG. 11C is a flowchart illustrating a method 1150 for fabricating an optical device, which may include a solid crystal. Method 1150 may include moving a molten crystal material in a space between two substrates while maintaining contact between the molten crystal material and two opposing surfaces of the two substrates, wherein each of the two opposing surfaces includes an alignment structure that is in contact with the molten crystal material (step 1155). Moving the molten crystal material may be achieved using various transportation or moving mechanisms. For example, in some embodiments, a mechanical mechanism such as a conveying belt or a robotic arm may be used to move the molten crystal material along the two substrates while maintaining contact of the molten crystal material with two surfaces of the two substrates that face each other. A thermal gradient may be maintained for the molten crystal material through a suitable temperature control device (e.g., a heating device and/or a controller). Method 1150 may also include growing, from the molten crystal material using a seed crystal, the solid crystal including crystal molecules aligned in a predetermined alignment pattern that is at least partially defined by the alignment structures (step 1160). Method 1150 may also include other additional or alternative steps, such as processing (e.g., by heating) a solid crystal material to produce the molten crystal material. In some embodiments, growing of the solid crystal may be achieved through other suitable methods. For example, growing of the solid crystal may be achieved through growing from organic material vapors such that there is an epitaxial growth of the vapor on the alignment structure(s). This method may also be applicable to cholesteric (or twisted) growth.

Figure 11D:
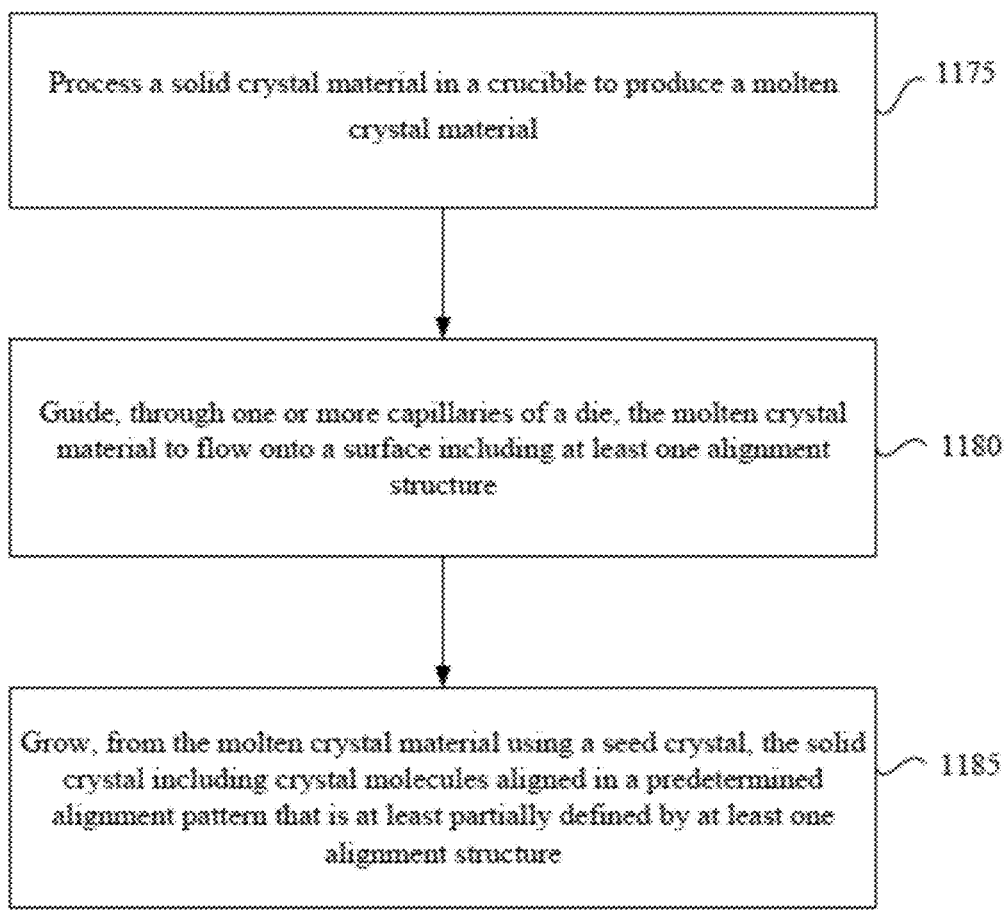
FIG. 11D is a flowchart illustrating a method for fabricating an optical device in accordance with some embodiments.

FIG. 11D is a flowchart illustrating a method 1170 for fabricating an optical device, which may include a solid crystal. Method 1170 may include processing a solid crystal material in a crucible to produce a molten crystal material (step 1175). Various suitable methods may be used to produce the molten crystal material. For example, the solid crystal material may be heated by a heating device to produce the molten crystal material. In some embodiments, the solid crystal material may be subject to a microwave or a high pressure to produce the molten crystal material. Method 1170 may also include guiding, through one or more capillaries of a die, the molten crystal material to flow onto a surface including at least one alignment structure (step 1180). Method 1170 may also include growing, from the molten crystal material using a seed crystal, the solid crystal including crystal molecules aligned in a predetermined alignment pattern that is at least partially defined by the at least one alignment structure (step 1185).

In some embodiments, the surface of the die may have a predetermined curved shape, and the grown solid crystal may have substantially the same curved shape as the surface of the die. In other words, a curved solid crystal and/or a curved optical device may be fabricated.

In some embodiments, growing the solid crystal may include pulling the seed crystal disposed at a top portion of the die away from the die to allow the solid crystal to grow at a meniscus-crystal interface along the surface of the die. The disclosed methods may further include removing the grown solid crystal from the crucible. The disclosed methods may also include cooling the solid crystal removed from the crucible.

Figure 12A:
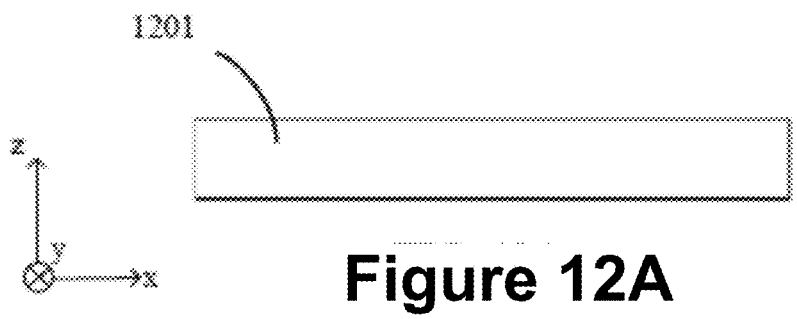
FIGS. 12A-12C schematically illustrate processes for fabricating an optical device including a solid crystal in accordance with some embodiments.
Figure 12B:
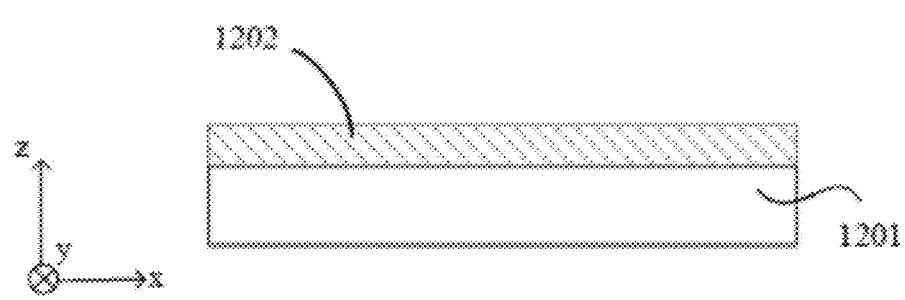
Figure 12C:
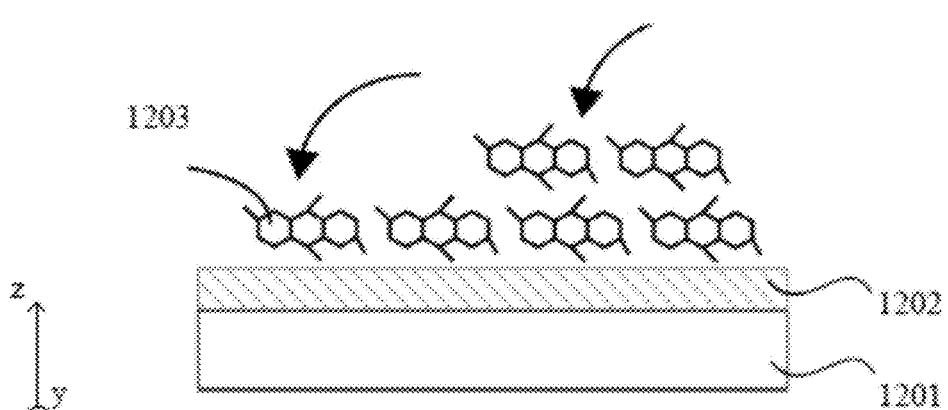

FIG. 12A to FIG. 12C illustrate processes for fabricating an optical device including a solid crystal in accordance with some embodiments. As shown in FIG. 12A, a substrate 1201 may be provided. As shown in FIG. 12B, an alignment structure 1202 may be disposed at (e.g., on) a surface of the substrate 1201. In some embodiments, the alignment structure 1202 may be formed as a separate element on the substrate 1201. In some embodiments, the alignment structure 1202 may be formed as an integral part of the substrate 1201. For example, the alignment structure 1202 may be etched on or at least partially in the surface of the substrate 1201. In some embodiments, the process shown in FIG. 12A may be omitted, and a pre-fabricated alignment structure 1202 may be directly provided without a substrate.

As shown in FIG. 12C, solid (or molten) crystal molecules 1203 may be disposed (e.g., deposited, coated, formed, grown, etc.) on the alignment structure 1202. In some embodiments, the solid crystal molecules 1203 may be grown on the alignment structure 1202 based on a molten crystal material. In some embodiments, the process shown in FIG. 12C may be performed in a crucible that contains the molten crystal material. In some embodiments, the alignment structure may be provided at a die. The alignment structure 1202 may include or define an alignment structure pattern. The alignment structure 1202 may at least partially align the crystal molecules 1203 in a predetermined alignment pattern. The alignment structure pattern may or may not be the same as the predetermined alignment pattern. In some embodiments, a first plurality of crystal molecules in contact with the alignment structure 1202 may be aligned in the alignment structure pattern. Other crystal molecules disposed (e.g., coated, grown, etc.) over the first plurality of crystal molecules may follow the alignments and/or orientations of the first plurality of crystal molecules. In some embodiments, other crystal molecules disposed over the first plurality of crystal molecules may be twisted or rotated relative to the corresponding first plurality of crystal molecules. In some embodiments, the crystal molecules 1203 may be uniformly aligned. In some embodiments, the crystal molecules 1203 may be non-uniformly aligned. For example, the orientations of the axes of the crystal molecules 1203 may not be aligned in a same orientation or direction. Instead, the orientations of the axes of the crystal molecules 1203 may be spatially varied.

Figure 13A:
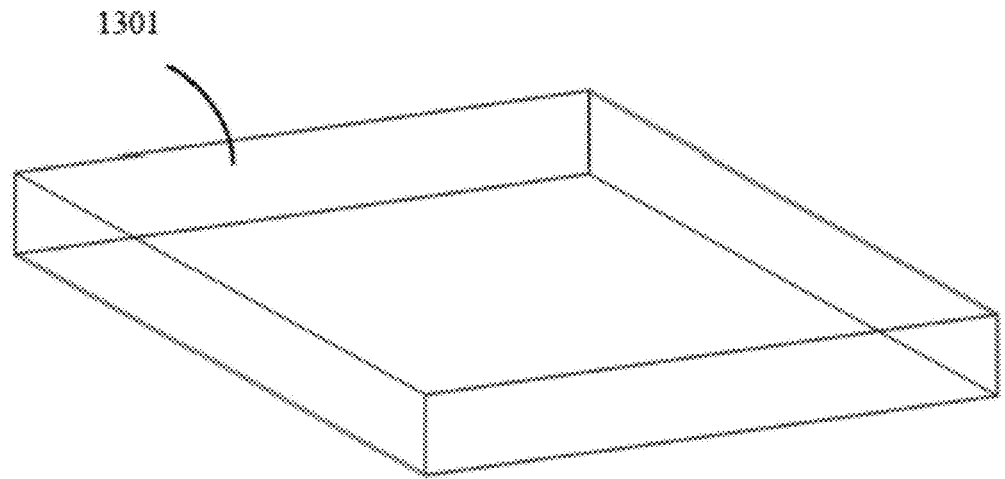
FIGS. 13A-13D schematically illustrate processes for fabricating an optical device including a solid crystal in accordance with some embodiments.
Figure 13B:
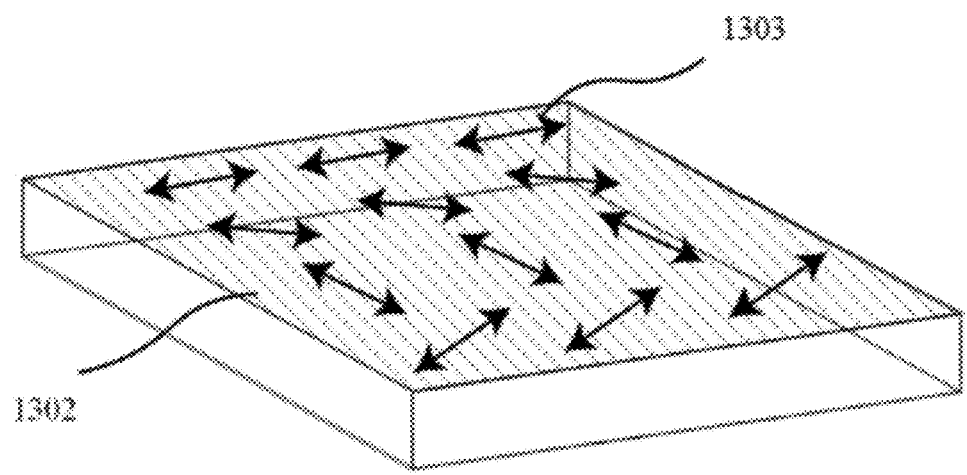
Figure 13C:
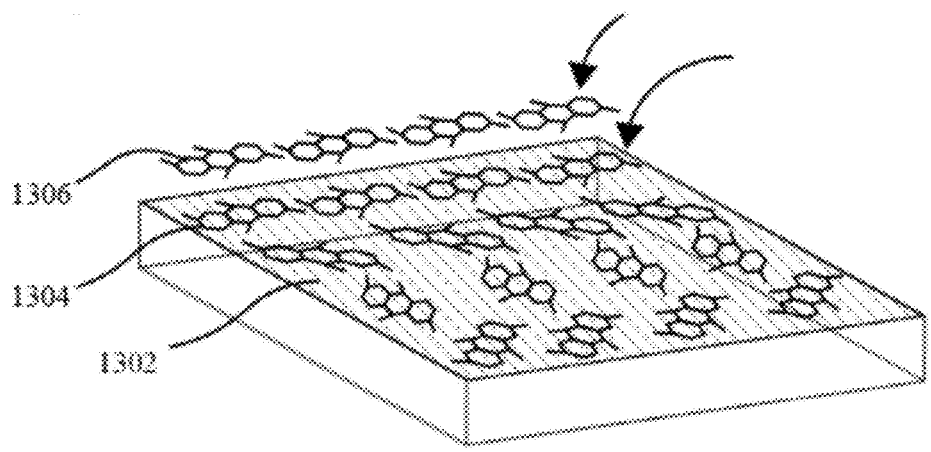
Figure 13D:
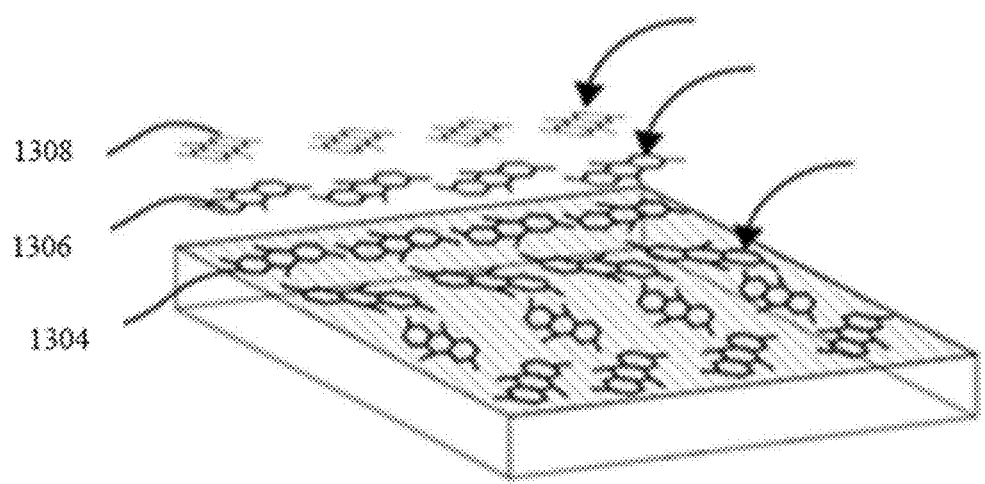

FIG. 13A to FIG. 13D illustrate processes for fabricating an optical device including a solid crystal in accordance with some embodiments. As shown in FIG. 13A, a substrate 1301 may be provided. As shown in FIG. 13B, an alignment structure 1302 may be provided. The alignment structure 1302 may include or define an alignment structure pattern, as indicated by the arrows 1303. As shown in FIG. 13C, crystal molecules may be disposed (e.g., formed, deposited, grown, coated, etc.) onto the alignment structure 1302. A first plurality (or a first layer) of crystal molecules 1304 may be disposed on the alignment structure 1302. The first plurality of crystal molecules 1304 may be aligned by the alignment structure 1302 in the alignment structure pattern. A second plurality (or a second layer) of crystal molecules 1306 may be disposed over the first plurality of crystal molecules 1304. The second plurality of crystal molecules 1306 may or may not follow the same alignment pattern as the first plurality of crystal molecules 1304. In some embodiments, the second plurality of crystal molecules 1306 may follow the same alignment pattern as the first plurality of crystal molecules 1304, as shown in FIG. 13C. In some embodiments, the second plurality of crystal molecules 1306 may have a twist (or rotation) relative to the corresponding first plurality of crystal molecules 1304. As shown in FIG. 13D, a third plurality of crystal molecules 1308 may be disposed over the second plurality of crystal molecules 1304. The third plurality of crystal molecules 1308 may or may not follow the same alignment pattern as the second plurality of crystal molecules 1306. Additional layers of crystal molecules may be formed over the third plurality of crystal molecules 1308. In some embodiments, one or more additional alignment structures may be disposed between different layers of crystal molecules.

In some embodiments, the solid crystal may be fabricated using vapor deposition methods. For example, vapor deposition of organic crystal molecules may include one or more of organic molecule beam epitaxy and hot wall epitaxy. A surface of a substrate may be modified to control a molecular orientation therefore crystal orientation. For example, an alignment structure may be formed on the surface of the substrate to define a pattern for aligning the crystal molecules. Hexagonal boron nitride may be coated with chemical vapor deposition ("CVD") to create a Van der Waal surface to allow for free standing thin film of organic solid crystals. Organic molecular beam epitaxy may use ultra-high vacuum conditions. Hot wall epitaxy may use high vacuum conditions such as about $10^{-6}$ Mbar.

In some embodiments, the solid crystal may be fabricated using a solvent assistant (or solvent-assisted) deposition method. For organic crystallization, this method may be combined with thermal/mold/surface alignment to achieve a large size crystal with high purity. For example, the solid crystal may be formed based on a temperature/solvent assisted single crystal formation process. In such as process, the organic molecules may be dissolved in a solvent. A substrate may be placed in the solution with a uniformly controlled temperature. Recrystallization may be performed on the locally cooled substrate. Oxidized silicon, thermal couple may be used to control the temperature. In some embodiments, solid crystals may be formed based on a mold/temperature assisted crystallization process. In this process, organic molecules may self-assembly in a confined space during a drying process under a high temperature. The process may use a silicon oxide surface with trichloro (octadecyl)silane polyurethane acrylate mold. In some embodiments, solid crystals may be formed based on a polymer assisted continuous casting with doctor-blading process. Polymer may be used to increase viscosity of organic molecular solution to avoid slipping of the film. A moving stage with speed-controlled doctor blade may be used. In some embodiments, solid crystals may be formed based on a surface alignment/solvent assisted patterning process. A surface of a substrate may be patterned to induce molecular alignment. A vapor solvent may be used to mobilize the molecules toward configurations with a lower energy state. A controlled exchange/removal of solvent may be performed to solidify molecules.

In some embodiments, solid crystals may be formed based on a zone annealing method. For example, a temperature assisted crystallization process may be used. A sharp temperature gradient may be created with a high temperature above the melting temperature. The direction and/or purity of the crystallization may be controlled visa moving speed of organic thin film (which may be coated on the substrate) across the thermal gradient. A moving stage with a sharp thermal gradient may be used in this process.

Figure 14:
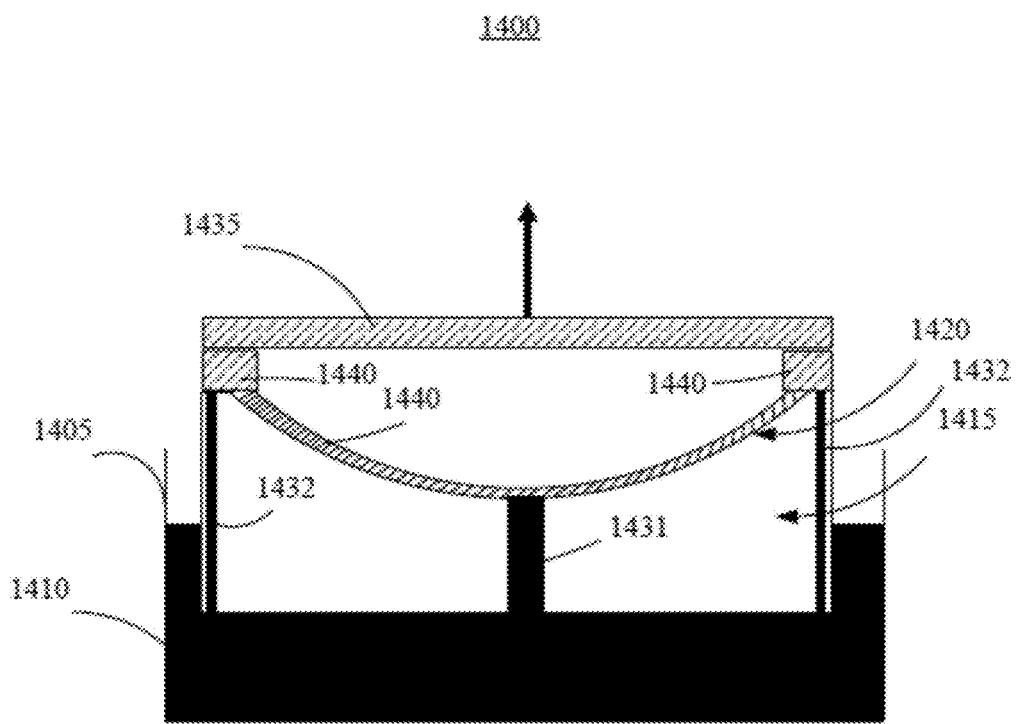
FIG. 14 schematically illustrates a system for fabricating an optical device including a solid crystal in accordance with some embodiments.

FIG. 14 schematically illustrates a system 1400 for fabricating an optical device, which may include a solid crystal in accordance with some embodiments. The system 1400 may be configured to grow the solid crystal based on a molten crystal material. The system 1400 may include a crucible 1405. A solid crystal material may be placed in the crucible 1405 and may be processed (e.g., heated) to produce a molten crystal material 1410. Devices (e.g., heating elements) for increasing the temperature of the solid crystal material or the crucible 1405 and controller for controlling the heating elements are not shown in FIG. 14. A die 1415 may be disposed in the crucible 1405. The die 1415 may include a plurality of capillaries for guiding the flow of the molten crystal material 1410. For example, the die 1415 may include a center capillary 1431 and a ring capillary 1432. The die 1415 may include a surface 1420. The surface 1420 may include an alignment structure (not labeled) deposited or formed thereon or at least partially in the surface 1420. The alignment structure may define or include an alignment structure pattern. The alignment structure may be configured to at least partially align crystal molecules grown on the alignment structure in a predetermined alignment pattern. A seed crystal 1435 may be disposed over the die 1415. The seed crystal 1435 may be pulled or moved away from the die 1415, allowing the molten crystal material 1410 to follow the movement of the seed crystal 1435. At an interface between the molten crystal material 1410 and the seed crystal 1435, a meniscus may be formed. At the meniscus-crystal interface, solid crystals 1440 may grow. Through the center and ring capillaries 1431 and 1432, the molten crystal material 1410 may flow to the surface 1420 of the die 1415. Solid crystals may grow on the surface 1420, and may be at least partially aligned in the predetermined alignment pattern by the alignment structure provided at the surface 1420. The solid crystal 1440 may be in any suitable shape, depending on the shape of the surface 1420 of the die 1415. For example, the surface 1420 may be a flat surface, and the solid crystal 1440 may include a flat shape.

FIG. 15 illustrates a method of fabricating an organic crystal using physical vapor transport (also known as physical vapor deposition) in accordance with some embodiments. Physical vapor transport is a vacuum deposition method for producing thin films by changing a material in a condensed phase into a vapor phase, and transporting the material in the vapor phase for formation of a thin film in a condensed phase. Examples of physical vapor transport include sputtering and evaporation. The method includes evaporating condensed source material and transporting the vapor onto a target substrate to form a condensed thin film. The method is performed under controlled conditions (e.g., a chamber 1500 such as a vacuum chamber). As shown in Section I of FIG. 15, source material 1504 (e.g., organic material) is positioned at a first end region of chamber 1500. Source material 1504 is vaporized (e.g., by heat) to release vaporized molecules and/or particles (e.g., vaporized molecules 1506). Vaporized molecules 1506 are transported inside chamber 1500 onto a substrate (e.g., substrate 1502) and are condensed to form (e.g., grow) an organic crystal on a surface of substrate 1502). Section III of FIG. 15 shows organic crystal 1512 on surface 1502-1 of substrate 1502. In some embodiments, organic crystal 1512 corresponds to solid crystal 115 described above with respect to FIG. 1A.

In some embodiments, growing organic solid crystal involves physical vapor transport onto a flat or curved substrate (e.g., substrate 1502) with a surface (e.g., surface 1502-1 such as a controlled-nucleation surface) configured for contact with said organic solid crystals (e.g., organic solid crystal molecules 1506). In some embodiments, substrate 1502 in FIG. 15 corresponds to substrate 105 described above with respect to FIG. 1A. In some embodiments, surface 1502-1 includes or corresponds to alignment structure 110 described with respect to FIG. 1A. For example, an alignment layer may be used to control the orientation of organic solid crystal molecules, thereby controlling the crystal orientation (e.g., the controlled-nucleation surface is a surface of the alignment layer). In some embodiments, the alignment layer (or a portion thereof, such as a contact surface) is mainly made of crystalline fluorine-containing polymers (e.g., PTFE, PDVF). The fluorine-containing polymers can be formed in a state having the long chain substantially in parallel with one of the in-plane directions or perpendicular to the in-plane directions. In some embodiments, the alignment layer (or a portion thereof, such as a contact surface) is mainly made of polyolefin polymers (e.g., PE). The polyolefin polymers can be formed in a state having the long chain substantially parallel with one of the in-plane directions or perpendicular to the in-plane directions. In some embodiments, the first surface is mainly made of liquid crystal polymers with the nematic phase, which allows the liquid crystal polymer molecules to align in pre-designed direction. In some embodiments, the first surface is mainly made of an alignment layer (e.g., photo-alignment layer, polyimide with uniaxial rubbing). In some embodiments, the first surface is mainly made of amorphous polymers with low surface energy (e.g., silicone, siloxane) to form a controlled-nucleation surface. The molecular orientation of said organic solid crystal is controlled through surface energy match. In some embodiments, the first surface is mainly made of amorphous inorganic material (e.g., $SiO_2$). Optionally, the inorganic surface is functionalized with alkyl/alkoxyl silane. In some embodiments, the substrate and the first surface are made of the same material, which has been made highly oriented by stretching and heating in one direction. Examples include PEN, Polyolefin, and polyimide. In some embodiments, the substrate is made of material that is different from the first surface. Examples include inorganic amorphous materials such as $SiO_2$, fused silica, quartz, silicone, siloxane. Inorganic crystalline material such as silicon, siloxane, SiC, sapphire, organic materials such as polymers with fluorinated groups, alkyl groups, cyclic aliphatic groups, cyclic aromatic groups, heteroarene groups (e.g., polytetrafluoroethylene, Teflon PFA polyethylene naphthalate, polystyrene, polyolefin). In some embodiments, the controlled-nucleation surface includes a non-polymer controlled-nucleation surface including one or more organic structures selected from the group of organic structures of Formulas 6-1 through 6-5 described above.

In some embodiments, the growth of organic solid crystal further involves the use of non-reactive gas such as non-solvent vapor (e.g., inert gas) and/or solvent vapor. For example, as shown in Section II of FIG. 15, vaporized organic molecules 1506 are transported from source material 1504 toward substrate 1502 with a help of transport vapor. In some embodiments, transport vapor 1508 is a combination of non-solvent vapor (e.g., inert gas) or solvent vapor. In some embodiments, transport vapor 1508 includes either non-solvent vapor or solvent vapor. Controlling a type and percentage of non-solvent vapor allows control over the concentration of organic solid crystal vapor, the speed of flow, and kinetics of solidification, therefore controlling nucleation and crystal growth rate. The use of solvent vapor is to selectively dissolve and remove defects such as amorphous domains or boundary between polycrystalline domains. In embodiments where solvent vapor is used for the organic crystal growth, the solvent vapor is removed (e.g., evaporated) after formation of the organic crystal. For example, in Section III of FIG. 15, solvent vapor 1510 is evaporated away from organic crystal 1512.

FIG. 16 illustrates a method of fabricating an organic crystal (e.g., solid crystal 115 described in FIG. 1A) using melting recrystallization in accordance with some embodiments. In some embodiments, growing organic solid crystal involves the process of recrystallization from melting state, where an ampoule with designed configuration and surface modification is employed. In some embodiments, an ampoule (e.g., ampoule 1602) is positioned inside a temperature-controlled chamber 1600, as shown in Section I of FIG. 16. Chamber 1600 includes two portions (e.g., portion 1610-1 and portion 1610-2) separated by a temperature gate (e.g., gate 1606 including opening 1604). Portion 1610-1 has a temperate that is above the melting point (e.g., $T_m$) of an organic crystal and portion 1610-2 has a temperature that is below the melting point of the organic crystal. Ampoule 1602 can be moved between portions 1610-1 and 1610-2 of chamber 1600 (e.g., in the direction indicated with arrow 1608) so that the temperature of the organic crystal disposed inside ampoule 1602 can be changed in accordance with respective temperatures of portions 1610-1 and 1610-2. In particular, moving ampoule 1602 including liquid organic crystal in portion 1610-2 to portion 1610-2 having the temperature below the melting point of the organic crystal will cause the liquid organic crystal to form a solid organic crystal structure.

In some configurations, the inside of the ampoule is filled with organic solid crystals for further processing. Recrystallization occurs as the temperature of the ampoule changes from above the melting temperature to below the melting temperature. The process can be repeated to the point where desired crystallinity is reached. In some embodiments, the method further includes cleaving, polishing, or in-mold lamination to adjust surface roughness, thickness as well as curvature.

Sections II, III, and IV or FIG. 16 illustrate exemplary ampoules that can be used to form organic crystals with the melting recrystallization method described with respect to Section I. In some embodiments, the ampoule includes a nucleation area and a crystal growth area. For example, ampoule 1602 in Section II of FIG. 16 includes nucleation area 1602-2 and crystal growth area 1602-1, ampoule 1612 in Section III of FIG. 16 includes nucleation area 1612-2 and crystal growth area 1612-1, and ampoule 1618 in Section IV of FIG. 16 includes nucleation portion 1618-2 and crystal growth portion 1618-1. The nucleation area includes at least one nucleation channel with the inner diameter ranging from sub-micron to centimeter size. For example, ampoule 1602 has a single nucleation channel corresponding to nucleation area 1602-2 and ampoule 1612 has multiple nucleation channels 1616. The channel (e.g. curved/straight cylinder) is configured to tune lattice type and orientation. The nucleation area is connected with the crystal growth area, which is larger in at least one dimension compared with a nucleation channel. The crystal growth area is configured to define the shape and size of the organic solid crystal. Examples include flat slab (e.g., crystal growth region 1612-1 of ampoule 1612 corresponds to slab 1614), curved slab, cuboid, cylinder (e.g., crystal growth region 1602-1 of ampoule 1602 corresponds to a cylinder) and so. In some embodiments, the ampoule further includes a double wall structure with the gap filled with buffer material (e.g. organic solid crystal of the same) to reduce impact of thermal expansion mismatch between ampoule and organic solid crystal as temperature changes during the process. For example, ampoule 1618 includes inner wall 1620-2 and outer wall 1620-1. The organic crystal is grown inside the cylinder defined by inner wall 1620-2. In some embodiments, the gap defined by inner wall 1620-2 and outer wall 1620-1 is filled with the buffer material.

In some embodiments, the ampoule includes the bulk piece for mechanical support and the surfaces in contact with said organic crystal to control the orientation of molecules therefore controlling the crystal orientation. In some embodiments, the surface is mainly made of crystalline fluorine-containing polymers (e.g. PTFE, PDVF). The fluorine-containing polymers can be formed in a state having the long chain substantially in parallel with one of the in-plane directions or perpendicular to the in-plane directions. In some embodiments, the surface is mainly made of polyolefin polymers (e.g. PE). The polyolefin polymers can be formed in a state having the long chain substantially in parallel with one of the in-plane directions or perpendicular to the in-plane directions. In some embodiments, the surface is mainly made of liquid crystal polymers with the nematic phase, which allows the liquid crystal polymer molecules to align in pre-designed direction. In some embodiments, the surface is mainly made of an alignment layer (e.g. photo-alignment layer, polyimide with uniaxial rubbing). In some embodiments, the surface is mainly made of amorphous polymers with low surface energy (e.g. silicone, siloxane) to form a controlled-nucleation surface. In some embodiments, the surface corresponds to alignment structure 110 described above with respect to FIG. 1A. In some embodiments, the controlled-nucleation surface includes a non-polymer controlled-nucleation surface including one or more organic structures selected from the group of organic structures of Formulas 6-1 through 6-5 described above. The molecular orientation of said organic solid crystal is controlled through surface energy match. In some embodiments, the surface is mainly made of amorphous inorganic material (e.g. $SiO_2$). Optionally, the inorganic surface is functionalized with alkyl/alkoxyl silane. In some embodiments, the substrate and the surface are made of the same material, which has been made highly oriented by stretching and heating in one direction. Examples include PEN, Polyolefin, and polyimide. In some embodiments, the substrate is made of material that is different from the surface. Examples include inorganic amorphous materials such as $SiO_2$, fused silica, quartz, silicone, siloxane. Inorganic crystalline material such as silicon, siloxane, SiC, sapphire. Organic materials such as polymers with fluorinated groups, alkyl groups, cyclic aliphatic groups, cyclic aromatic groups, heteroarene groups (e.g. polytetrafluoroethylene, Teflon PFA polyethylene naphthalate, polystyrene, polyolefin).

FIG. 17 illustrates a method of fabricating an organic crystal using solvent coating and zone annealing in accordance with some embodiments. In some embodiments, growing organic solid crystals includes solvent assisted coating, followed by zone-annealing. The solvent coating system includes a blade (e.g., blade 1702 in Section I of FIG. 17) to spread coating materials and create a meniscus area at the coating front to control solvent evaporation, a nozzle (e.g., nozzle 1704) to deliver organic solid crystal solution to the coating front, a substrate (e.g., substrate 1708) to support organic solid crystal, and a temperature control of the substrate to control solvent evaporation. In some embodiments, the substrate coated with the solvent is annealed in a zone-annealing system. In some embodiments, the zone-annealing system includes one or more heating zone (e.g., a zone heated with rod 1718 in Section III of FIG. 17) and one or more cooling zones (e.g., cooling zones 1714) to control temperature profile. In some embodiments, the zone-annealing system includes an automated arm to push the substrate (e.g., substrate 1708 including a coating of organic crystals) through heating and cooling zones with controlled speed. In some embodiments, the zone-annealing system includes a controlled atmosphere environment (e.g. vacuum, inert gas, solvent/non-solvent vapor). For example, the zone-annealing system described in Section III of FIG. 17 is positioned inside chamber 1500 described with respect to FIG. 15 for providing a controlled atmosphere environment.

In some embodiments, substrate 1708 includes a bulk piece and surface modification, where the bulk is to provide mechanical support and heat transfer, and the surface modification is to control the orientation of molecules therefore controlling the crystal orientation. In some embodiments, substrate 1708 corresponds to substrate 105 described above with respect to FIG. 1A. In some embodiments, the surface modification includes or corresponds to alignment structure 110 described with respect to FIG. 1A. In some embodiments, the modified surface is mainly made of crystalline fluorine-containing polymers (e.g. PTFE, PDVF). The fluorine-containing polymers can be formed in a state having the long chain substantially in parallel with one of the in-plane directions or perpendicular to the in-plane directions. In some embodiments, the modified surface is mainly made of polyolefin polymers (e.g. PE). The polyolefin polymers can be formed in a state having the long chain substantially in parallel with one of the in-plane directions or perpendicular to the in-plane directions. In some embodiments, the modified surface is mainly made of liquid crystal polymers with the nematic phase, which allows the liquid crystal polymer molecules to align in pre-designed direction. In some embodiments, the modified surface is mainly made of an alignment layer (e.g. photo-alignment layer, polyimide with uniaxial rubbing). In some embodiments, the modified surface is mainly made of amorphous polymers with low surface energy (e.g. silicone, siloxane) to form a controlled-nucleation surface. The molecular orientation of said organic solid crystal is controlled through surface energy match. In some embodiments, the modified surface is mainly made of amorphous inorganic material (e.g. $SiO_2$). Optionally, the inorganic surface is functionalized with alkyl/alkoxyl silane. In some embodiments, the substrate and the modified surface are made of the same material, which has been made highly oriented by stretching and heating in one direction. Examples include PEN, Polyolefin, and polyimide. In some embodiments, the substrate is made of material that is different from the modified surface. Examples include inorganic amorphous materials such as $SiO_2$, fused silica, quartz, silicone, siloxane, inorganic crystalline material such as silicon, siloxane, SiC, and sapphire, and organic materials such as polymers with fluorinated groups, alkyl groups, cyclic aliphatic groups, cyclic aromatic groups, heteroarene groups (e.g. polytetrafluoroethylene, Teflon PFA polyethylene naphthalate, polystyrene, polyolefin). In some embodiments, the substrate includes a sandwich configuration, where a buffer layer (e.g. organic solid crystal of the same) is sandwiched in between two substrates. Optionally, the substrate further includes at least one microchannel (e.g., microchannel 1710 on substrate 1708 in Section II of FIG. 17) on the modified surface, where the shape, size, or orientation of the microchannel varies to comply crystallization round. Optionally, the process of organic solid crystal further involves delamination from the substrate, cutting or in-mold lamination to adjust shape and curvature.

In some embodiments, the blade further includes microstructures to facilitate mass transport of organic solid crystal molecules from solution to crystallization front.

In accordance with some embodiments, growing organic solid crystals includes electric field assisted deposition of organic molecules with controlled alignment. The deposition system includes an anode, a cathode, and a gap in between, where the electric field can be adjusted and drives the organic solid crystal molecules in the solution to crystalize on the surface of the electrodes with controlled crystallinity. In some embodiments, each of the electrodes further includes a conductive layer (e.g. ITO, conductive polymer) on its first surface.

In some embodiments, growing organic solid crystals involves gel spinning. During the gel spinning, the organic solid crystal (e.g., crystalline polymer, such as polyethylene naphthalate) is fed into the extruder together with solvent and converted into spinning solution, following by spinning solution through a spinning plate containing a plurality of spin holes. The fluid fiber is further cooled into to form gel fibers. Drawing of the fiber to promote chain alignment and crystallinity occurs either before, during or after evaporation of the solvent. The process further involves hot compaction where compression press is applied to unidirectionally arranged fibers at an elevated temperature.

In some embodiments, the organic solid crystal fabricated by the methods described herein operates as a waveguide combiner. In some embodiments, the organic solid crystal operates as a diffractive lens (e.g. Fresnel lens, meta-lens) or a polarization selective gratings with additional process, such as patterning and etching, injection molding, nanoimprinting lithography, or electric deposition to apply structures.

In addition, according to the disclosed technical solutions, forming (e.g., growing) solid crystals on one or more alignment structures may also improve electronic performances of electronic devices including the formed solid crystals. Forming (e.g., growing) solid crystals on one or more alignment structures may provide a controllable amount of strain, through adjusting the alignment structure so that a certain desirable crystal lattice may be achieved for the solid crystal. In some embodiments, the strain may vary across the solid crystal, e.g., the stain may vary in the same device based on the disclosed solid crystal. In some embodiments, the strain may vary across multiple solid crystals disposed at (e.g., on) the same substrate, e.g., the strain may vary across multiple devices including the respective solid crystals. In some embodiments, the strain may vary in a specific spatial pattern (such as a PBP type pattern), which may aid in novel electronic transport properties.

Although these methods are described with respect to a certain size of the organic solid crystal film fabricated by such methods, these methods may be used to fabricate organic solid crystal films of any other size (e.g., less than 100 m in a first dimension and less than one centimeter in a second dimension).

In light of these principles, we now turn to certain embodiments.

In accordance with some embodiments, an optical film (e.g., solid crystal 115 in FIGS. 1A and 1D) includes an organic solid crystal film formed of a contiguous organic solid crystal. The organic solid crystal film has a first dimension no less than 100 micrometers (e.g., thickness, such as dimension D2 in FIG. 1D) and a second dimension (e.g., width, such as dimension D1, or depth, such as D3) distinct from the first dimension no less than one centimeter.

In some embodiments, the second dimension is no less than three centimeters.

In some embodiments, the organic solid crystal film is curved or flat (e.g., solid crystal 115 has a flat shape shown in Sections I and III of FIG. 1C or a curved shape shown in Sections II and IV of FIG. 1C.

In some embodiments, an index of refraction of the optical film is at least 1.6.

In some embodiments, an index of refraction of the optical film measured in a direction either perpendicular (e.g., Sections III and IV of FIG. 1C) or parallel (e.g., Sections I and II of FIG. 1C) to a surface defined by the organic solid crystal film is at least 1.6 and an optical anisotropy of the organic solid crystal film is at least 0.03.

In some embodiments, an optical anisotropy of the optical film is at least 0.1.

In some embodiments, the organic solid crystal film includes a single crystal or a polycrystal.

In some embodiments, the organic solid crystal film (e.g., solid crystal 115 in FIGS. 1A and 1D) includes one or more organic crystals selected of the group consisting of: naphthalene, anthracene, tetracene, pentacene, pyrene, polycene, fluoranthene, benzophenone, benzochromene, benzil, benzimidazole, benzene, hexachlorobenzene, nitropyridine-N-oxide, benzene-1, 4-dicarboxylic acid, diphenylacetylene, N-(4-nitrophenyl)-(s)-prolinal, 4,5-dicyanoimidazole, benzodithiophene, cyanopyridine, thienothiophene, stilbene, azobenzene, and their derivatives.

In some embodiments, the organic solid crystal film (e.g., solid crystal 115 in FIGS. 1A and 1D) includes one or more ring structures including saturated cyclic groups selected of the group consisting of cyclohexane, cyclopentane, tetrahydropyran, piperidine, tetrahydrofuran, pyrrolidine, tetrahydrothiophene, and their derivatives and unsaturated aromatic groups selected from the group consisting of benzene, naphthalene, anthracene, thiophene, bi-phenyl, tolane, benzimidazole, diphenylacetylene, cyanopyridine, thienothiophene, dibenzothiophene, carbazole, silafluorene, and their derivatives.

In some embodiments, the one or more ring structures are coupled with one or more of $C_1$-$C_{10}$ alkyl, alkoxy, alkenyl groups, —CN, —NCS, —SCN, —$SF_5$, —Br, —Cl, —F, —$OCF_3$, —$CF_3$, and mono- or polyfluorinated $C_1$-$C_{10}$ alkyl or alkoxy.

In some embodiments, the organic solid crystal film (e.g., solid crystal 115 in FIGS. 1A and 1D) includes one or more crystalline polymers with precursors having aromatic hydrocarbon or heteroarene groups and their derivatives. The one or more crystalline polymers are selected from a group consisting of polyethylene naphthalate, poly (vinyl phenyl sulfide), poly(a-methyl styrene, polythienothiophene, polythiophene, poly(n-vinylphtalimide), parylene, polysulfide, polysulfone, poly(bromophenyl), poly(vinlynaphthalene), and liquid crystal polymers with precursors.

In some embodiments, the organic solid crystal film (e.g., solid crystal 115 in FIGS. 1A and 1D) is a combination of amorphous polymers with aliphatic, heteroaliphatic, aromatic hydrocarbons, or heteroarene groups; fatty acids, lipids or plasticizer; and a surfactant including molecules with mono- or polyfluorinated alkyl or alkoxy groups.

In some embodiments, the organic solid crystal film includes one or more organic crystals selected of the group consisting of organic solid crystal molecules of Formulas 1-1 through 1-46, Formulas 2-1 through 2-4, and Formulas 3-1 through 3-28 as described above.

In some embodiments, the optical film is used for manufacturing a waveguide combiner (e.g., combiner 1015 in FIG. 10B), a diffractive lens (e.g., device 900 in FIGS. 9A-9C operating as a diffractive lens or a diffractive grating), or a polarization selective grating (e.g., PBP optical device 700 in FIGS. 7A-7D).

In accordance with some embodiments, a method of making an optical film includes depositing, on a substrate having a controlled-nucleation surface (e.g., substrate 1502 having a controlled-nucleation surface 1502-1 in FIG. 15), vaporized organic crystal molecules from a source material using physical vapor transport (e.g., vaporized organic crystal molecules 1506 from source material 1504). The method also includes recrystallizing the vaporized organic crystal molecules on the controlled-nucleation surface thereby forming an optical film including a contiguous organic solid crystal (e.g., forming solid crystal 115 described with respect to FIG. 1A). The organic solid crystal film has a first dimension no less than 100 micrometers (e.g., dimension D2 in FIG. 1D) and a second dimension (e.g., dimension D1) distinct from the first dimension no less than one centimeter.

In some embodiments, the controlled-nucleation surface (e.g., surface 1502-1 in FIG. 15) has a flat shape or a curved shape (e.g., FIG. 1C) that thereby defines a shape of the optical film.

In some embodiments, the controlled-nucleation surface includes one or more of $SiO_2$, fused silica, quartz, silicone, siloxane, silicon, siloxane, SiC, sapphire, and a polymer with fluorinated groups, alkyl groups, cyclic aliphatic groups, cyclic aromatic groups, or heteroarene groups.

In some embodiments, the controlled-nucleation surface includes a non-polymer based coating selected from organic structures of a silane based fluorinated group, alkyl groups cyclic aliphatic group, cyclic aromatic group, heteroarene group, organic small molecule based crystalline and any of Formulas 6-1 through 6-5, as described above.

In some embodiments, the method further includes cleaving, polishing, or laminating the controlled-nucleation surface (e.g., surface 1502-1 of substrate 1502 in FIG. 15) to adjust a roughness, a thickness, or a curvature of the controlled-nucleation surface.

In some embodiments, the substrate includes one or more of $SiO_2$, fused silica, quartz, silicone, siloxane, silicon, siloxane, SiC, sapphire, and a polymer with fluorinated groups, alkyl groups, cyclic aliphatic groups, cyclic aromatic groups, or heteroarene groups.

In some embodiments, the source material (e.g., source material 1504) includes an organic single crystal having one or more lattice-matched surfaces.

In some embodiments, the physical vapor transport includes using a combination of an inert gas and a solvent vapor (e.g., transport vapor 1508 in FIG. 15) to transport the vaporized organic crystal molecules (e.g., vaporized organic crystal molecules 1506) from the source material (e.g., source material 1504) onto the controlled-nucleation surface. In some embodiments, the method further includes adjusting a speed of flow of the combination of inert gas and solvent vapor (e.g., transport vapor 1508), ratio of the inert gas with respect to the solvent vapor, and/or kinetics of solidification thereby controlling a crystal growth rate and nucleation of the organic solid crystal film.

In accordance with some embodiments, a method includes obtaining an ampoule having one or more nucleation portions and a crystal growth portion coupled with the one or more nucleation portions. For example, ampoule 1602 includes nucleation portion 1602-2 and crystal growth portion 1602-1 in FIG. 16. The ampoule is filled with organic solid crystal source material. The method includes placing the ampoule inside a first space of a chamber thereby heating the organic solid crystal source material to a melting state (e.g., portion 1610-1 of chamber 1600). The first space having a first temperature (e.g., portion 161-1 of chamber 1600 is at a temperature that is higher than the melting point temperature $T_m$ of the source material). The chamber also has a second space with a second temperature (e.g., portion 1610-2 of chamber 1600). The first space and the second space being separated by a gate (e.g., gate 1606). The method also includes transferring the ampoule (e.g., ampoule 1602) from the first space of the chamber to the second space of the chamber thereby recrystallizing the organic solid crystal source material to form a contiguous organic solid crystal film having a first dimension no less than 100 micrometers and a second dimension distinct from the first dimension no less than one centimeter.

In some embodiments, the crystal growth portion has a shape of a flat slab, a curved slab, a cuboid, or a cylinder (e.g., FIG. 16).

In some embodiments, the ampoule (e.g., ampoule 1618 in Section IV of FIG. 16) further includes a chassis defining the one or more nucleation portions (e.g., nucleation portion 1618-2) and the crystal growth portion (e.g., crystal growth portion 1618-1). The chassis includes double wall structure having a first wall (e.g., outer wall 1620-1) and a second wall (e.g., inner wall 1620-2). The double wall is at least partially surrounding a respective nucleation area of the one or more nucleation areas and the crystal growth portion. The chassis also includes a buffer material placed between the first wall and the second wall.

In some embodiments, the ampoule includes a controlled-nucleation surface in contact with the organic solid crystal source material (e.g., ampoule 1602 includes an inner surface that in some embodiments corresponds to alignment structure 110 described with respect to FIG. 1A). In some embodiments, the controlled-nucleation surface has a flat shape or a curved shape that thereby defines a shape of the optical film.

In some embodiments, the controlled-nucleation surface includes one or more of $SiO_2$, fused silica, quartz, silicone, siloxane, silicon, siloxane, SiC, sapphire, and a polymer with fluorinated groups, alkyl groups, cyclic aliphatic groups, cyclic aromatic groups, or heteroarene groups.

In some embodiments, the controlled-nucleation surface includes a non-polymer based coating selected from a silane based fluorinated group, alkyl groups cyclic aliphatic group, cyclic aromatic group, heteroarene group, and organic small molecule based crystalline.

In accordance with some embodiments, a method of making an optical film includes coating, on a modified surface of a substrate (e.g., substrate 1708 in FIG. 17 corresponding to substrate 105 having alignment structure 110 described with respect to FIG. 1A), a solution of organic crystal molecules and a solvent. For example, the method includes applying a combination of organic crystal molecules and a solvent through nozzle 1704 on substrate 1708 and moving the substrate with respect to blade 1702 to form a thin coating of the organic crystal molecules on substrate 1706 in Section I of FIG. 17. The method includes altering a temperature of the solution of organic crystal molecules and solvent deposited on the modified surface of the substrate by zone annealing (e.g., by moving substrate 1708 having the coating of the organic crystals and the solvent between a zone heated with rod 1718 and cooling zones 1714 in Section III of FIG. 17) thereby crystallizing the organic crystal molecules to form a contiguous organic solid crystal film having a first dimension no less than 100 micrometers and a second dimension distinct from the first dimension no less than one centimeter.

In some embodiments, the modified surface is configured to modify an interaction between the organic crystal molecules and the substrate in order to control an orientation and a number of defects of the organic crystal molecules in the contiguous organic solid crystal film.

In some embodiments, the substrate includes at least one microchannel (e.g., microchannel 1710 in Section II of FIG. 17) on the modified surface acting as a nucleation site for the crystallization.

In some embodiments, the coating includes spreading the solution of organic crystal molecules and solvent with a blade (e.g., blade 1702 in Section I of FIG. 17) so that a meniscus area is created on a peripheral area of the coated solution.

In some embodiments, the blade includes a plurality of microstructures.

The foregoing description of the embodiments have been presented for the purpose of illustration. It is not intended to be exhaustive or to limit the disclosure to the precise forms disclosed. Persons skilled in the relevant art can appreciate that modifications and variations are possible in light of the above disclosure.

Some portions of this description may describe the embodiments in terms of algorithms and symbolic representations of operations on information. These operations, while described functionally, computationally, or logically, may be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware and/or software modules, alone or in combination with other devices. In one embodiments, a software module is implemented with a computer program product including a computer-readable medium containing computer program code, which can be executed by a computer processor for performing any or all of the steps, operations, or processes described.

Some embodiments may also relate to an apparatus for performing the operations herein. This apparatus may be specially constructed for specific purposes, and/or it may include a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Some embodiments may also relate to a product that is produced by a computing process described herein. Such a product may include information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A method of making an optical film, the method comprising:
obtaining an ampoule having one or more nucleation portions and a crystal growth portion coupled with the one or more nucleation portions, wherein the ampoule is filled with organic solid crystal source material;
placing the ampoule inside a first space of a chamber thereby heating the organic solid crystal source material to a melting state, the first space having a first temperature, the chamber also having a second space with a second temperature, the first space and the second space being separated by a gate; and
transferring the ampoule from the first space of the chamber to the second space of the chamber thereby recrystallizing the organic solid crystal source material to form a contiguous organic solid crystal film having (i) a first dimension no less than 100 micrometers and (ii) a second dimension that is distinct from the first dimension and is no less than one centimeter.

2. The method of claim 1, wherein the ampoule further includes:
a chassis defining the one or more nucleation portions and the crystal growth portion, the chassis including:
a double wall structure having a first wall and a second wall, the double wall at least partially surrounding a respective nucleation area of the one or more nucleation areas and the crystal growth portion; and
a buffer material placed between the first wall and the second wall.

3. The method of claim 1, wherein the ampoule includes a controlled-nucleation surface in contact with the organic solid crystal source material.

4. The method of claim 1, wherein the second dimension is no less than three centimeters.

5. The method of claim 1, wherein the organic solid crystal film is curved or flat.

6. The method of claim 1, wherein an index of refraction of the optical film is at least 1.6.

7. The method of claim 1, wherein an index of refraction of the optical film measured in a direction either perpendicular or parallel to a surface defined by the organic solid crystal film is at least 1.6 and an optical anisotropy of the organic solid crystal film is at least 0.03.

8. The method of claim 1, wherein an optical anisotropy of the optical film is at least 0.1.

9. The method of claim 1, wherein the organic solid crystal film includes a single crystal or a polycrystal.

10. The method of claim 1, wherein the organic solid crystal film includes one or more organic crystals selected of the group consisting of: naphthalene, anthracene, tetracene, pentacene, pyrene, polycene, fluoranthene, benzophenone, benzochromene, benzil, benzimidazole, benzene, hexachlorobenzene, nitropyridine-N-oxide, benzene-1, 4-dicarboxylic acid, diphenylacetylene, N-(4-nitrophenyl)-(s)-prolinal, 4,5-dicyanoimidazole, benzodithiophene, cyanopyridine, thienothiophene, stilbene, azobenzene, and their derivatives.

11. The method of claim 1, wherein the organic solid crystal film includes at least one selected from the group consisting of cyclohexane, cyclopentane, tetrahydropyran, piperidine, tetrahydrofuran, pyrrolidine, tetrahydrothiophene, benzene, naphthalene, anthracene, thiophene, biphenyl, tolane, benzimidazole, diphenylacetylene, cyanopyridine, thienothiophene, dibenzothiophene, carbazole, silafluorene, and their derivatives.

12. The method of claim 11, the one or more ring structures are coupled with one or more of $C_1$-$C_{10}$ alkyl, alkoxy, alkenyl groups, —CN, —NCS, —SCN, —SF$_5$, —Br, —Cl, —F, —OCF$_3$, —CF$_3$, and mono- or polyfluorinated $C_1$-$C_{10}$ alkyl or alkoxy.

13. The method of claim 1, wherein the organic solid crystal film includes one or more crystalline polymers with precursors having aromatic hydrocarbon or heteroarene groups and their derivatives, wherein the one or more crystalline polymers are selected from a group consisting of polyethylene naphthalate, poly (vinyl phenyl sulfide), poly (a-methylstyrene), polythienothiophene, polythiophene, poly(n-vinylphtalimide), parylene, polysulfide, polysulfone, poly(bromophenyl), poly(vinlynaphthalene), and liquid crystal polymers with precursors.

14. The method of claim 1, wherein the organic solid crystal film is a combination of:
   polymers with aliphatic, heteroaliphatic, aromatic hydrocarbons, or heteroarene groups;
   fatty acids, lipids or plasticizer; and
   a surfactant including molecules with mono- or polyfluorinated alkyl or alkoxy groups.

15. The method of claim 1, wherein the organic solid crystal film includes one or more organic crystals selected of the group consisting of organic solid crystal molecules of

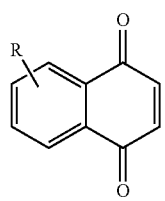

Formula 1-1

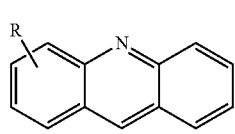

Formula 1-2

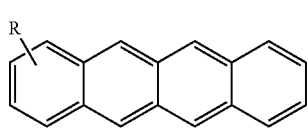

Formula 1-3

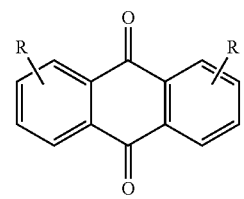

Formula 1-4

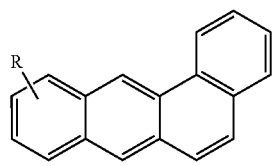

Formula 1-5

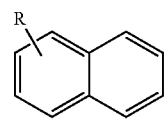

Formula 1-6

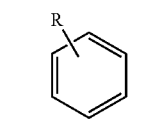

Formula 1-7

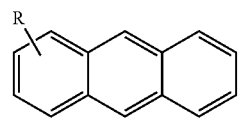

Formula 1-8

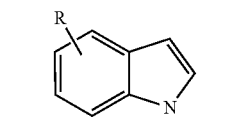

Formula 1-9

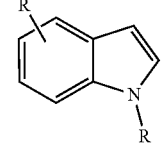

Formula 1-10

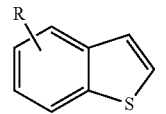

Formula 1-11

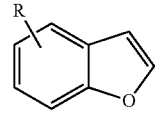

Formula 1-12

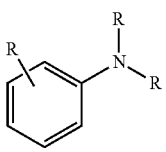

Formula 1-13

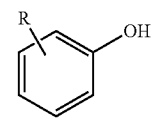

Formula 1-14

-continued
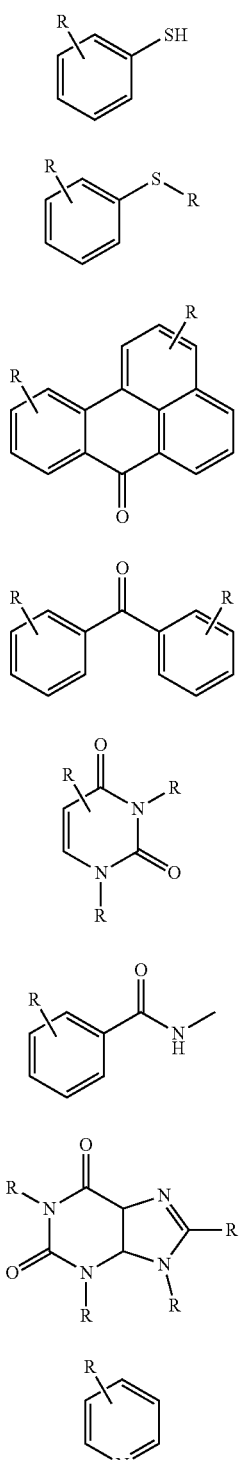
Formula 1-15
Formula 1-16
Formula 1-17
Formula 1-18
Formula 1-19
Formula 1-20
Formula 1-21
Formula 1-22
Formula 1-23
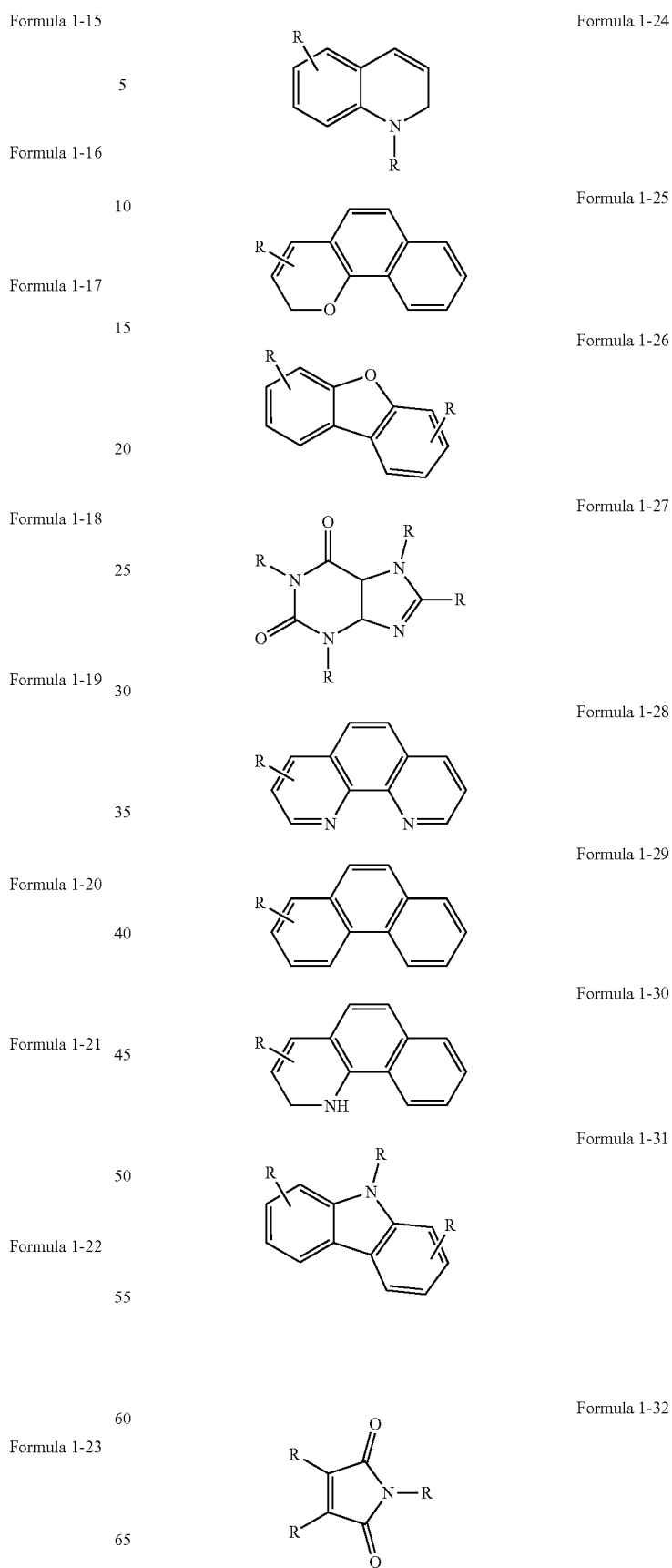
Formula 1-24
Formula 1-25
Formula 1-26
Formula 1-27
Formula 1-28
Formula 1-29
Formula 1-30
Formula 1-31
Formula 1-32

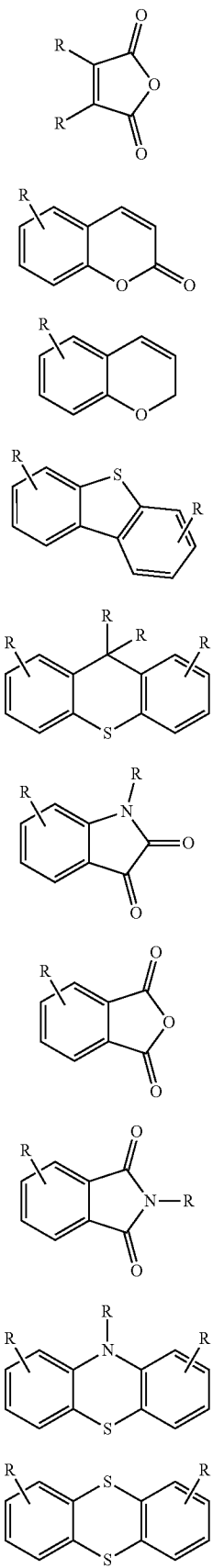
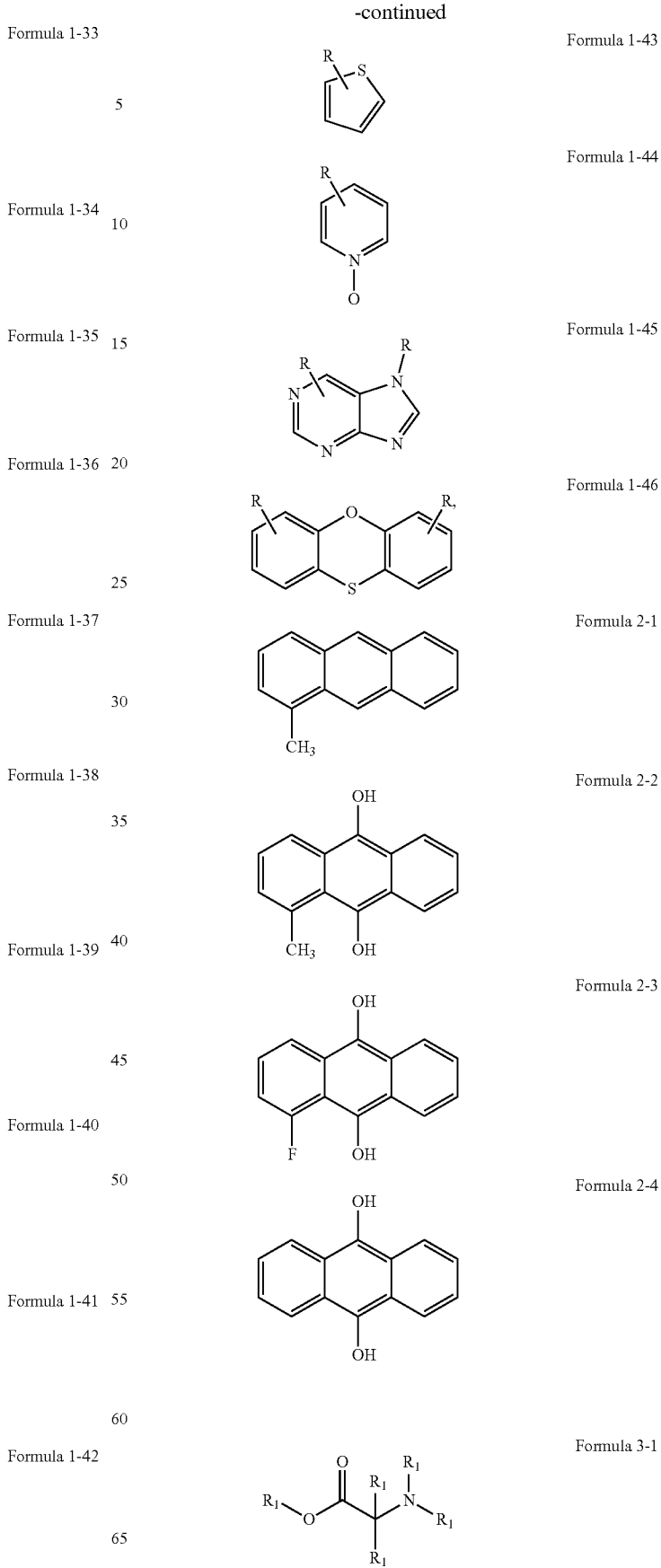

Formula 3-2
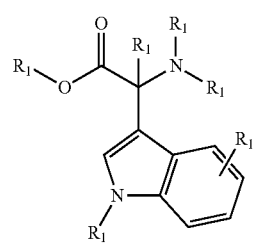
Formula 3-3
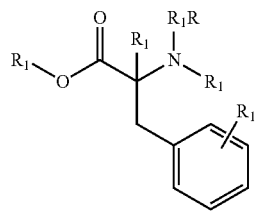
Formula 3-4
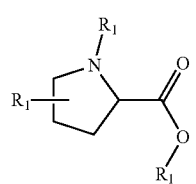
Formula 3-5
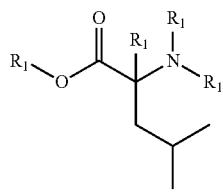
Formula 3-6
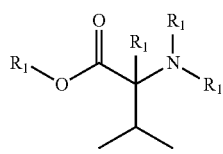
Formula 3-7
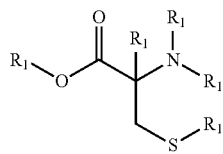
Formula 3-8
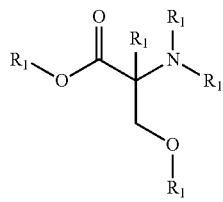
Formula 3-9
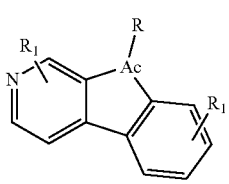
Formula 3-10
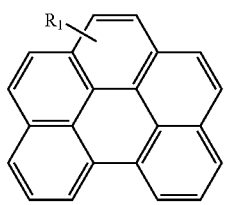
Formula 3-11
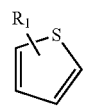
Formula 3-12
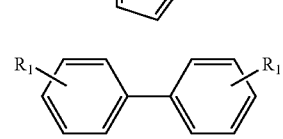
Formula 3-13
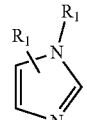
Formula 3-14
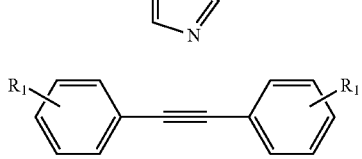
Formula 3-15
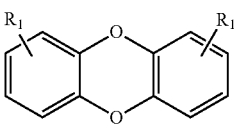
Formula 3-16
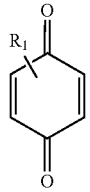
Formula 3-17
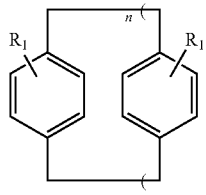
n = 1, 2, 3, 4,
Formula 3-18
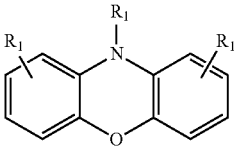
Formula 3-19
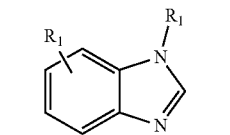

Formula 3-20

Formula 3-21

Formula 3-22

Formula 3-23

Formula 3-24

Formula 3-25

$n_1 = 0, 1, 2, 3, 4$

Formula 3-26

Formula 3-27

Formula 3-28

Formula 4-1

$n_1 = 0, 1, 2, 3, 4,$

Formula 4-2

$n_1 = 0, 1, 2, 3, 4,$

Formula 4-3

Formula 4-4

Formula 4-5

Formula 4-6

Formula 4-7

Formula 4-8

Formula 4-9

Formula 4-10

Formula 4-11

Formula 4-12

Formula 4-13

Formula 4-14

Formula 4-15

Formula 4-16

Formula 4-17

Formula 4-18

Formula 4-19

Formula 4-20

Formula 4-21

Formula 4-22

Formula 4-23

Formula 4-24

Formula 4-25

Formula 4-26

Formula 4-27

-continued

Formula 4-28

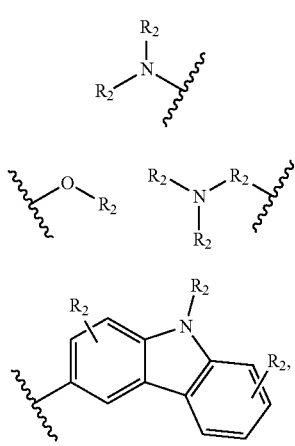

Formula 4-29

Formula 4-30

Formula 6-1*

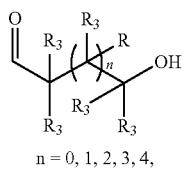

n = 0, 1, 2, 3, 4,

Formula 6-2**

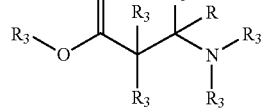

Formula 6-3

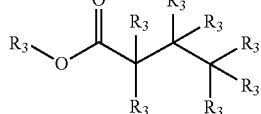

Formula 6-4**

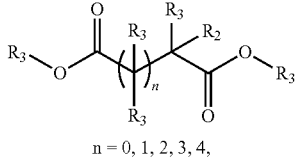

n = 0, 1, 2, 3, 4,

Formula 6-5**

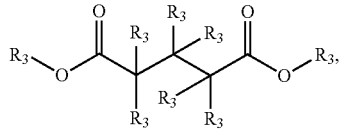

wherein R, $R_1$, and $R_2$ are independently selected from the group consisting of $CH_3$, H, OH, methoxy (OMe), ethoxy (OEt), isopropoxide (OiPr), F, Cl, Br, I, Ph, $NO_2$, $SO_3$, $SO_2Me$, isopropyl (iPr), propyl (Pr), tert-Butyl (t-Bu), sec-butyl (sec-Bu), ethyl (Et), acetyl, SH, S-methyl (SMe), carboxyl, aldyhide, amide, nitrile, ester, $SO_2NH_3$, $NH_2$, N-dimethyl ($NMe_2$), N-methyl (NMeH), and $C_2H_2$.

16. The method of claim 1, wherein the optical film is used for manufacturing a waveguide combiner, a diffractive lens, or a polarization selective grating.

17. The method of claim 3, the controlled-nucleation surface includes one or more of $SiO_2$, fused silica, quartz, silicone, siloxane, silicon, siloxane, SiC, sapphire, and a polymer with fluorinated groups, alkyl groups, cyclic aliphatic groups, cyclic aromatic groups, or heteroarene groups.

18. The method of claim 3, wherein the controlled-nucleation surface includes a non-polymer based coating selected from a silane based fluorinated group, alkyl groups cyclic aliphatic group, cyclic aromatic group, heteroarene group, organic small molecule based crystalline, and any of wherein $R_3$ is independently selected from the group consisting of $CH_3$, H, OH, methoxy (OMe), ethoxy (OEt), isopropoxide (OiPr), F, Cl, Br, I, Ph, $NO_2$, $SO_3$, $SO_2Me$, isopropyl (iPr), propyl (Pr), tert-Butyl (t-Bu), sec-butyl (sec-Bu), ethyl (Et), acetyl, SH, S-methyl (SMe), carboxyl, aldyhide, amide, nitrile, ester, $SO_2NH_3$, $NH_2$, N-dimethyl ($NMe_2$), N-methyl (NMeH), and $C_2H_2$.

* * * * *

UNITED STATES PATENT AND TRADEMARK OFFICE
CERTIFICATE OF CORRECTION

| | | |
|---|---|---|
| PATENT NO. | : 12,140,730 B2 | Page 1 of 1 |
| APPLICATION NO. | : 17/369861 | |
| DATED | : November 12, 2024 | |
| INVENTOR(S) | : Rao et al. | |

It is certified that error appears in the above-identified patent and that said Letters Patent is hereby corrected as shown below:

On the Title Page

Item (73), replace "Inc." with -- LLC --.

Signed and Sealed this
Twenty-ninth Day of April, 2025

Coke Morgan Stewart
*Acting Director of the United States Patent and Trademark Office*